(12) United States Patent
Jarillo-Herrero et al.

(10) Patent No.: US 11,393,976 B2
(45) Date of Patent: Jul. 19, 2022

(54) CARBON-BASED VOLATILE AND NON-VOLATILE MEMRISTORS

(71) Applicant: Massachusetts Institute of Technology, Cambridge, MA (US)

(72) Inventors: Pablo Jarillo-Herrero, Cambridge, MA (US); Qiong Ma, Cambridge, MA (US); Nuh Gedik, Watertown, MA (US); Suyang Xu, Cambridge, MA (US); Zhiren Zheng, Cambridge, MA (US)

(73) Assignee: MASSACHUSETTS INSTITUTE OF TECHNOLOGY, Cambridge, MA (US)

( * ) Notice: Subject to any disclaimer, the term of this patent is extended or adjusted under 35 U.S.C. 154(b) by 0 days.

(21) Appl. No.: 17/094,141

(22) Filed: Nov. 10, 2020

(65) Prior Publication Data

US 2021/0217952 A1    Jul. 15, 2021

Related U.S. Application Data

(60) Provisional application No. 62/959,441, filed on Jan. 10, 2020.

(51) Int. Cl.
| | |
|---|---|
| *G11C 11/00* | (2006.01) |
| *H01L 45/00* | (2006.01) |
| *G11C 13/00* | (2006.01) |

(52) U.S. Cl.
CPC .......... *H01L 45/10* (2013.01); *G11C 13/0069* (2013.01); *H01L 45/1206* (2013.01);
(Continued)

(58) Field of Classification Search
CPC ... H01L 45/10; H01L 45/1206; H01L 45/142; H01L 45/143; H01L 45/148;
(Continued)

(56) References Cited

U.S. PATENT DOCUMENTS

| | | | |
|---|---|---|---|
| 8,728,433 B2* | 5/2014 | Sutter | C01B 32/194 423/448 |
| 9,659,734 B2* | 5/2017 | Duncan | H01J 3/021 |

(Continued)

FOREIGN PATENT DOCUMENTS

WO   WO-2021041788 A1 *  3/2021

OTHER PUBLICATIONS

Bao et al., "Evidence for a spontaneous gapped state in ultraclean bilayer graphene." Proceedings of the National Academy of Sciences 109.27 (2012): 10802-10805.
(Continued)

*Primary Examiner* — Viet Q Nguyen
(74) *Attorney, Agent, or Firm* — Smith Baluch LLP

(57) ABSTRACT

An ultrathin, carbon-based memristor with a moiré superlattice potential shows prominent ferroelectric resistance switching. The memristor includes a bilayer material, such as Bernal-stacked bilayer graphene, encapsulated between two layers of a layered material, such as hexagonal boron nitride. At least one of the encapsulating layers is rotationally aligned with the bilayer to create the moiré superlattice potential. The memristor exhibits ultrafast and robust resistance switching between multiple resistance states at high temperatures. The memristor, which may be volatile or nonvolatile, may be suitable for neuromorphic computing.

21 Claims, 64 Drawing Sheets

(52) U.S. Cl.
CPC .......... *H01L 45/142* (2013.01); *H01L 45/143* (2013.01); *H01L 45/148* (2013.01); *H01L 45/149* (2013.01); *G11C 2213/35* (2013.01); *G11C 2213/53* (2013.01)

(58) Field of Classification Search
CPC .............. H01L 45/149; G11C 13/0069; G11C 2213/35; G11C 2213/53
USPC .................................................. 365/148, 151
See application file for complete search history.

(56) References Cited

U.S. PATENT DOCUMENTS

| | | | | |
|---|---|---|---|---|
| 2013/0230722 | A1* | 9/2013 | Fujii | B82Y 30/00 428/408 |
| 2013/0313944 | A1* | 11/2013 | Kim | H01L 41/29 156/247 |
| 2015/0167148 | A1* | 6/2015 | Sutter | C23C 14/35 428/704 |
| 2016/0372263 | A1* | 12/2016 | Adamson | C30B 29/403 |
| 2017/0345898 | A1* | 11/2017 | Astley | H01L 29/2003 |
| 2018/0241059 | A1* | 8/2018 | Shin | H01M 8/1055 |
| 2019/0189628 | A1 | 6/2019 | Yu et al. | |
| 2020/0203483 | A1* | 6/2020 | Cook | H01L 29/808 |
| 2020/0243763 | A1* | 7/2020 | Komatsu | H01L 45/144 |
| 2021/0111283 | A1* | 4/2021 | Park | H01L 29/66969 |
| 2021/0245395 | A1* | 8/2021 | Wang | C04B 41/4505 |
| 2021/0280731 | A1* | 9/2021 | Zuckerman | H01L 31/0336 |

OTHER PUBLICATIONS

Bistritzer et al., "Moiré bands in twisted double-layer graphene." Proceedings of the National Academy of Sciences 108.30 (2011): 12233-12237.
Burg et al., "Correlated insulating states in twisted double bilayer graphene." Physical review letters 123.19 (2019): 197702. 5 pages.
Cao et al., "Correlated insulator behaviour at half-filling in magic-angle graphene superlattices." Nature 556.7699 (2018): 80-84.
Cao et al., "Nematicity and competing orders in superconducting magic-angle graphene." Science 372.6539 (2021): 264-271.
Cao et al., "Tunable correlated states and spin-polarized phases in twisted bilayer—bilayer graphene" Nature 583.7815 (2020): 215-220.
Cao et al., "Unconventional superconductivity in magic-angle graphene superlattices." Nature 556.7699 (2018): 43-50.
Chanthbouala et al., "A ferroelectric memristor," Nature Materials, (Sep. 16, 2012) DOI: 10.1038/NMAT3415, 5 pages.
Chen et al., "Electrically tunable correlated and topological states in twisted monolayer-bilayer graphene." arXiv preprint arXiv:2004.11340 (2020). 18 pages.
Chen et al., "Evidence of a gate-tunable Mott insulator in a trilayer graphene moiré superlattice." Nature Physics 15.3 (2019): 237-241.
Chen et al., "Signatures of gate-tunable superconductivity in trilayer graphene/boron nitride moiré superlattice." arXiv e-prints (2019): arXiv-1901 18 pages.
Chen et al., "Tunable correlated Chern insulator and ferromagnetism in a moiré superlattice." Nature 579.7797 (2020): 56-61.
Chittari et al., "Gate-tunable topological flat bands in trilayer graphene boron-nitride moiré superlattices." Physical review letters 122.1 (2019): 016401. 6 pages.
Choi et al., "Electronic correlations in twisted bilayer graphene near the magic angle." Nature Physics 15.11 (2019): 1174-1180.
Craciun et al., "Trilayer graphene is a semimetal with a gate-tunable band overlap." Nature nanotechnology 4.6 (2009): 383-388.
Dean et al., "Hofstadter's butterfly and the fractal quantum Hall effect in moiré superlattices." Nature 497.7451 (2013): 598-602.
Fei et al., "Ferroelectric switching of a two-dimensional metal." Nature 560.7718 (2018): 336-339.
Fernandes et al., "Nematicity with a twist: Rotational symmetry breaking in a moiré superlattice." Science Advances 6.32 (2020): eaba8834. 9 pages.
Finney et al., "Tunable crystal symmetry in graphene—boron nitride heterostructures with coexisting moiré superlattices." Nature nanotechnology 14.11 (2019): 1029-1034.
Freitag et al., "Spontaneously gapped ground state in suspended bilayer graphene." Physical review letters 108.7 (2012): 076602. 5 pages.
Hunt et al., "Direct measurement of discrete valley and orbital quantum Nos. in bilayer graphene." Nature communications 8.1 (2017): 1-7.
Hunt et al., "Massive Dirac fermions and Hofstadter butterfly in a van der Waals heterostructure." Science 340.6139 (2013): 1427-1430.
Jhang et al., "Stacking-order dependent transport properties of trilayer graphene." Physical Review B 84.16 (2011): 161408. 4 pages.
Jiang et al., "Charge order and broken rotational symmetry in magic-angle twisted bilayer graphene" Nature 573.7772 (2019): 91-95.
Ju et al., "Topological valley transport at bilayer graphene domain walls." Nature 520.7549 (2015): 650-655.
Ju et al., "Tunable excitons in bilayer graphene." Science 358.6365 (2017): 907-910.
Jung et al., "Origin of band gaps in graphene on hexagonal boron nitride." Nature communications 6.1 (2015): 1-11.
Katayama et al., "Charge transfer at double-layer to single-layer transition in double-quantum-well systems." Physical Review B 52.20 (1995): 14817. 8 pages.
Keimer et al., "The physics of quantum materials." Nature Physics 13.11 (2017): 1045-1055.
Li et al., "Observation of Van Hove singularities in twisted graphene layers." Nature Physics 6.2 (2010): 109-113.
Li et al., "Probing symmetry properties of few-layer MoS2 and h-BN by optical second-harmonic generation." Nano letters 13.7 (2013): 3329-3333.
Li et al., "Topological origin of subgap conductance in insulating bilayer graphene." Nature Physics 7.1 (2011): 38-42.
Liu et al., "Spin-polarized correlated insulator and superconductor in twisted double bilayer graphene." arXiv preprint arXiv:1903.08130 (2019). 34 pages.
Maher et al., "Evidence for a spin phase transition at charge neutrality in bilayer graphene." Nature Physics 9.3 (2013): 154-158.
McCann et al., "The electronic properties of bilayer graphene." Reports on Progress in Physics 76.5 (2013): 056503. 29 pages.
McGilly et al., "Seeing moir\'e superlattices." arXiv preprint arXiv:1912.06629 (2019). 21 pages.
Morell et al., "Flat bands in slightly twisted bilayer graphene: Tight-binding calculations." Physical Review B 82.12 (2010): 121407. 4 pages.
Nam et al., "A family of finite-temperature electronic phase transitions in graphene multilayers." Science 362.6412 (2018): 324-328.
Nandkishore et al., "Dynamical screening and excitonic instability in bilayer graphene." Physical review letters 104.15 (2010): 156803. 4 pages.
Neto et al., "The electronic properties of graphene." Reviews of modern physics 81.1 (2009): 109. 54 pages.
Novoselov et al., "Unconventional quantum Hall effect and Berry's phase of $2\pi$ in bilayer graphene." Nature physics 2.3 (2006): 177-180.
Ponomarenko et al., "Cloning of Dirac fermions in graphene superlattices." Nature 497.7451 (2013): 594-597.
Regan et al., "Mott and generalized Wigner crystal states in WSe 2/WS 2 moiré superlattices." Nature 579.7799 (2020): 359-363.
Ribeiro-Palau et al., "Twistable electronics with dynamically rotatable heterostructures." Science 361.6403 (2018): 390-693.
Serlin et al., "Intrinsic quantized anomalous Hall effect in a moiré heterostructure." Science 367.6480 (2020): 900-903.
Sharpe et al., "Emergent ferromagnetism near three-quarters filling in twisted bilayer graphene." Science 365.6453 (2019): 605-608.

(56) References Cited

OTHER PUBLICATIONS

Shen et al., "Correlated states in twisted double bilayer graphene." Nature Physics 16.5 (2020): 520-525.
Shi et al., "Tunable van Hove singularities and correlated states in twisted trilayer graphene." arXiv preprint arXiv:2004.12414 (2020) 16 pages.
Shimazaki et al., "Generation and detection of pure valley current by electrically induced Berry curvature in bilayer graphene." Nature Physics 11.12 (2015): 1032-1036.
Song et al., "Electron interactions and gap opening in graphene superlattices." Physical review letters 111.26 (2013): 266801. 5 pages.
Sui et al., "Gate-tunable topological valley transport in bilayer graphene." Nature Physics 11.12 (2015): 1027-1031.
Tang et al., "Simulation of Hubbard model physics in WSe 2/WS 2 moiré superlattices." Nature 579.7799 (2020): 353-358.
Tokura et al., "Emergent functions of quantum materials." Nature Physics 13.11 (2017): 1056-1068.
Wang et al., "Hysteresis of electronic transport in graphene transistors." ACS nano 4.12 (2010): 7221-7228.
Wang et al., "Magic continuum in twisted bilayer WSe2." arXiv preprint arXiv:1910.12147 (2019). 8 pages.
Weitz et al., "Broken-symmetry states in doubly gated suspended bilayer graphene." Science 330.6005 (2010): 812-816.
Yankowitz et al., "Emergence of superlattice Dirac points in graphene on hexagonal boron nitride." Nature physics 8.5 (2012): 382-386.
Yankowitz et al., "Tuning superconductivity in twisted bilayer graphene." Science 363.6431 (2019): 1059-1064.
Young et al., "Capacitance of graphene bilayer as a probe of layer-specific properties." Physical Review B 84.8 (2011): 085441. 7 pages.
Zhang et al., "Direct observation of a widely tunable bandgap in bilayer graphene." Nature 459.7248 (2009): 820-823.
Zhang et al., "Moiré quantum chemistry: charge transfer in transition metal dichalcogenide superlattices." Physical Review B 102.20 (2020): 201115. 6 pages.
Zhang et al., "Nearly flat Chern bands in moiré superlattices." Physical Review B 99.7 (2019): 075127. 19 pages.

* cited by examiner

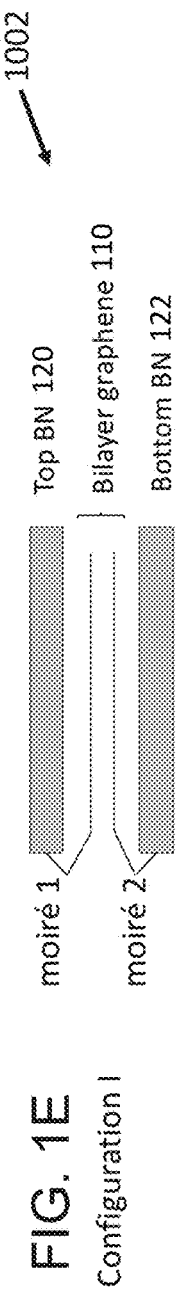
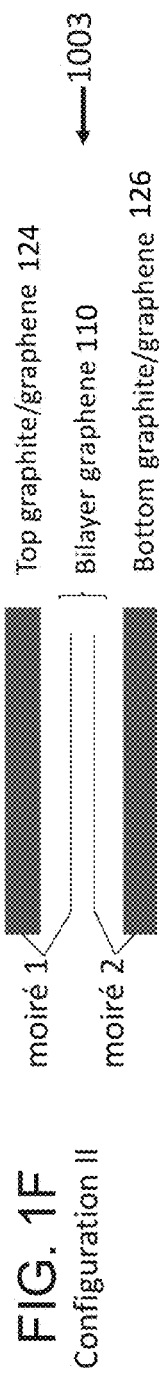
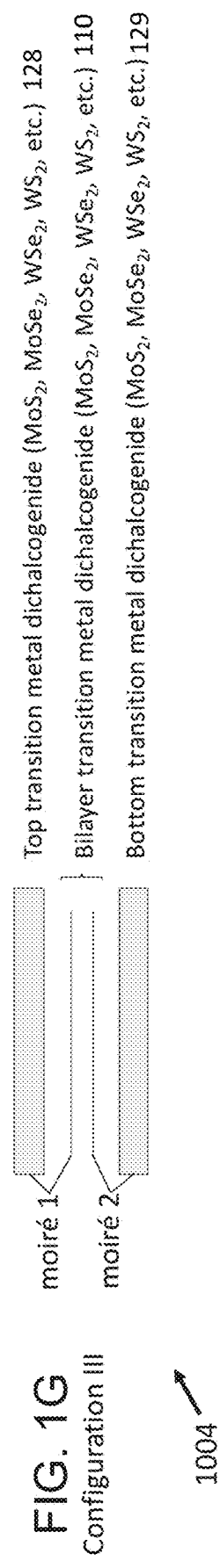
FIG. 1E Configuration I
FIG. 1F Configuration II
FIG. 1G Configuration III

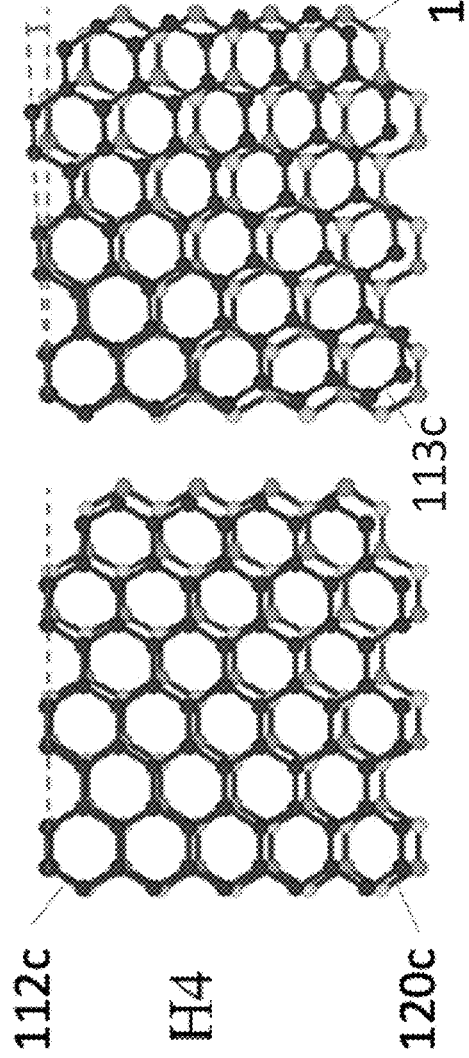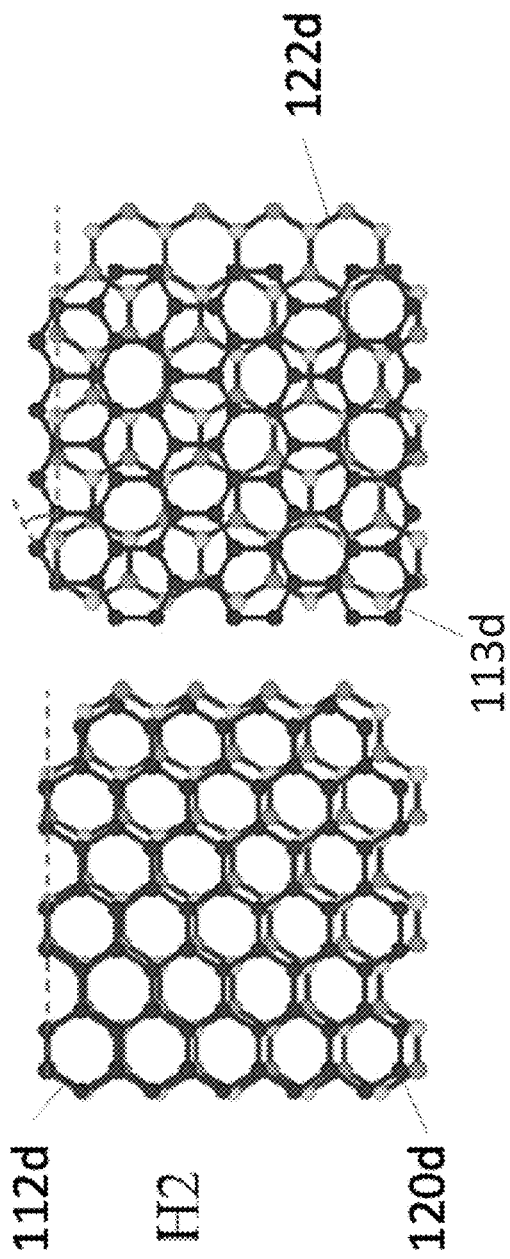

FIG. 1M
$0°, \delta$ small
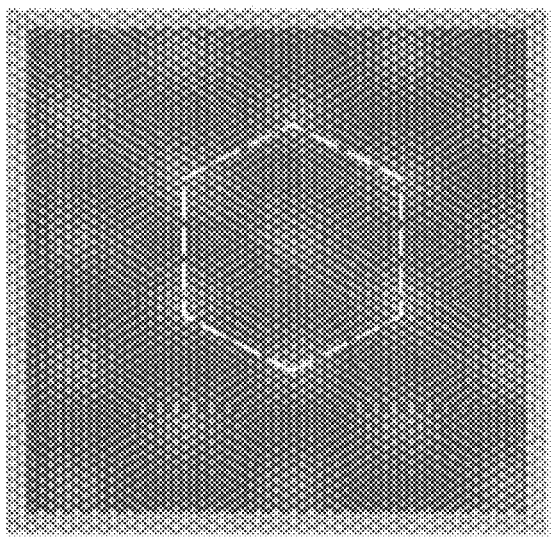
FIG. 1O
$30°, \delta$ small
FIG. 1N
$0°, \delta$ large
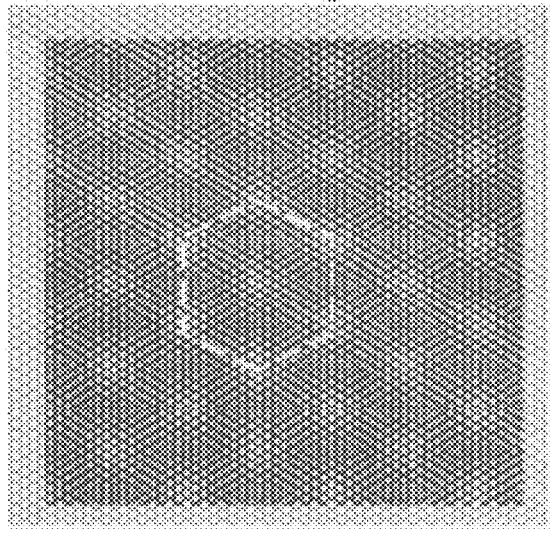
FIG. 1P
$30°, \delta$ large
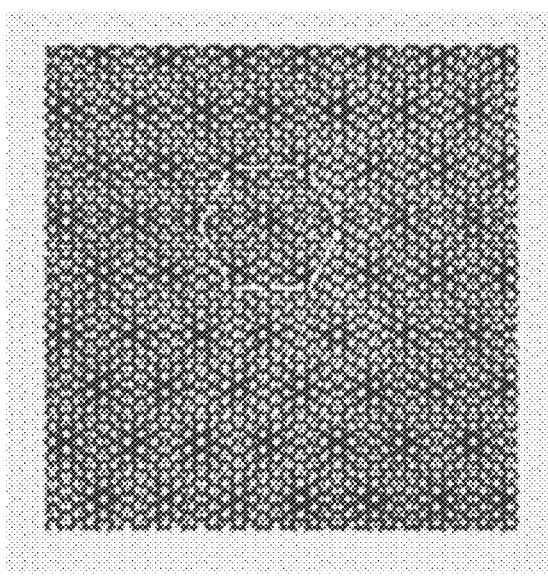
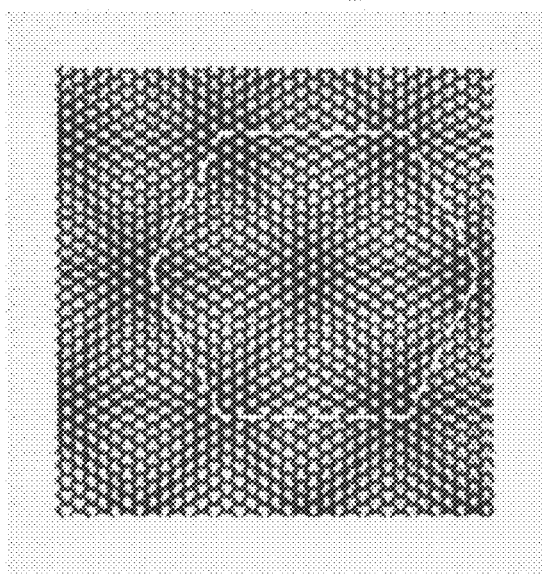

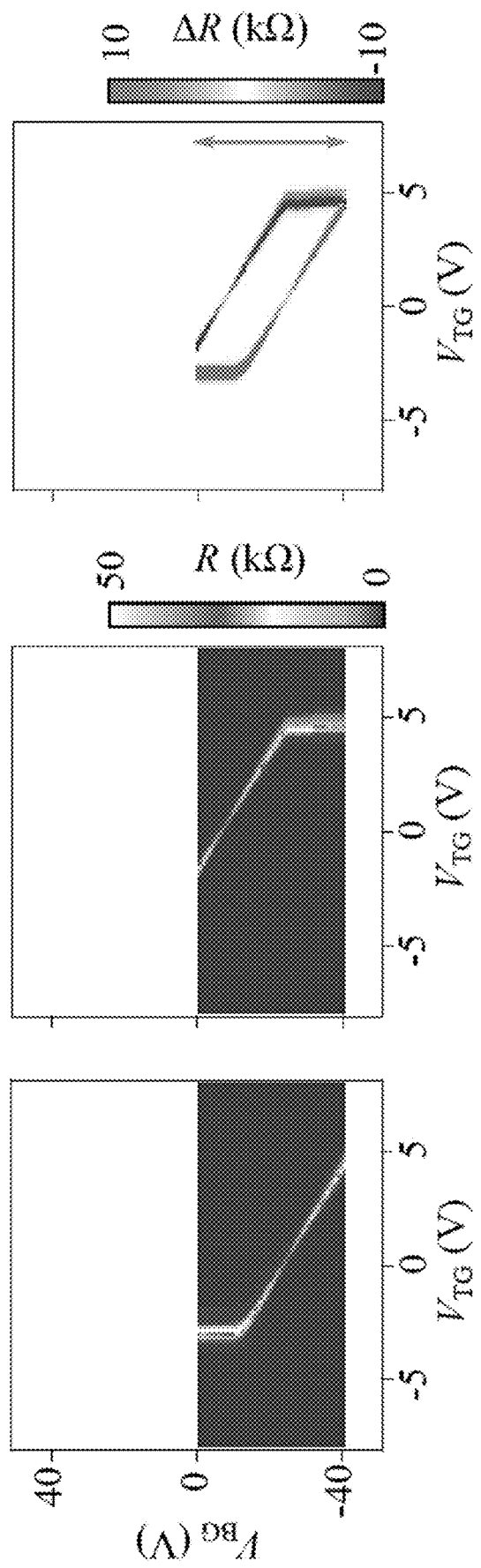

704

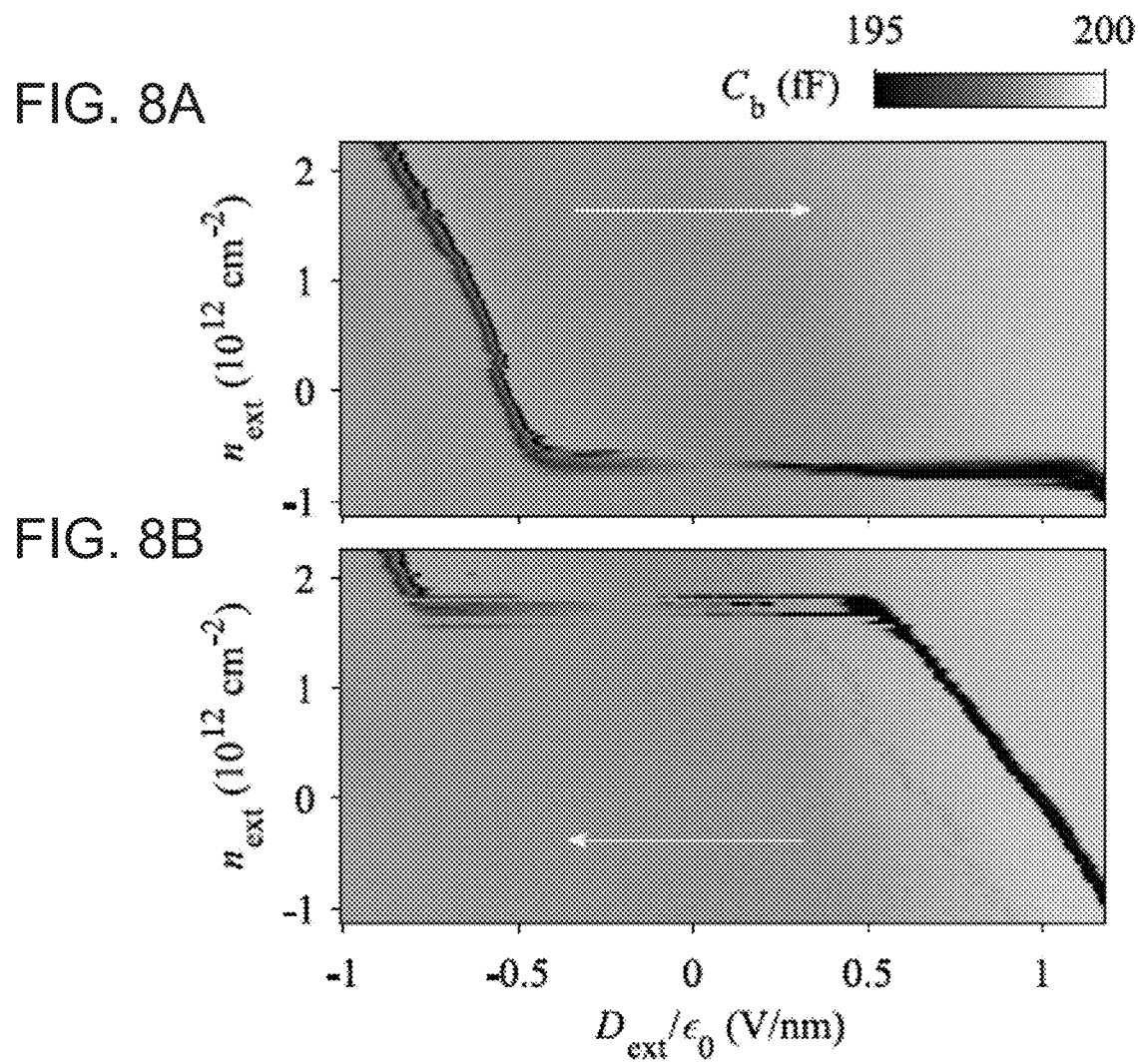

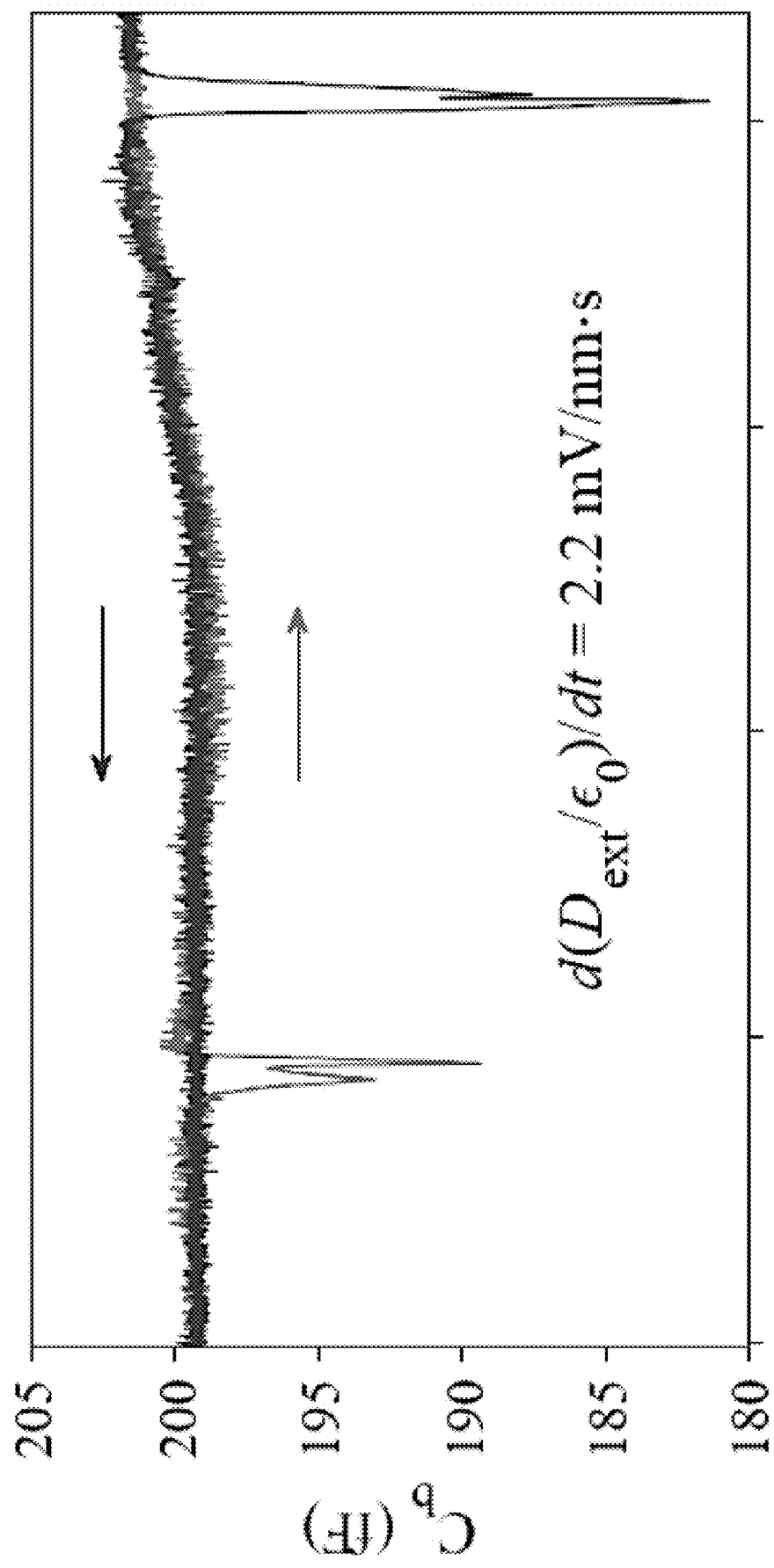

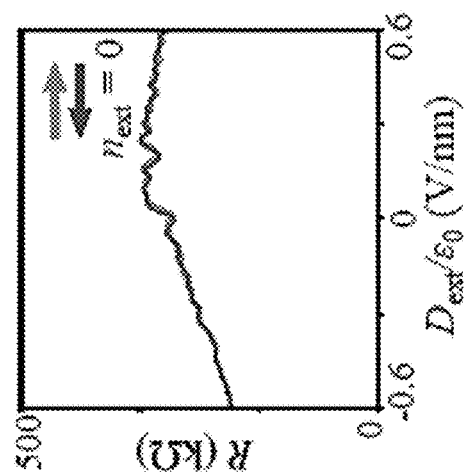
FIG. 11C          FIG. 11B          FIG. 11A
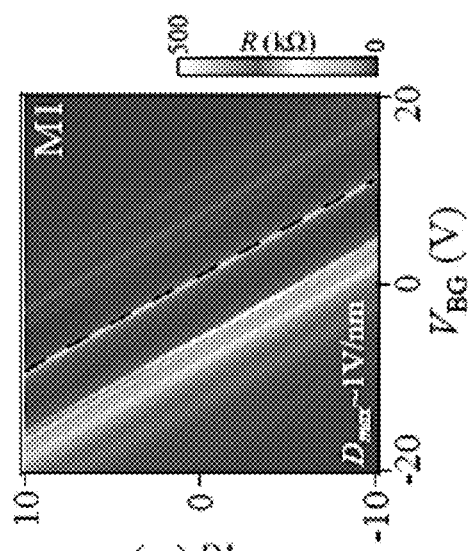
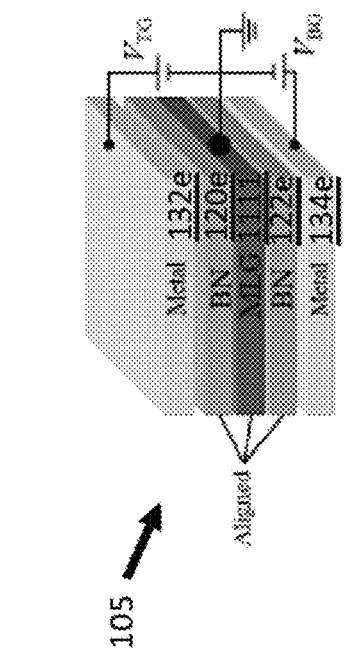

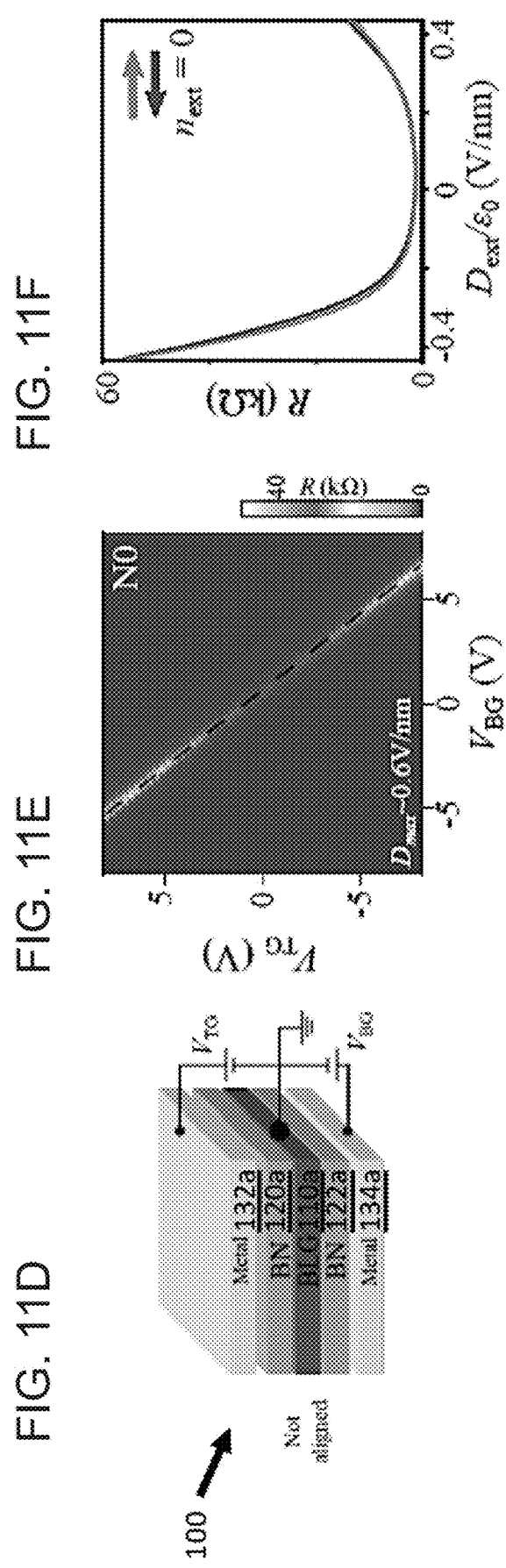

$V_{BG}$ (V)

$V_{BG}$ (V)

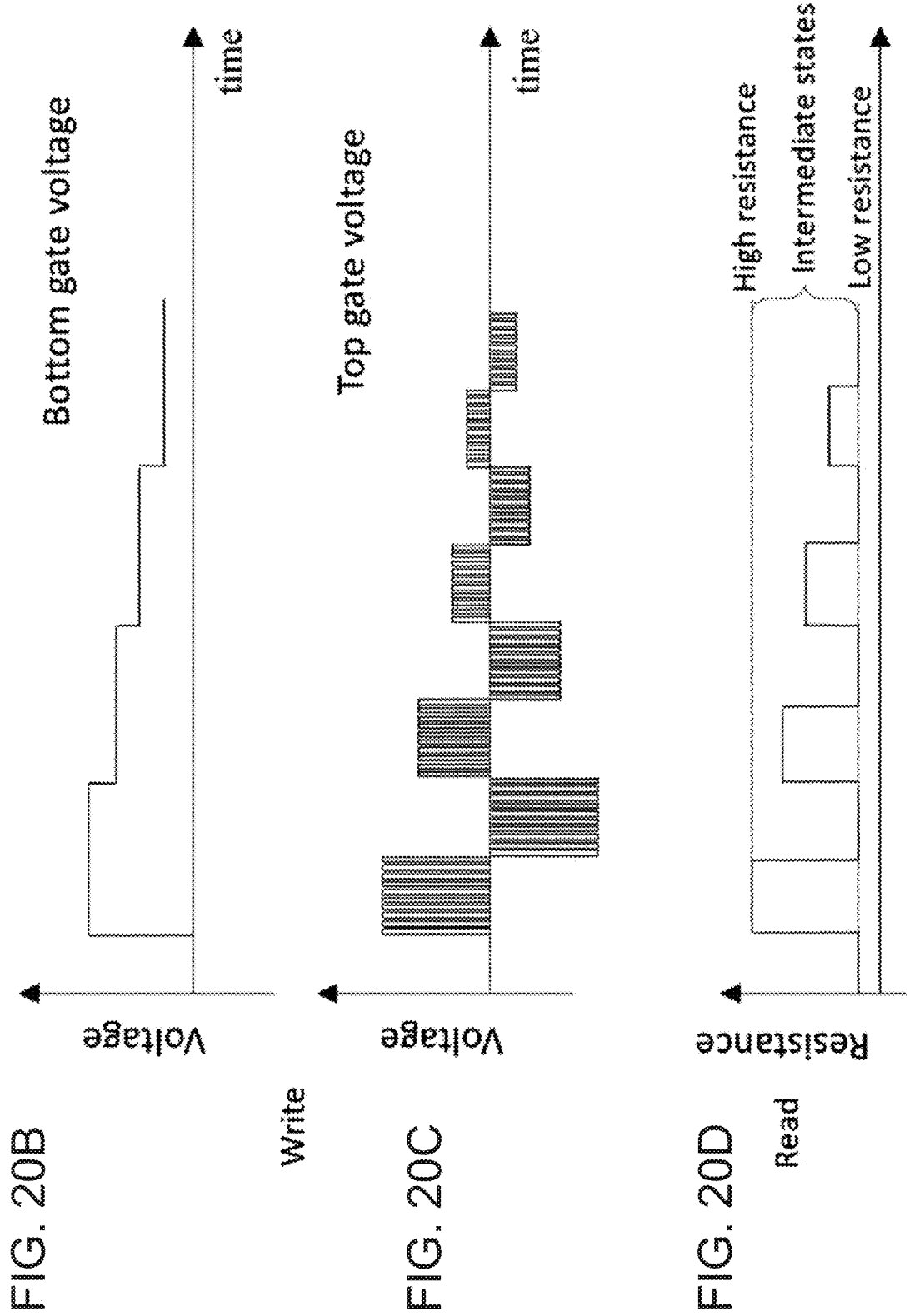

CARBON-BASED VOLATILE AND NON-VOLATILE MEMRISTORS

CROSS-REFERENCE TO RELATED APPLICATION(S)

This application claims the priority benefit, under 35 U.S.C. 119(e), of U.S. Application No. 62/959,441, which was filed on Jan. 10, 2020, and is incorporated herein by reference in its entirety for all purposes.

GOVERNMENT SUPPORT

This invention was made with Government support under Grant No FA9550-16-1-0382 awarded by the Air Force Office of Scientific Research and under Grant No. DE-SC0019300, DE-SC0001819 and DE-AC02-07CH11358 awarded by the Department of Energy. The Government has certain rights in the invention.

BACKGROUND

Neuromorphic computing, which is inspired by the way in which our brains work, enables information processing at very low energy cost. On the hardware level, it employs electronic devices with in-memory computing capability, which simulates the electrical behaviors of neural networks. A useful element in the emerging neuromorphic computing paradigm is a high-density, low-power, multiple-state, programmable, and non-volatile nanoscale memory device.

One particularly promising candidate for neuromorphic memory is a ferroelectric field effect transistor (FeFET), which is a transistor with a ferroelectric insulator as its gate dielectric. Ferroelectricity is a property of materials that exhibit an internal electric polarization. In an ionic material such as $BaTiO_3$, ferroelectricity can be understood as the spatial separation between the average centers of the positive and negative charges within a unit cell. The carrier density in the FeFET channel is modulated by the dielectric polarization direction, which can be controlled in a non-volatile manner by the gate voltage. However, $HfO_2$-based FeFETs cannot be easily scaled up and suffer from low writing and reading stabilities. Therefore, identifying new ferroelectric materials that can lead to more ideal FeFET devices should bring breakthroughs to neuromorphic computing. In fact, ferroelectric materials are expected to have many applications apart from creating memristors. Unfortunately, ferroelectric materials are rare because they are fundamentally constrained to low lattice symmetry crystals, reducing our chance of finding alternatives.

SUMMARY

Here we report a surprising discovery: ferroelectric graphene, which can be used to make FeFETs for neuromorphic memory. It is difficult to imagine that graphene, which is made of carbon atoms, could be ferroelectric. However, here we present the surprising realization of ferroelectricity in AB Bernal stacked bilayer graphene. Free-standing AB Bernal stacked bilayer graphene is a centrosymmetric, nonpolar system in which the two equivalent monolayers are related by inversion symmetry. By introducing a moiré superlattice potential (via aligning bilayer graphene with the top and bottom layers of hexagonal boron nitride (BN), which has a different lattice constant than graphene), the Bernal bilayer graphene shows a prominent, hysteretic resistance behavior that can be switched by an external electric field. Twisting one or both of the BN layers with respect to the Bernal bilayer graphene changes the moiré superlattice potential, altering the hysteretic resistance behavior.

We further directly probe the ferroelectric polarization by both a nonlocal graphene sensor and by capacitance measurements. Dual-gated quantum transport measurements reveal rich and striking patterns. These patterns are beyond the framework of a simple ferroelectric and have not been observed in other graphene, moiré, or 2D van der Waals material devices. Our results point to an unconventional, odd parity electronic ordering in the Bernal bilayer graphene moiré system. The emergent ferroelectricity paves the way for ultrafast, programmable, atomically thin carbon-based nonvolatile memristors.

Embodiments of the present technology include a memristor. The memristor includes a bilayer material having a first surface and a second surface. The memristor also includes a first layer of a layered material disposed directly on the first surface of the bilayer material, and a second layer of the layered material disposed directly on the second surface of the bilayer material. The first layer of the layered material has a lattice vector forming a first angle with a lattice vector of the bilayer material about a normal to the first surface. The second layer of the layered material has a lattice vector forming a second angle with the lattice vector of the bilayer material about a normal to the second surface, and the first angle is different than the second angle. The first layer of the layered material and the bilayer material form a first moiré pattern. The second layer of the layered material and the bilayer material form a second moiré pattern.

The bilayer material in the memristor may be bilayer graphene, Bernal-stacked bilayer graphene, or bilayer transition metal dichalcogenide. In another embodiment, the bilayer material may be molybdenum sulfide, molybdenum selenide, tungsten sulfide, or tungsten selenide. The layered material may be hexagonal boron nitride, graphene, graphite, or transition metal dichalcogenide. The transition metal dichalcogenide may be molybdenum sulfide, molybdenum selenide, tungsten sulfide, or tungsten selenide.

The first angle between lattice vectors of the first layer of the layered material and the bilayer material may be between 0° and about 5°. In another embodiment, the first angle may be greater than 0° and less than about 1°.

The lattice vector of the first layer of the layered material and the lattice vector of the second layer of the layered material may form a third angle. The third angle may be about 25° to about 35°. In another embodiment, the third angle may be about 15° to about 25°. In another embodiment, the third angle may be less than about 5°. In another embodiment, the third angle is greater than 0° and less than about 1°. In another embodiment, the third angle is about 175° to about 185°.

The memristor may further include a first electrode in electrical communication with the first layer of the layered material. The memristor may further include a second electrode in electrical communication with the second layer of the layered material. The memristor may further include a third electrode in electrical communication with the bilayer material. The first electrode may be a metal or monolayer graphene. The resistance of the memristor may change by more than 5 kΩ in response to increasing a voltage applied to the first electrode. The memristor may exhibit resistance hysteresis in response to increasing, then decreasing the voltage applied to the first electrode. The bilayer material may undergo spontaneous interlayer charge transfer in response to a voltage applied to the first electrode. The resistance of the memristor may switch in less than 1 nanosecond when a voltage is applied to at least one of the first electrode or the second electrode.

Another embodiment of the present technology includes a dual-gated graphene device. The dual-gated graphene device includes a first hexagonal boron nitride layer, a second hexagonal boron nitride layer, a Bernal-stacked bilayer graphene between the first and second hexagonal boron nitride layers, a first gate electrically coupled to the first hexagonal boron nitride layer, and a second gate electrically coupled to the second hexagonal boron nitride layer. The first and second hexagonal boron nitride layers introduce a moiré superlattice potential to the bilayer graphene. The first hexagonal boron nitride layer has a lattice vector forming a first angle between 0° and about 1° with a lattice vector of the Bernal-stacked bilayer graphene about a normal to a first surface of the Bernal-stacked bilayer graphene. The second hexagonal boron nitride layer has a lattice vector forming a second angle between 0° and about 1° with a lattice vector of the Bernal-stacked bilayer graphene about a normal to a second surface of the Bernal-stacked bilayer graphene. A resistance of the dual-gated graphene device changes by more than 5 k$\Omega$ when a voltage applied to the first gate is swept positively. The dual-gated graphene device exhibits resistance hysteresis when the voltage of the first gate is swept positively and then swept negatively.

Another embodiment of the present technology includes a method of operating a memristor. The memristor includes a first hexagonal boron nitride layer, a second hexagonal boron nitride layer, and bilayer graphene between the first and second hexagonal boron nitride layers. The first and second hexagonal boron nitride layers introduce a moiré superlattice potential to the bilayer graphene. The method of operating the memristor includes applying a first voltage to the first hexagonal boron nitride layer and a second voltage to the second hexagonal boron nitride layer. The first voltage and the second voltage switch a resistance of the memristor from a first resistance to a second resistance different than the first resistance. The method also includes applying a third voltage less than the first voltage to the first hexagonal boron nitride layer and a fourth voltage less than the second voltage to the second hexagonal boron nitride layer. The third voltage and the fourth voltage switch a resistance of the memristor from the second resistance to a third resistance. The third resistance may be different than the first resistance and the second resistance.

Another embodiment of the present technology includes a memristor. The memristor includes a pair of hexagonal boron nitride layers, and ferroelectric bilayer graphene between the pair of hexagonal boron nitride layers. The pair of hexagonal boron nitride layers introduce a moiré superlattice potential to the ferroelectric bilayer graphene.

All combinations of the foregoing concepts and additional concepts discussed in greater detail below (provided such concepts are not mutually inconsistent) are contemplated as being part of the inventive subject matter disclosed herein. In particular, all combinations of claimed subject matter appearing at the end of this disclosure are contemplated as being part of the inventive subject matter disclosed herein. The terminology explicitly employed herein that also may appear in any disclosure incorporated by reference should be accorded a meaning most consistent with the particular concepts disclosed herein.

BRIEF DESCRIPTIONS OF THE DRAWINGS

The skilled artisan will understand that the drawings primarily are for illustrative purposes and are not intended to limit the scope of the inventive subject matter described herein. The drawings are not necessarily to scale; in some instances, various aspects of the inventive subject matter disclosed herein may be shown exaggerated or enlarged in the drawings to facilitate an understanding of different features. In the drawings, like reference characters generally refer to like features (e.g., functionally similar and/or structurally similar elements).

FIG. 1E shows a first memristor with bilayer graphene sandwiched between two BN layers.

FIG. 1F shows a second memristor with bilayer graphene sandwiched between two graphite or graphene layers.

FIG. 1G shows a third memristor with a bilayer transition metal dichalcogenide layer sandwiched between two transition metal dichalcogenide layers.

FIG. 1K shows graphene's alignment with each layer of BN in device H4, where the lattice vectors of both BN layers are rotationally aligned at about 0° with the lattice vectors of the bilayer graphene.

FIG. 1L shows graphene's alignment with each layer of BN in device H2, where one BN layer has a lattice vector rotationally aligned at about 0° and the other BN layer has a lattice vector rotationally aligned at about 30° with the lattice vectors of the bilayer graphene.

FIG. 1M is a schematic of a moiré pattern at a rotational alignment angle of 0° for a small lattice mismatch $\delta$.

FIG. 1N is a schematic of a moiré pattern at a rotational alignment angle of 0° for a large lattice mismatch $\delta$.

FIG. 1O is a schematic of a moiré pattern at a rotational alignment angle of 30° for a small lattice mismatch $\delta$.

FIG. 1P is a schematic of a moiré pattern at a rotational alignment angle of 30° for a large lattice mismatch $\delta$.

FIG. 2K shows a forward scan of the four-probe longitudinal resistance of device H4 as a function of the top gate voltage $V_{TG}$ and the bottom gate voltage $V_{BG}$. $V_{TG}$ is scanned from −8 V to +8 V and $V_{BG}$ is scanned from −40 V to 0 V.

FIG. 2L shows a backward scan of the four-probe longitudinal resistance of device H4 as a function of the top gate voltage $V_{TG}$ and the bottom gate voltage $V_{BG}$. $V_{TG}$ is scanned from −8 V to +8 V and $V_{BG}$ is scanned from 0 V to −40 V.

FIG. 2M shows the difference in the four-probe longitudinal resistance between the forward and backward scans in FIGS. 2K and 2L, respectively.

Figure 8C:
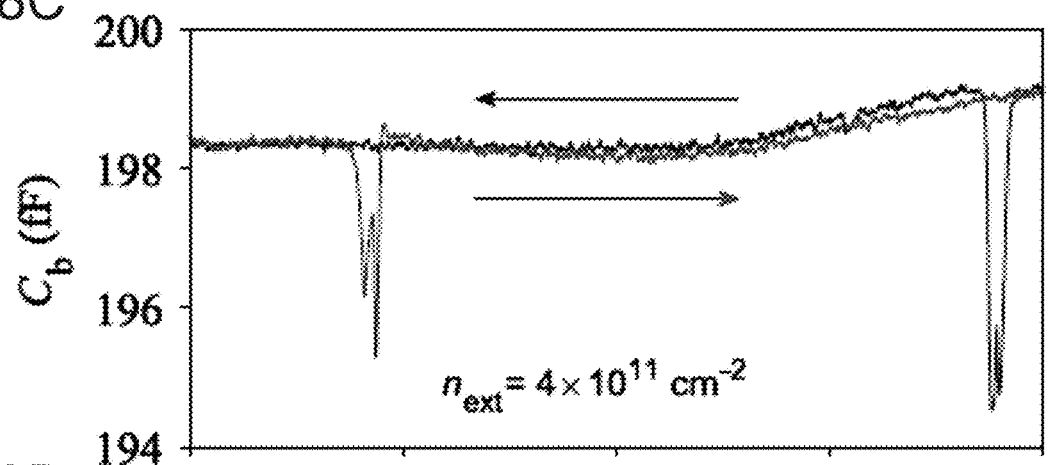
FIG. 8C shows forward and backward scans of $C_b$ from FIGS. 8A and 8B, respectively, at a fixed $n_{ext}$.
Figure 8D:
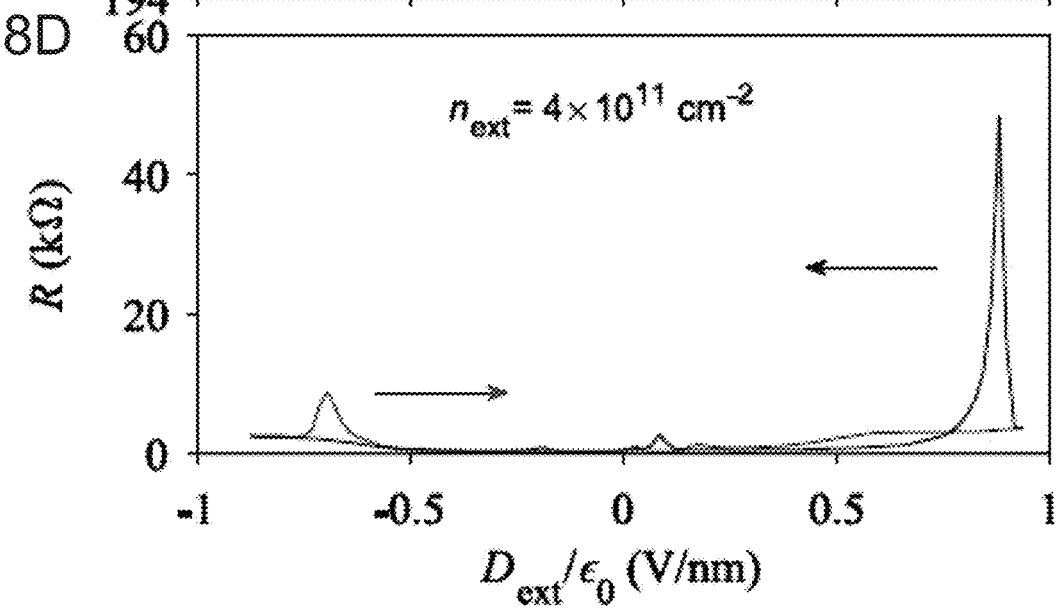
FIG. 8D shows forward and backward traces of resistance measurements at the same $n_{ext}$ as in FIG. 8C corresponding to the incompressible features in FIG. 8C
Figure 8E:
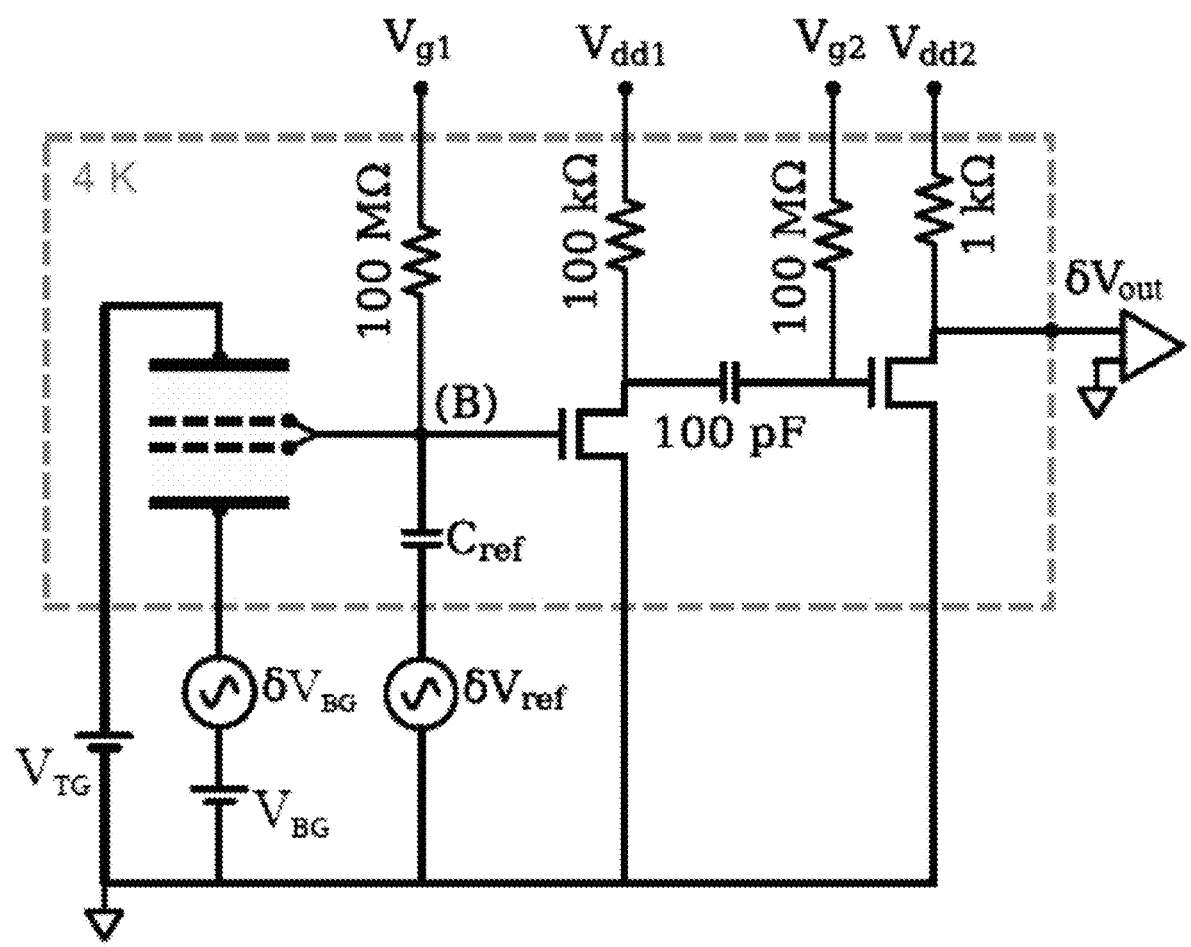
FIG. 8E is a circuit schematic of the bottom gate capacitance measurement of device H2, including a two-stage cryogenic amplifier enclosed in the dashed box.
Figure 8G:
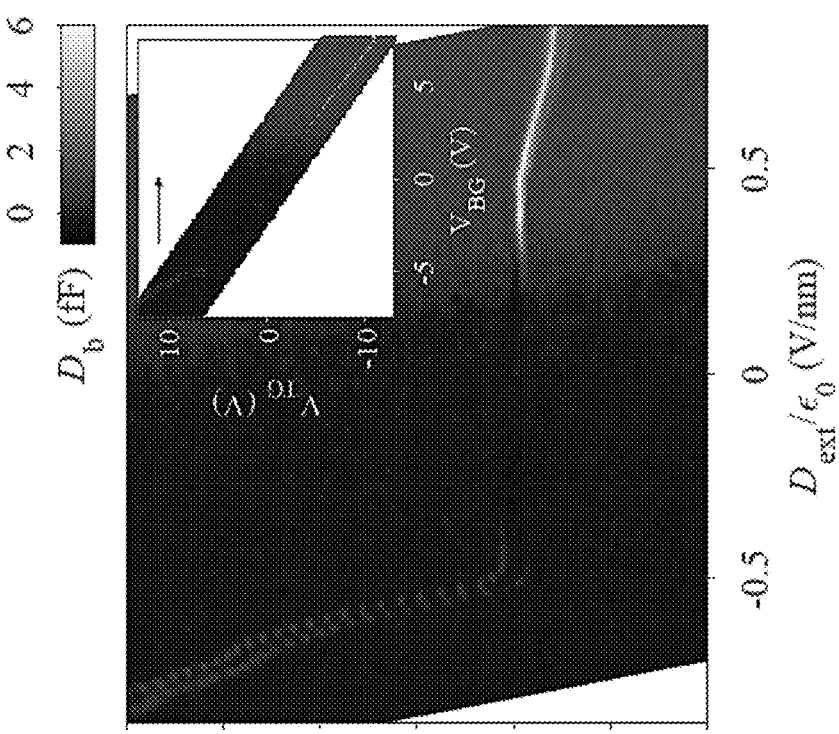
FIG. 8A shows a forward scan of the capacitance $C_b$ of device H2 as a function of $n_{ext}$ and $D_{ext}$.
FIG. 8B shows a backward scan of the capacitance $C_b$ of device H2 as a function of $n_{ext}$ and $D_{ext}$.
Figure 8F:
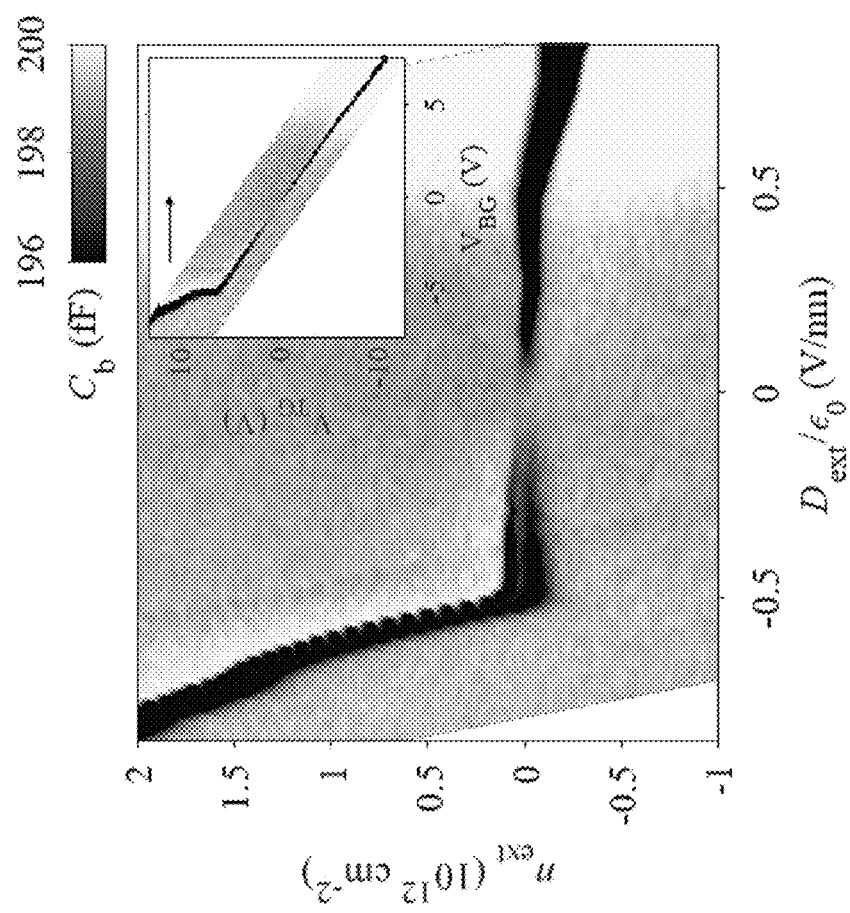

FIG. 8F shows the in-phase bottom-gate capacitance of device H2, sweeping $V_{BG}$ as the fast axis and scanning $V_{TG}$ slowly from top to bottom. Dark regions indicate that dissipation is small where the sample is highly conducting, and the measurement may be regarded as purely capacitive. The inset shows the applied gate voltages.

FIG. 8G shows the out-of-phase dissipation signal of device H2 using the same parameters as in FIG. 8F.

Figure 8H:
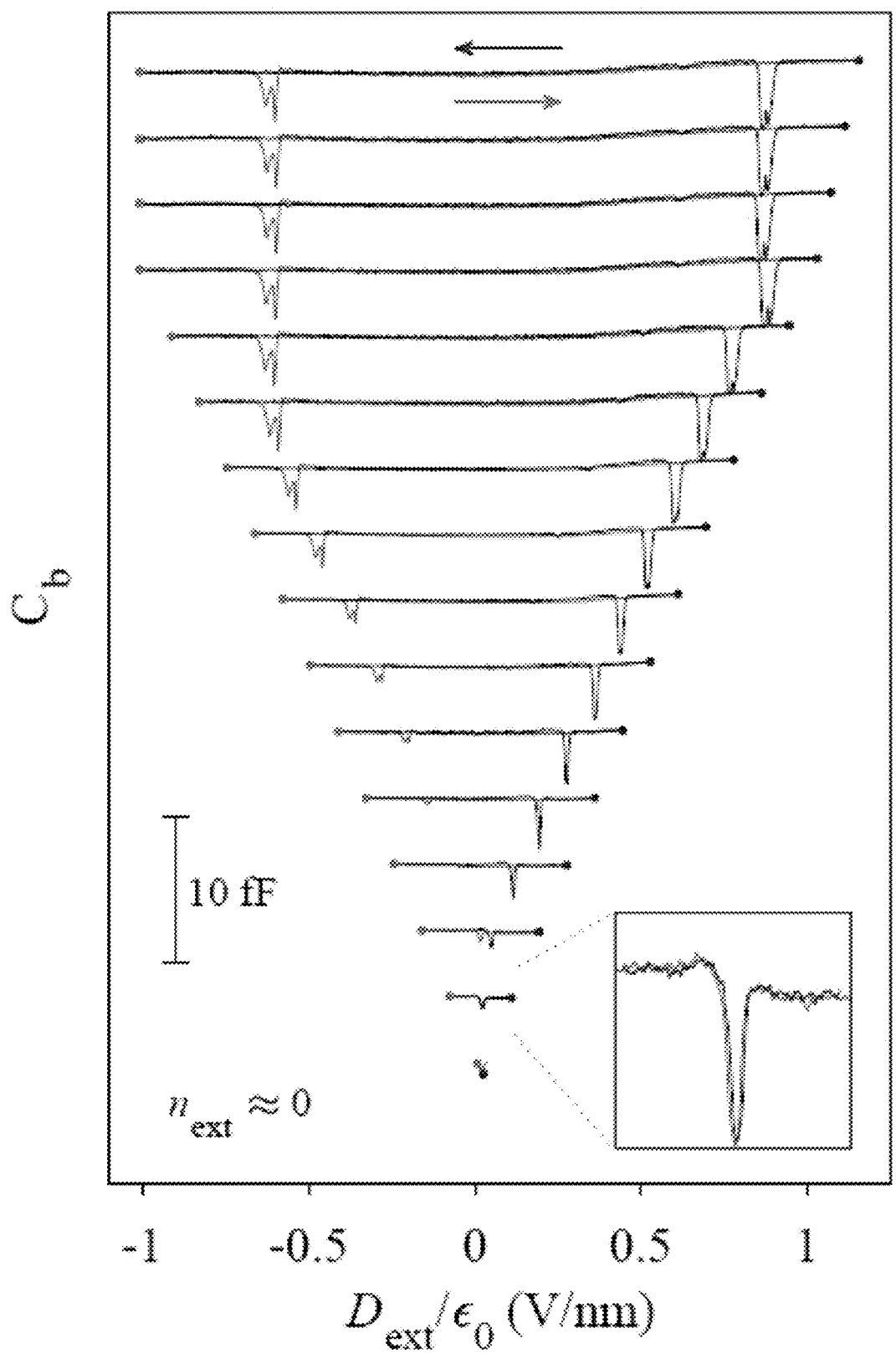

FIG. 8H shows the back-gate capacitance measurements for device H2 with increasing ranges of $D_{ext}$ at $n_{ext}=0$. Curves are vertically offset for clarity.

Figure 8I:
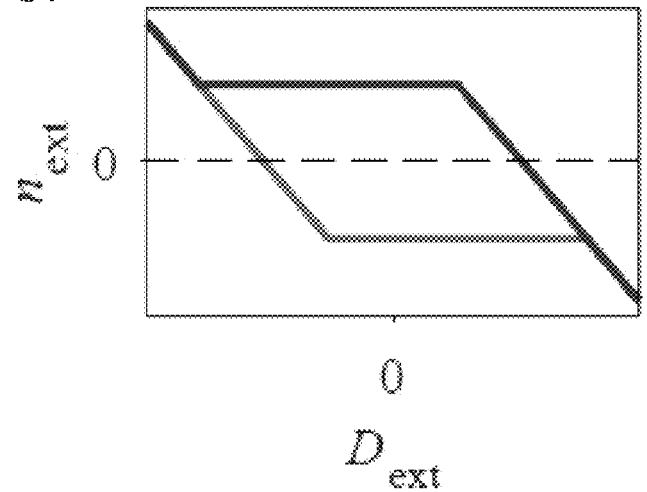

FIG. 8I shows a diagram of the hysteretic parallelogram in the large $D_{ext}$ range in FIG. 8H, with a dashed line depicting the scan in FIG. 8H.

Figure 8J:
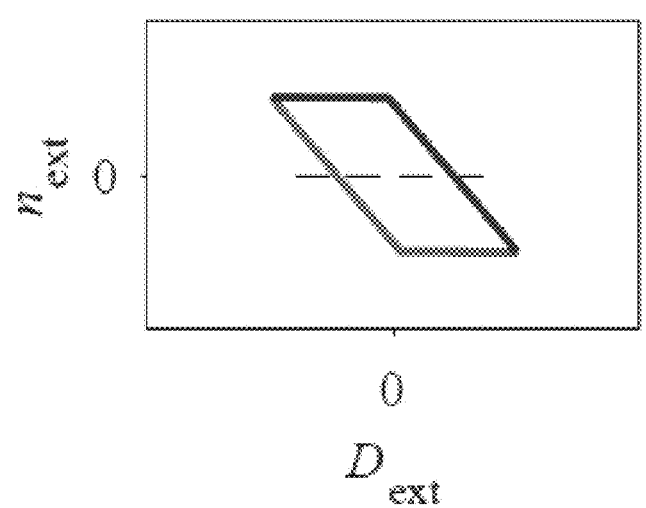

FIG. 8J shows a diagram of the hysteretic parallelogram in the middle $D_{ext}$ range in FIG. 8H, with a dashed line depicting the scan in FIG. 8H.

Figure 8K:
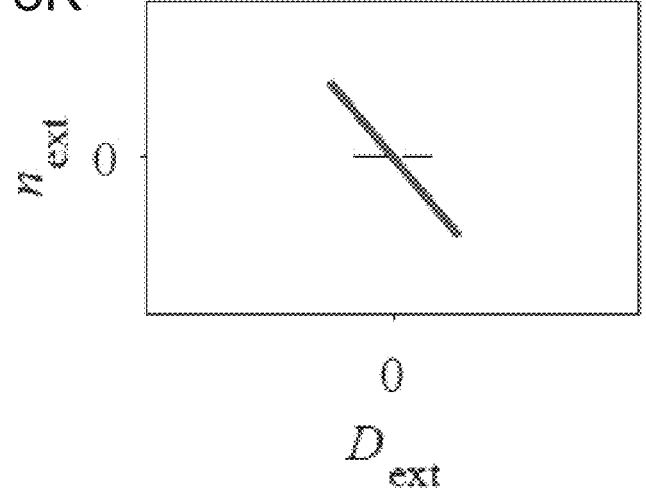

FIG. 8K shows a diagram of the hysteretic parallelogram in the small $D_{ext}$ range in FIG. 8H, with a dashed line depicting the scan in FIG. 8H.

FIG. 9A is a plot of forward and backward scans of $C_b$ versus $D_{ext}$ for device H2 at a first scanning rate.

Figure 9B:
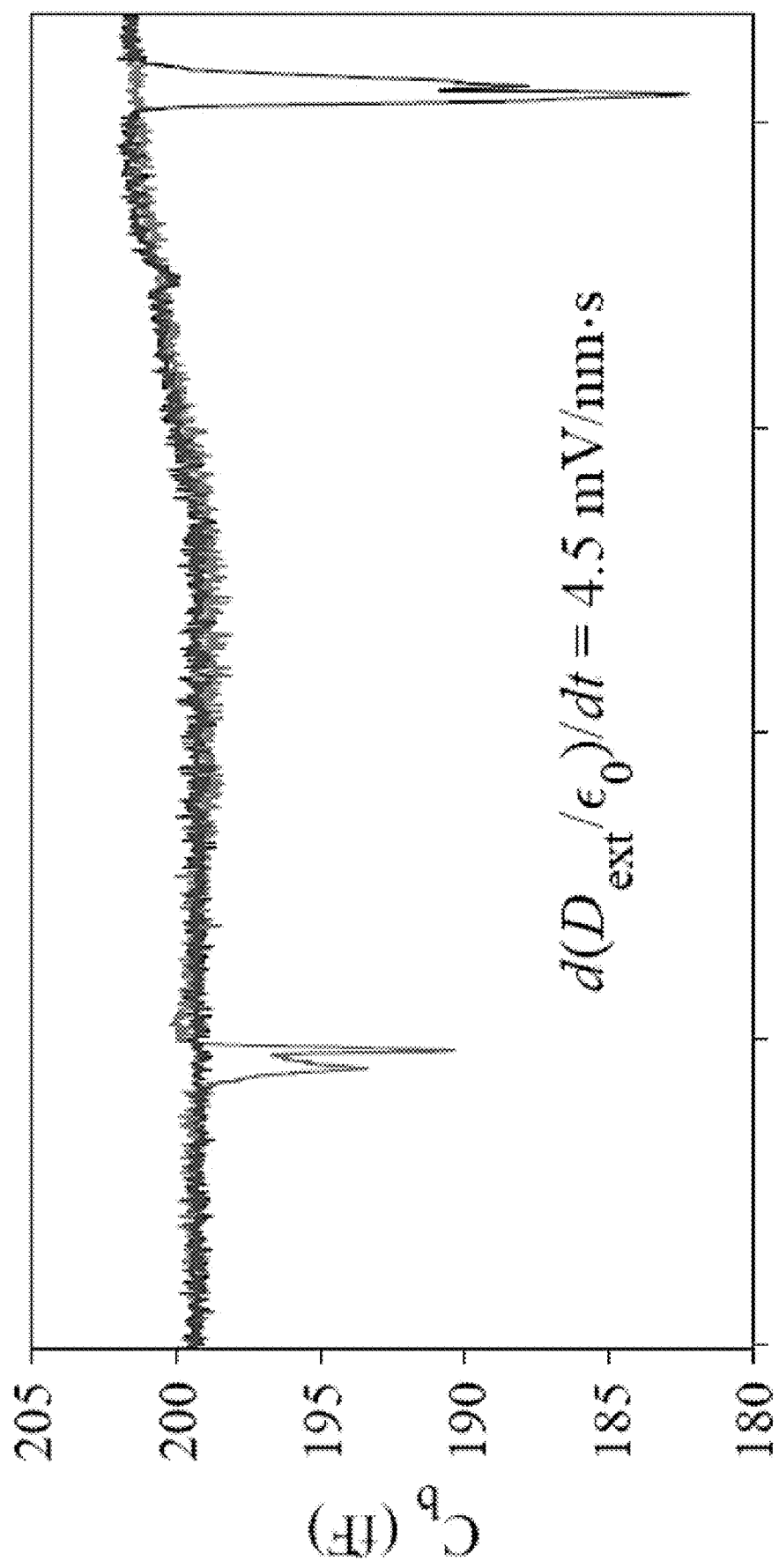

FIG. 9B is a plot of forward and backward scans of $C_b$ versus $D_{ext}$ for device H2 at a second scanning rate.

Figure 9C:
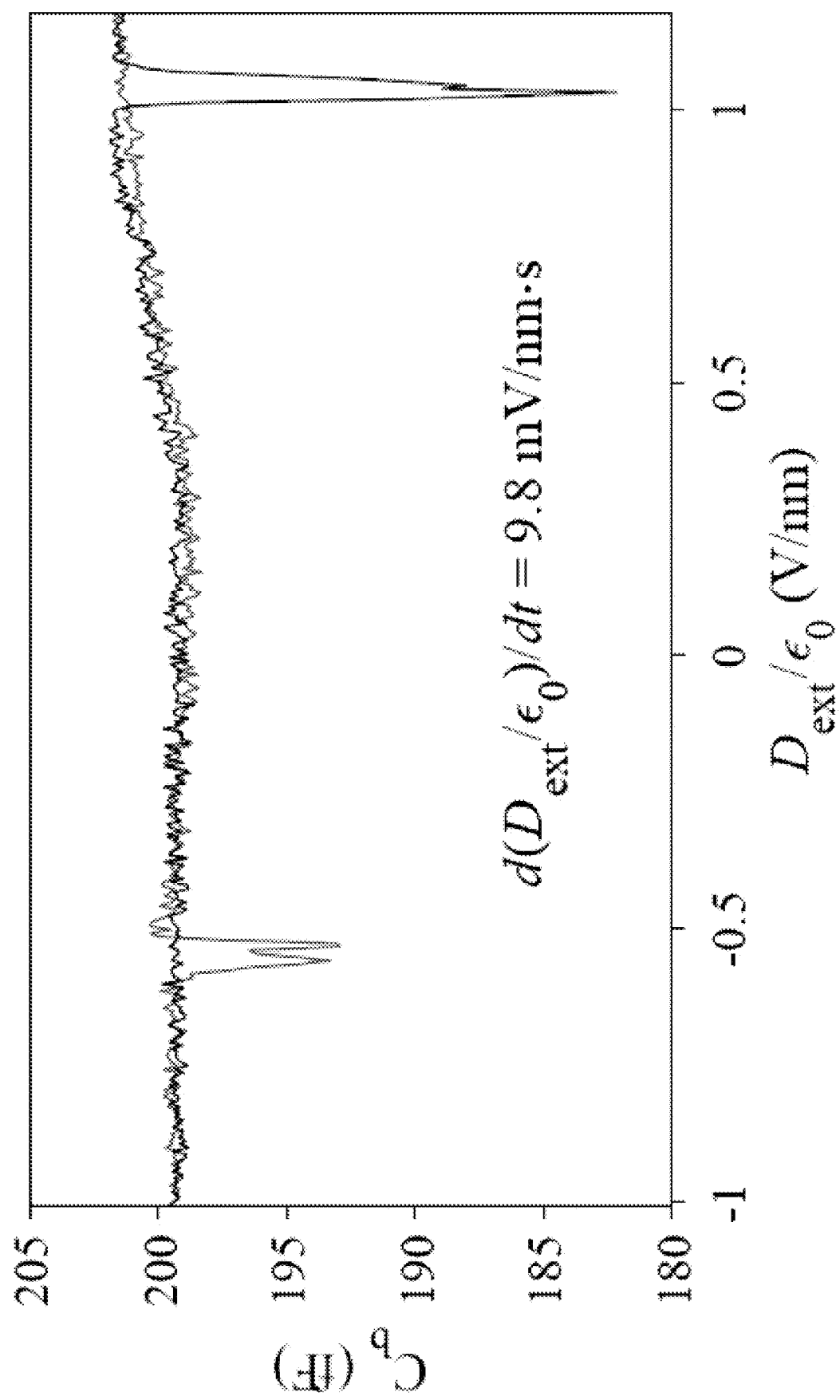

FIG. 9C is a plot of forward and backward scans of $C_b$ versus $D_{ext}$ for device H2 at a third scanning rate.

Figure 10A:
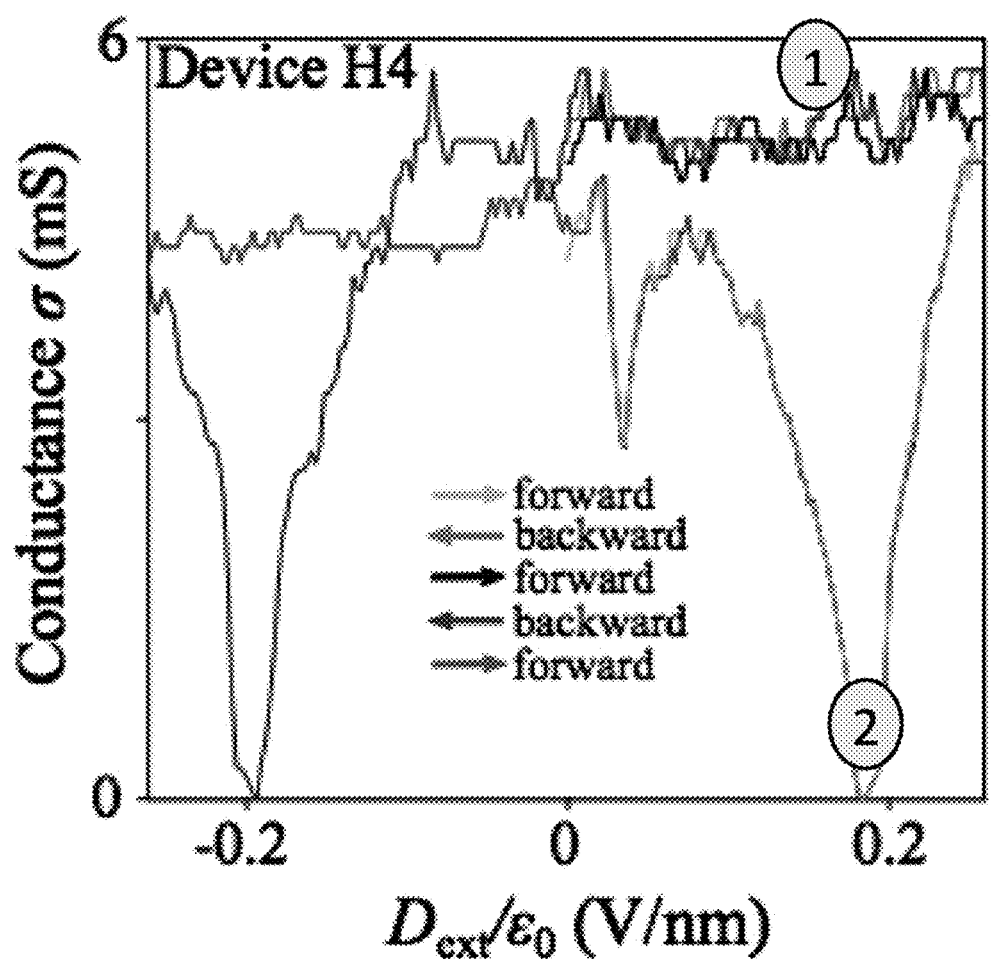

FIG. 10A is a plot of the conductance of device H4 versus external electric field over several forward and backward sweeps of the external electric field. The inset shows the sequence of the measurement sweeps.

Figure 10B:
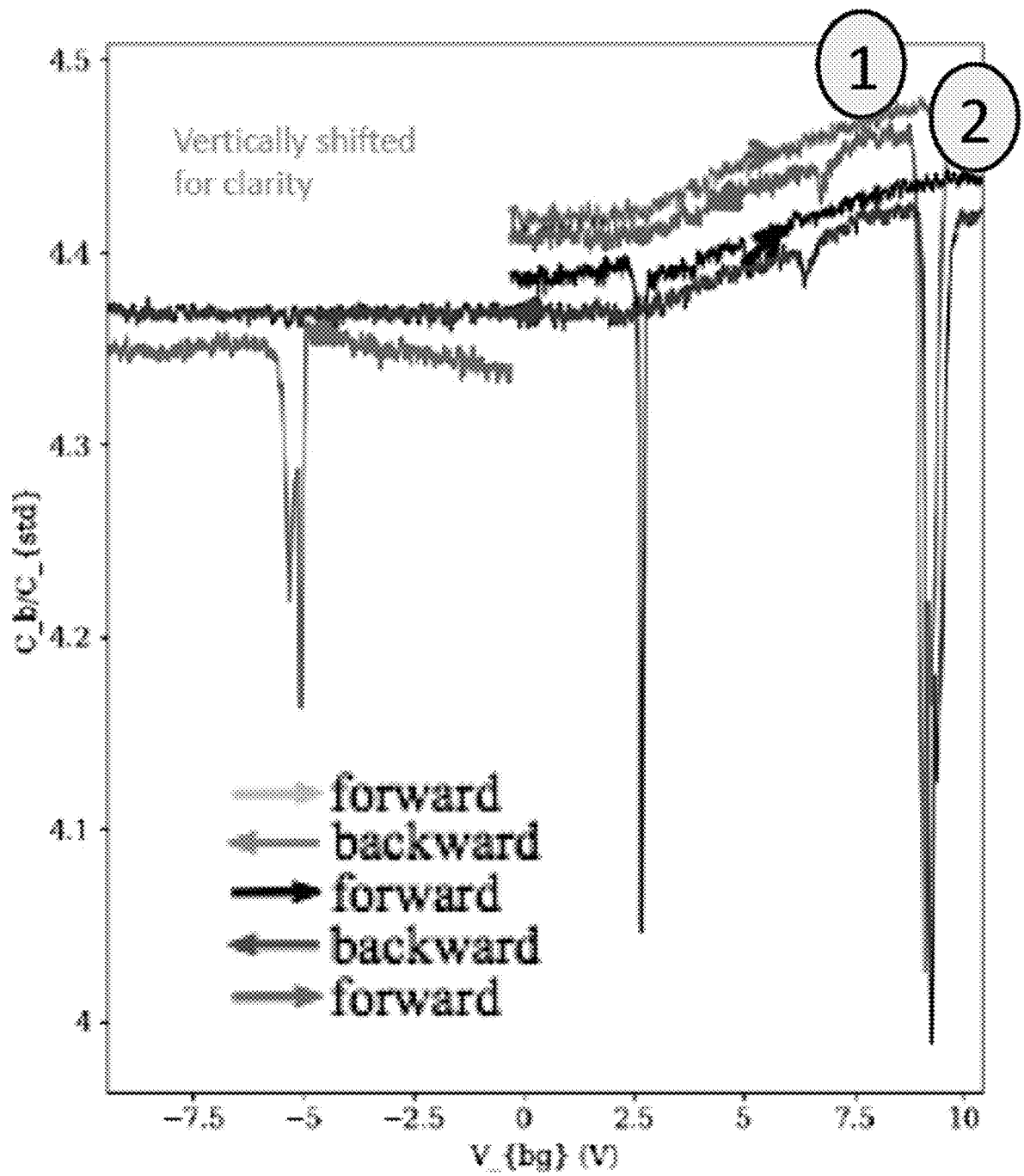

FIG. 10B is a plot of the capacitance of device H2 versus external electric field over several forward and backward sweeps of the external electric field. The traces are separated vertically for clarity, and the inset shows the sequence of the measurement sweeps.

FIG. 11A is a device schematic for M1.

FIG. 11B is a dual-gate resistance map for device M1

FIG. 11C is a plot of resistance as a function of $D_{ext}$ for device M1

FIG. 11D is a device schematic for N0.

FIG. 11E is a dual-gate resistance map for device N0.

FIG. 11F is a plot of resistance as a function of $D_{ext}$ for device N0.

Figure 11I:
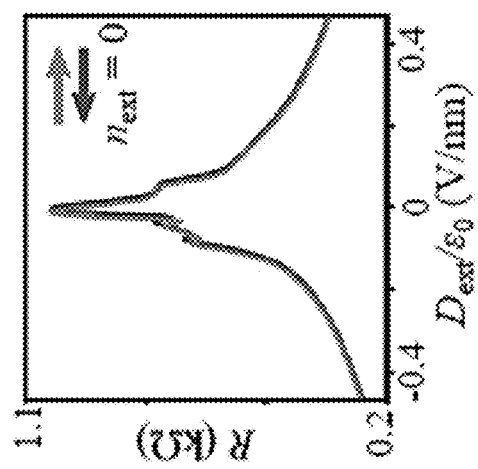
Figure 11H:
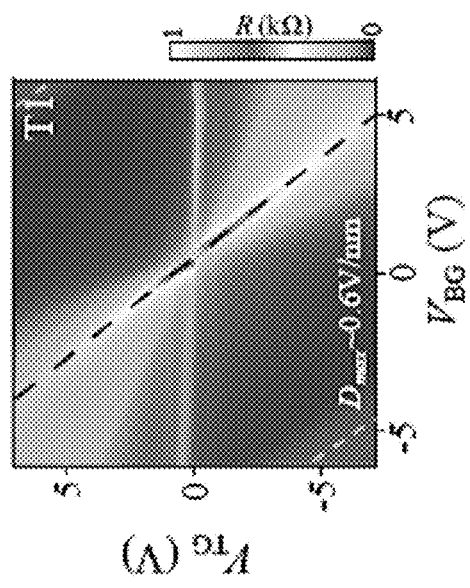
Figure 11G:
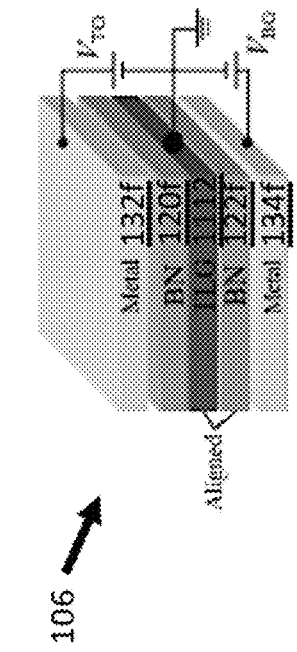

FIG. 11G is a device schematic for T1.

FIG. 11H is a dual-gate resistance map for device T1.

FIG. 11I is a plot of resistance as a function of $D_{ext}$ for device T1.

Figures 11J, 11K:
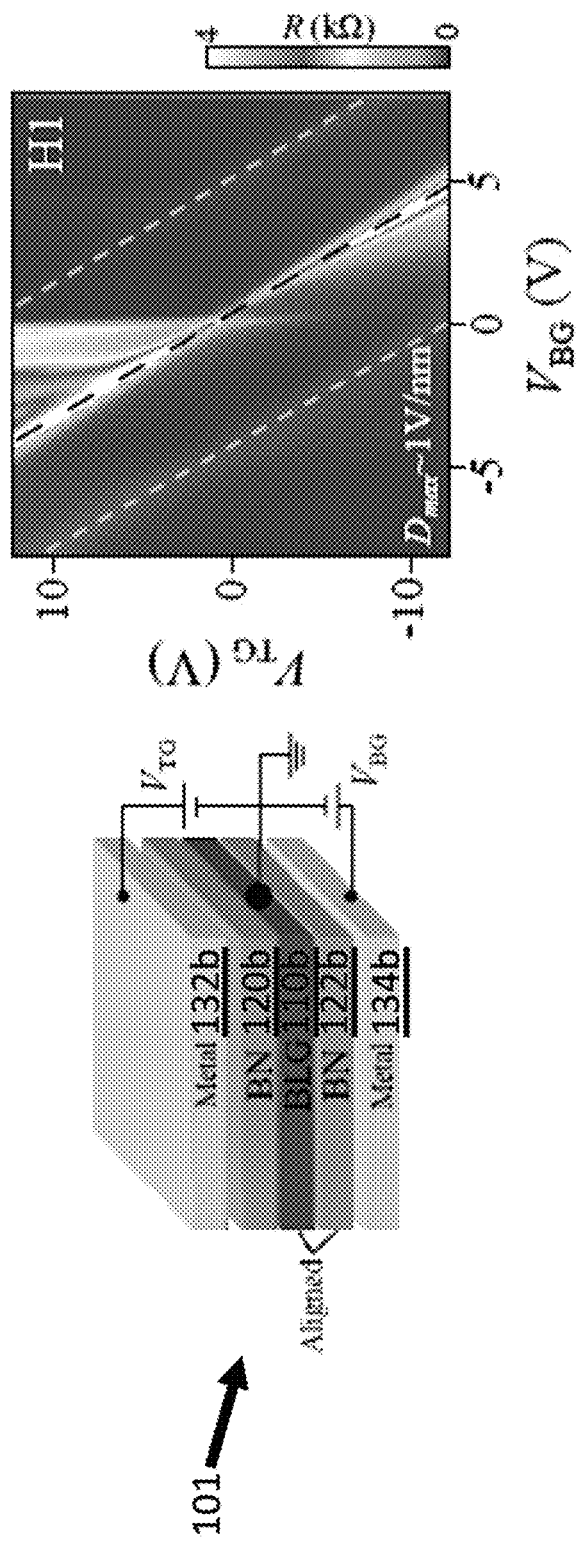

FIG. 11J is a device schematic for H1.

FIG. 11K is a dual-gate resistance map for device H1.

Figure 11M:
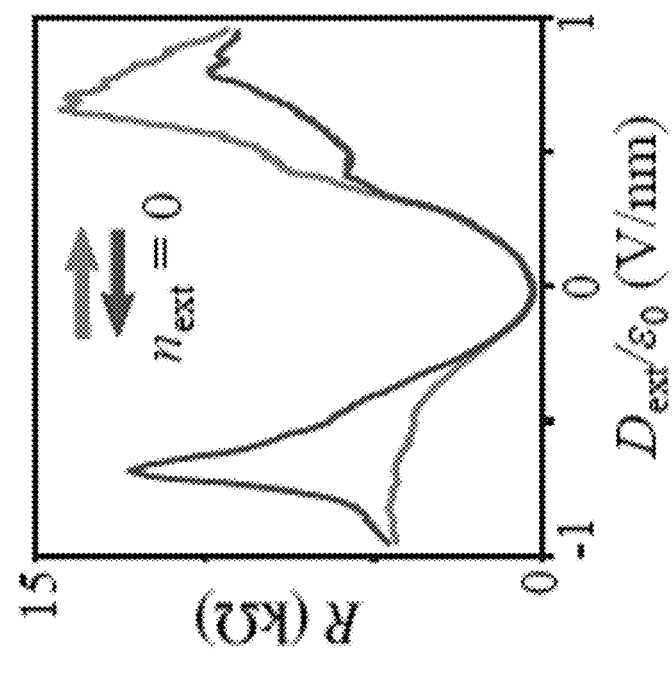
Figure 11L:
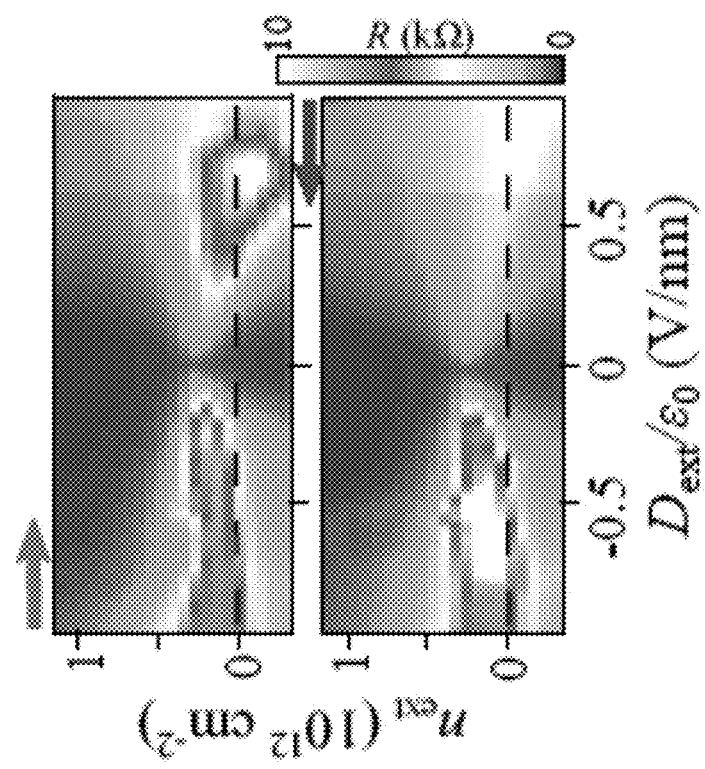

FIG. 11L is an n–D map in the forward (top) and backward (bottom) directions for device H1.

FIG. 11M is a plot of resistance as a function of $D_{ext}$ for device H1.

Figure 11O:
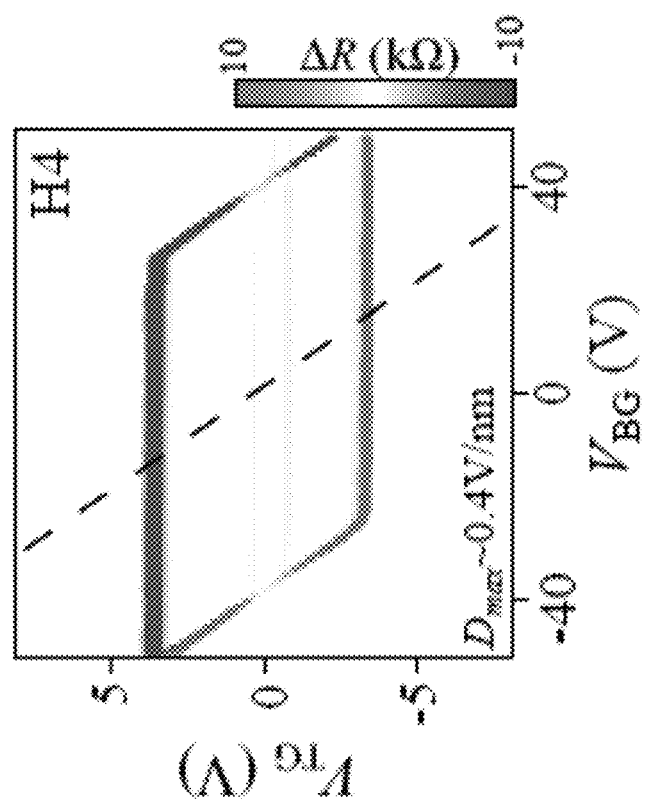
Figure 11N:
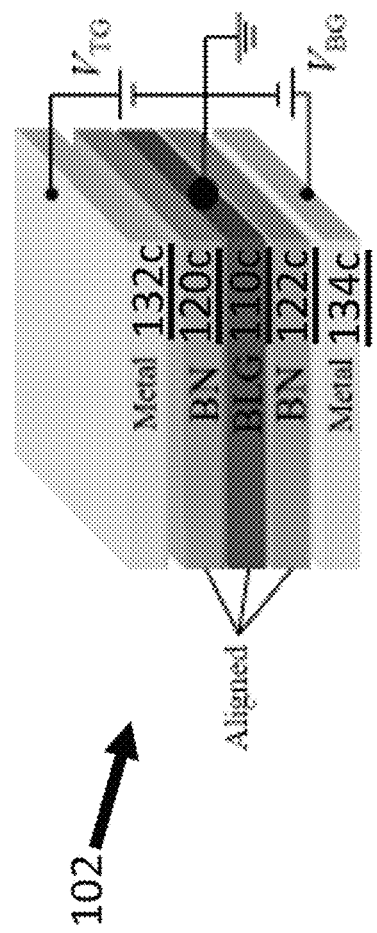

FIG. 11N is a device schematic for H4.

FIG. 11O is a dual-gate resistance map for device H4.

Figure 11Q:
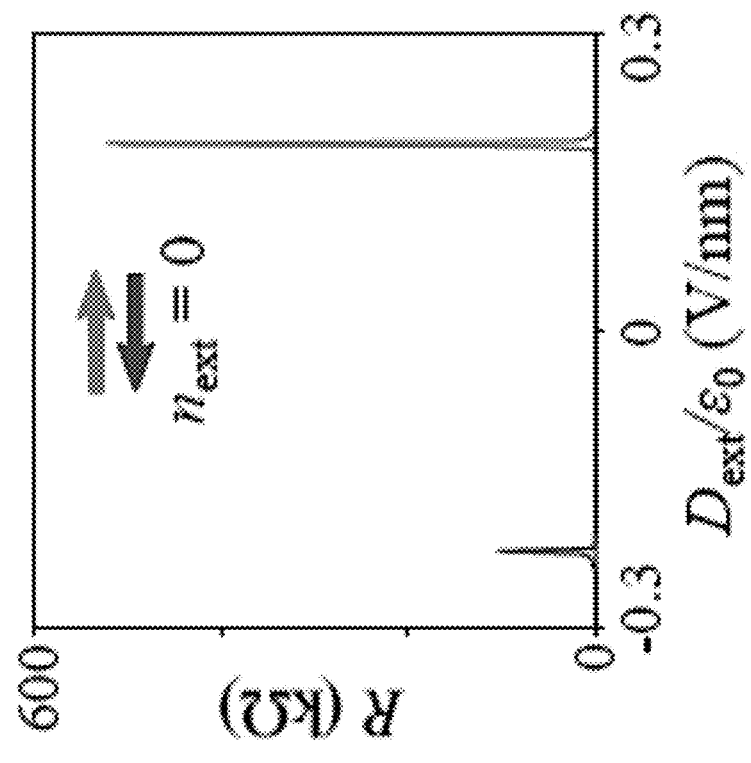
Figure 11P:
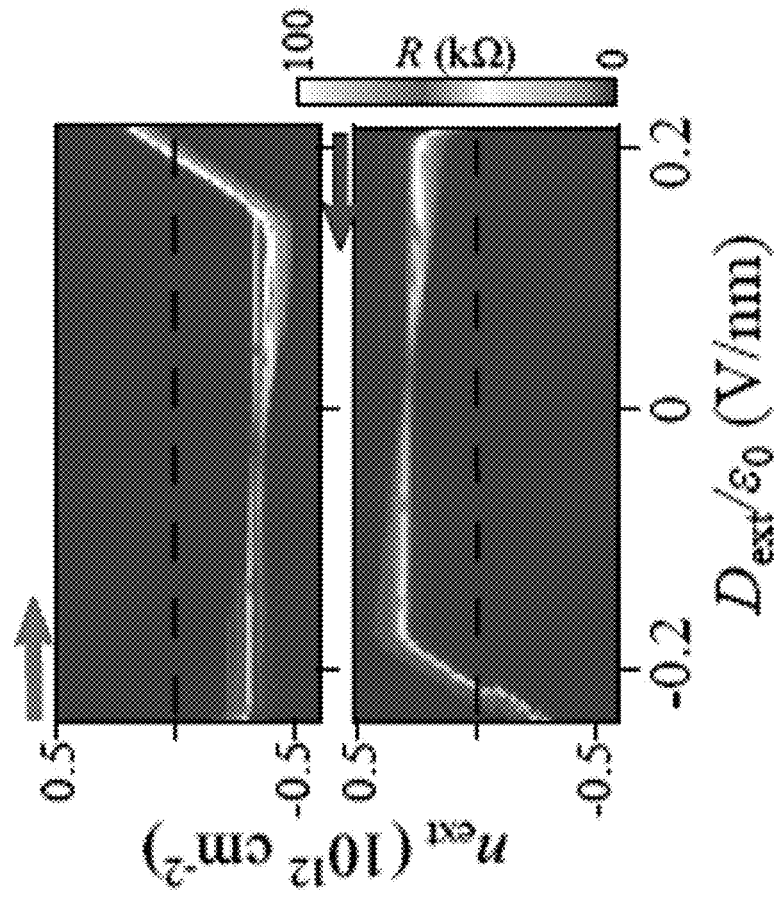

FIG. 11P is an n–D map in the forward (top) and backward (bottom) directions for device H4.

FIG. 11Q is a plot of resistance as a function of $D_{ext}$ for device H4.

Figure 12B:
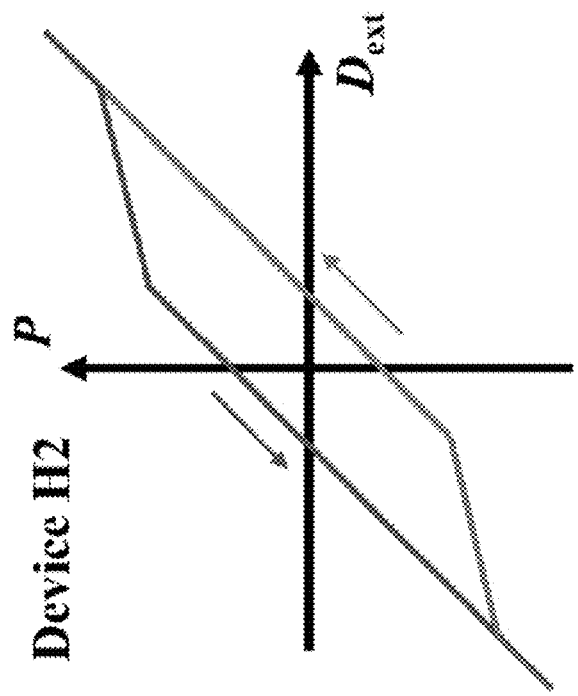
Figure 12A:
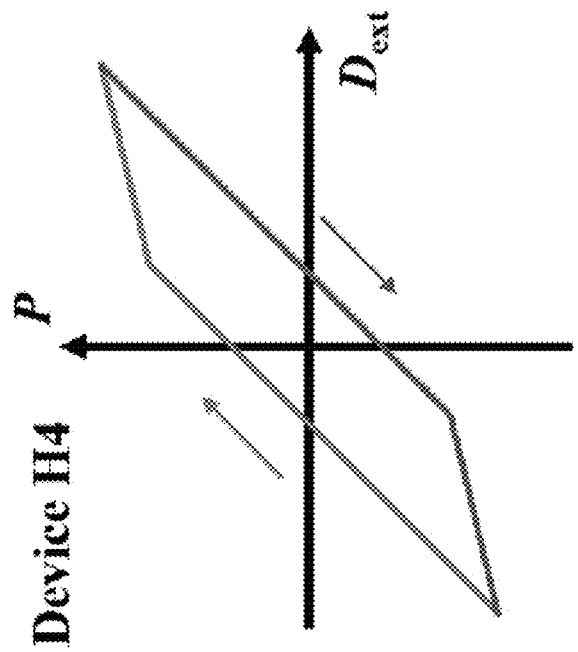

FIG. 12A is a schematic of electrical polarization (P) as a function of $D_{ext}$ for device H4.

FIG. 12B is a schematic of P as a function of $D_{ext}$ for device H2.

Figures 13A, 13B, 13C, 13D:
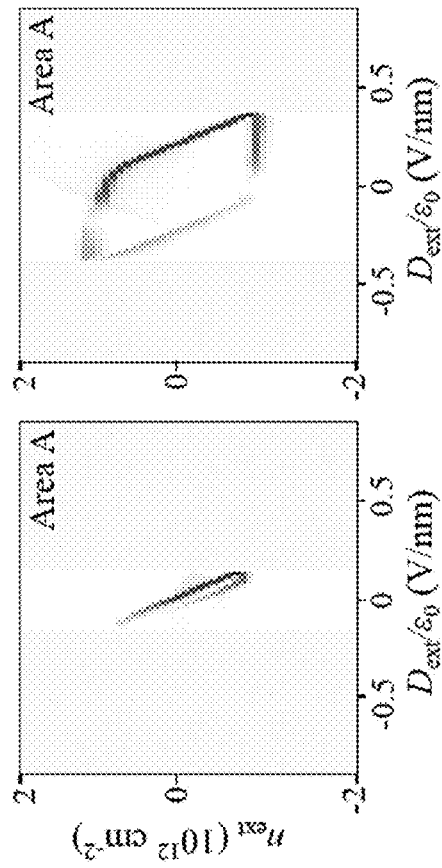

FIG. 13A shows a $n_{ext}$ vs. $D_{ext}$ map for a $D_{ext}$ range between −0.2 and +0.2 V/nm in device H2. The resistance scale is 10 kΩ.

FIG. 13B shows a $n_{ext}$ vs. $D_{ext}$ map for a $D_{ext}$ range between −0.4 and +0.4 V/nm in device H2. The resistance scale is 20 kΩ.

FIG. 13C shows a $n_{ext}$ vs. $D_{ext}$ map for a $D_{ext}$ range between −0.6 and +0.6 V/nm in device H2. The resistance scale is 20 kΩ.

FIG. 13D shows a $n_{ext}$ vs. $D_{ext}$ map for a $D_{ext}$ range between −0.8 and +0.8 V/nm in device H2. The resistance scale is 20 kΩ.

Figure 14A:
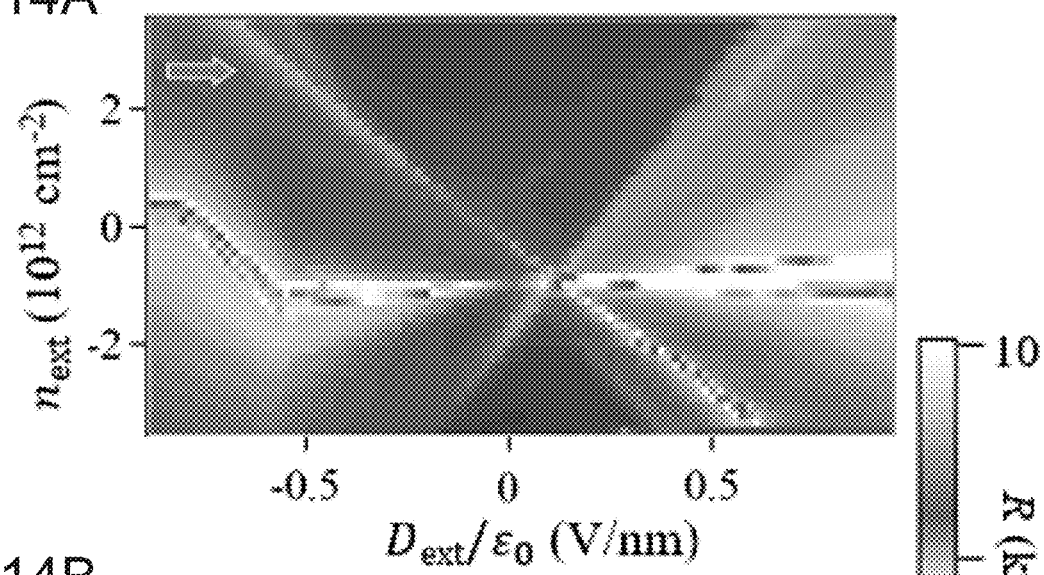

FIG. 14A is a forward scan map of resistance as a function of $n_{ext}$ and $D_{ext}$ for device H2 at a magnetic field B=0.

Figure 14B:
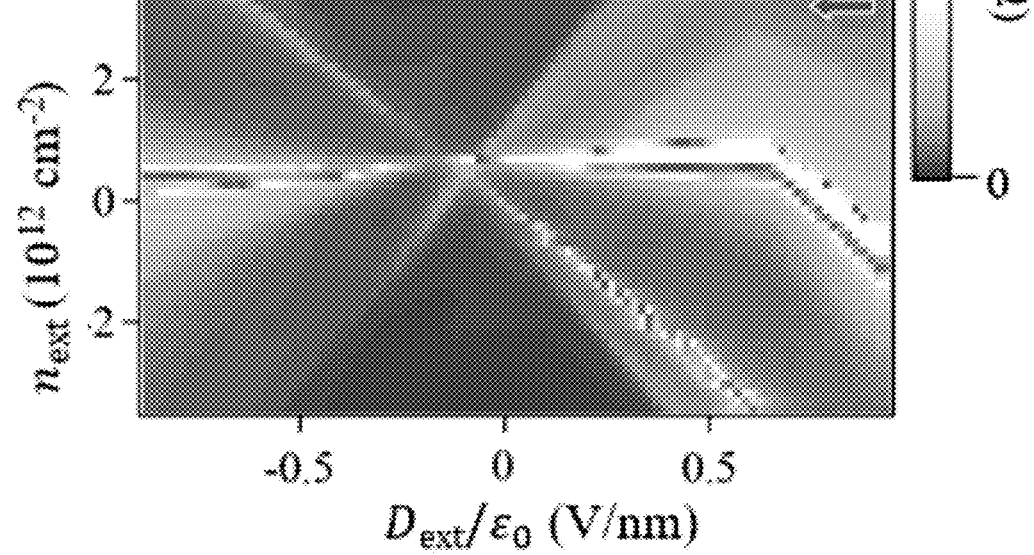

FIG. 14B is a backward scan map of resistance as a function of $n_{ext}$ and $D_{ext}$ for device H2 at a magnetic field B=0.

Figure 14C:
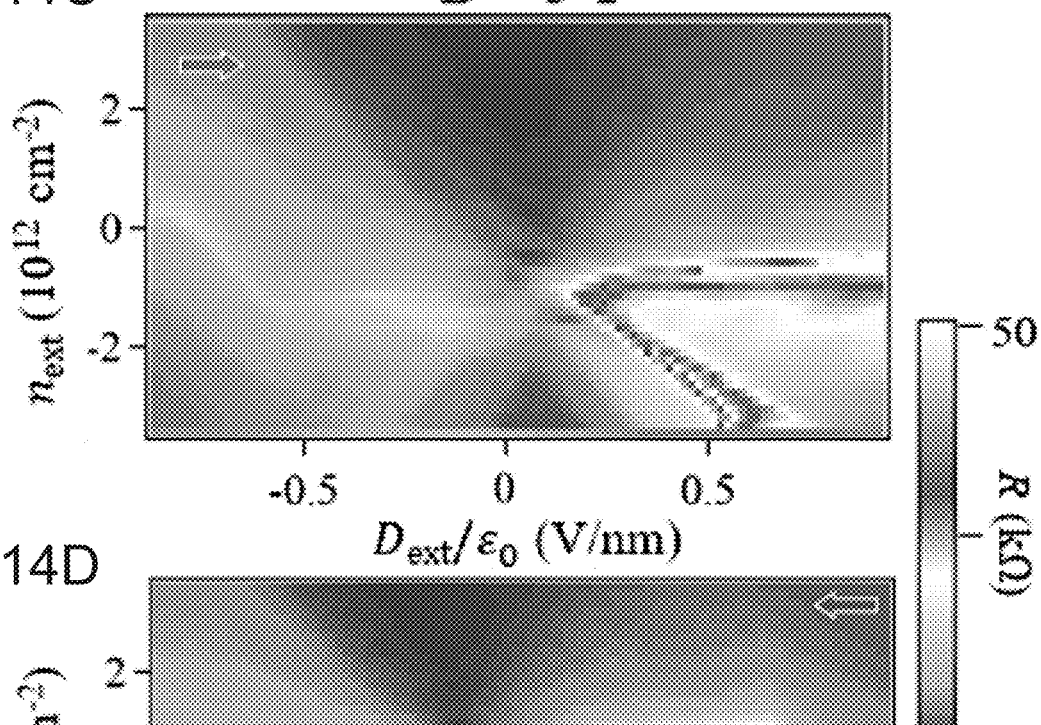

FIG. 14C is a forward scan map of resistance as a function of $n_{ext}$ and $D_{ext}$ for device H2 at a magnetic field B=5T.

Figure 14D:
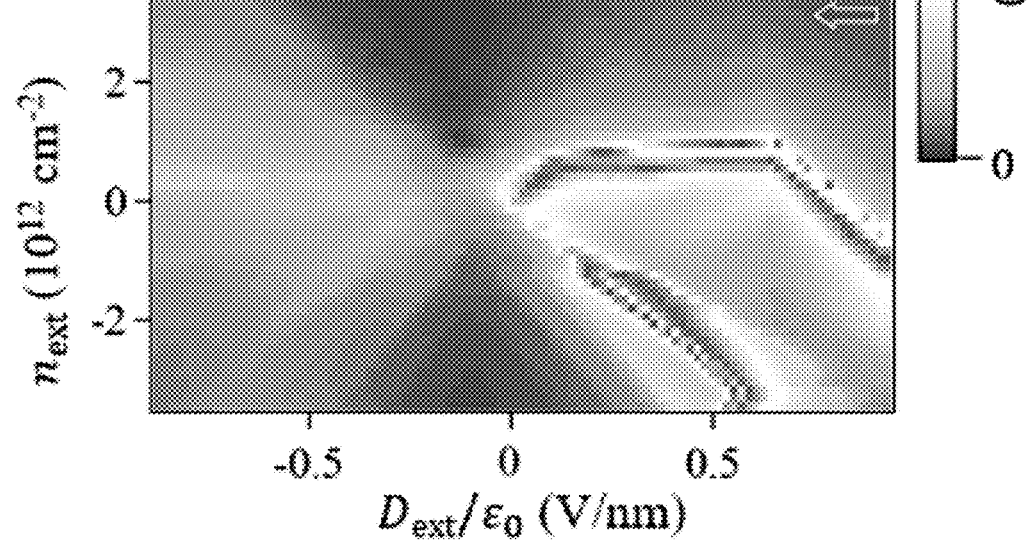

FIG. 14D is a backward scan map of resistance as a function of $n_{ext}$ and $D_{ext}$ for device H2 at a magnetic field B=5T.

Figure 14E:
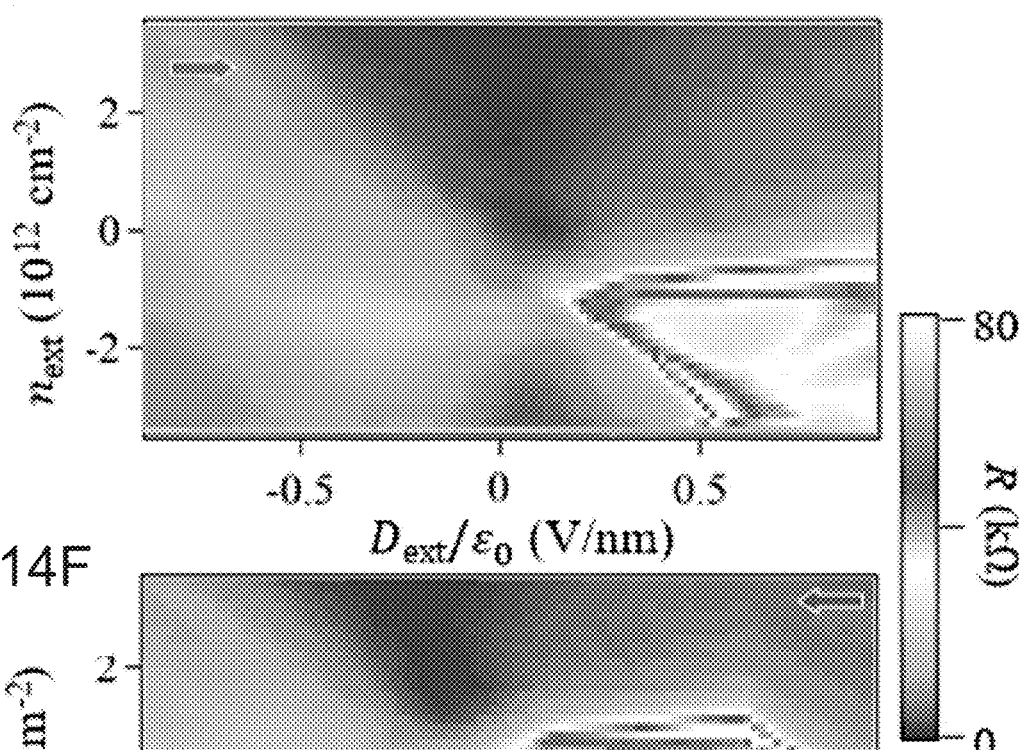

FIG. 14E is a forward scan map of resistance as a function of $n_{ext}$ and $D_{ext}$ for device H2 at a magnetic field B=10T.

Figure 14F:
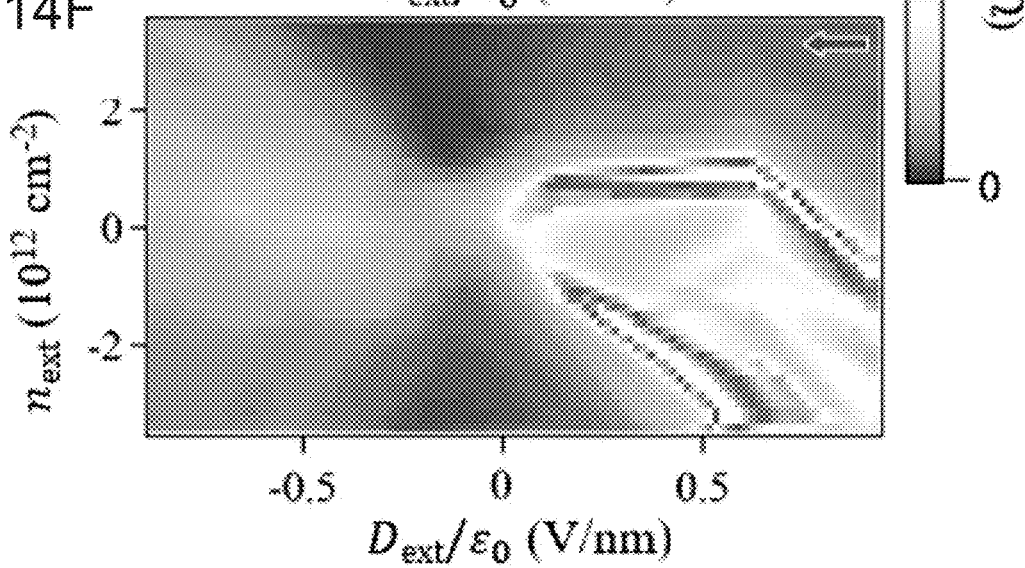

FIG. 14F is a forward scan map of resistance as a function of $n_{ext}$ and $D_{ext}$ for device H2 at a magnetic field B=10T.

Figure 15:
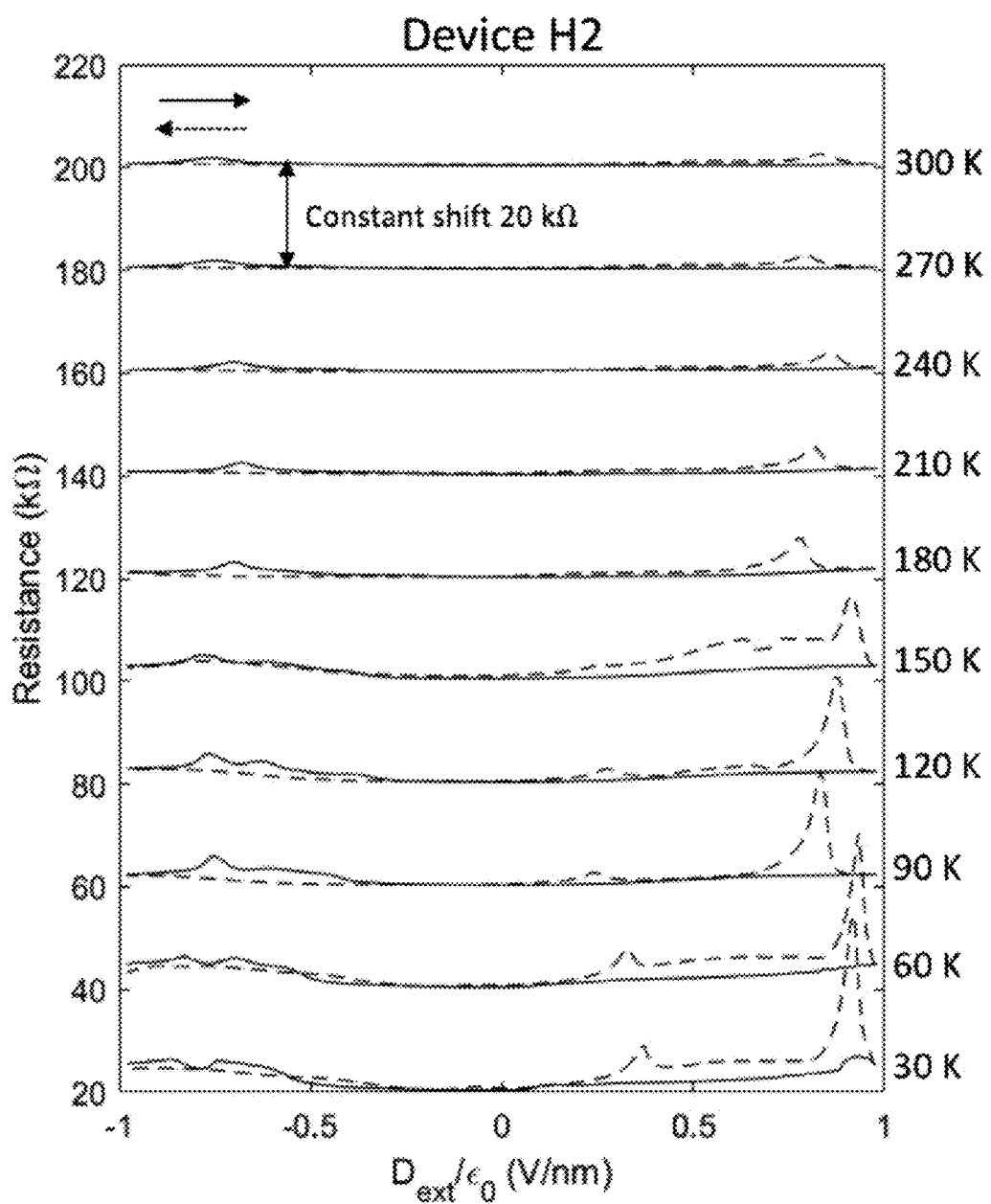

FIG. 15 shows resistance measurements vs. $D_{ext}$ for device H2 at different operation temperatures.

Figure 16A:
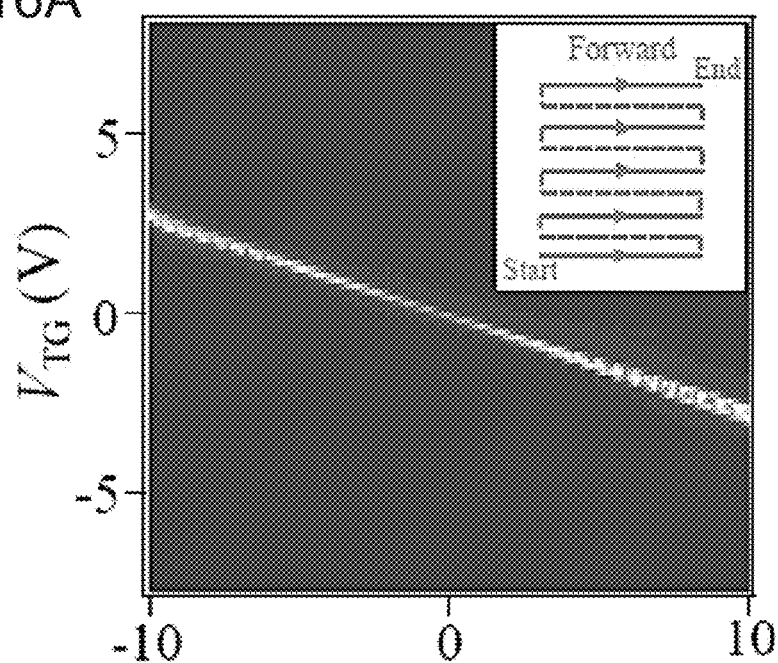

FIG. 16A shows a dual gate resistance map of device H4 with $V_{BG}$ as the fast scan axis in the forward scan direction.

Figure 16B:
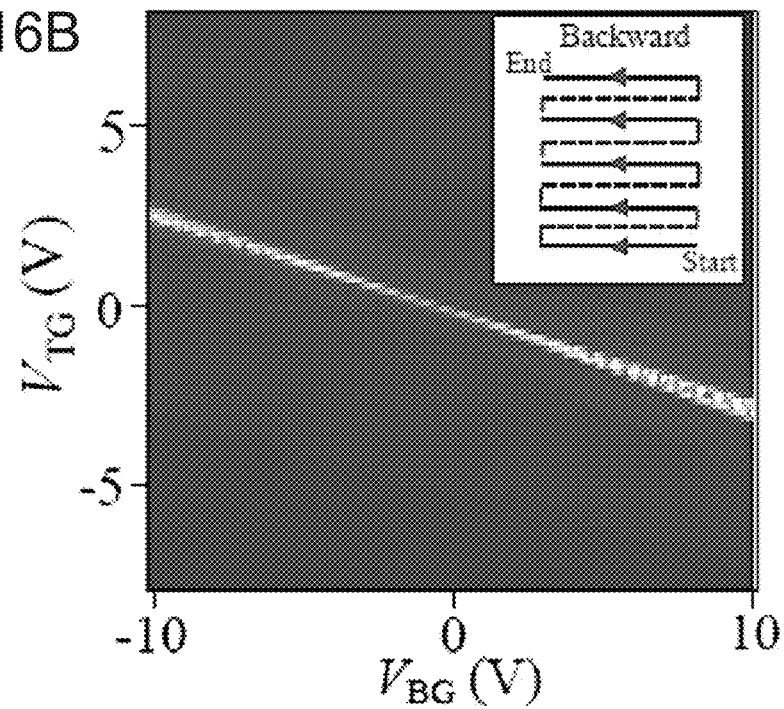

FIG. 16B shows a dual gate resistance map of device H4 with $V_{BG}$ as the fast scan axis in the backward scan direction following the scan in FIG. 16A.

Figure 16C:
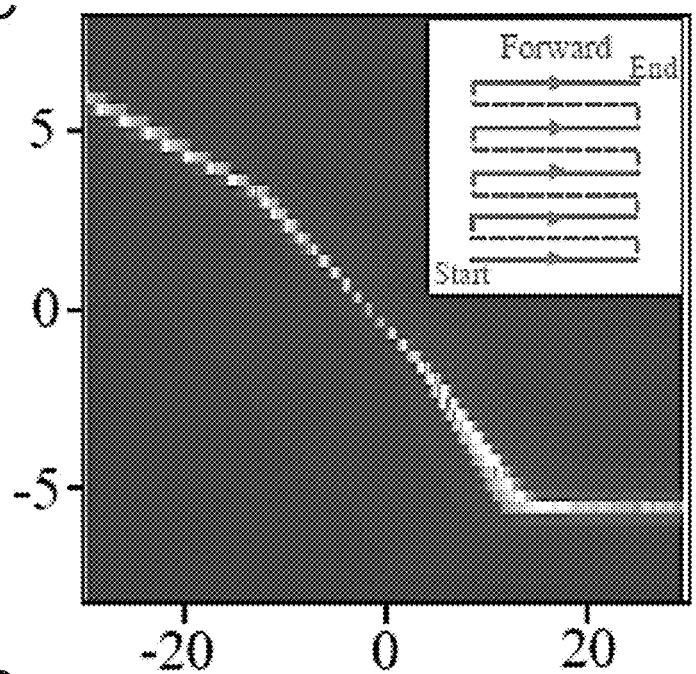

FIG. 16C shows the same measurements as FIG. 16A but for a larger $V_{BG}$ scan range.

Figure 16D:
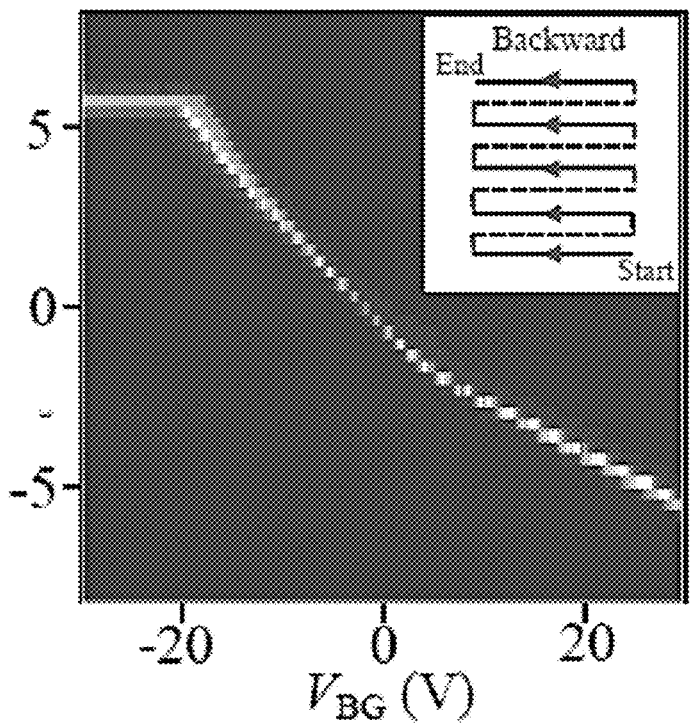

FIG. 16D shows the same measurements as FIG. 16B but for a larger $V_{BG}$ scan range.

Figure 16E:
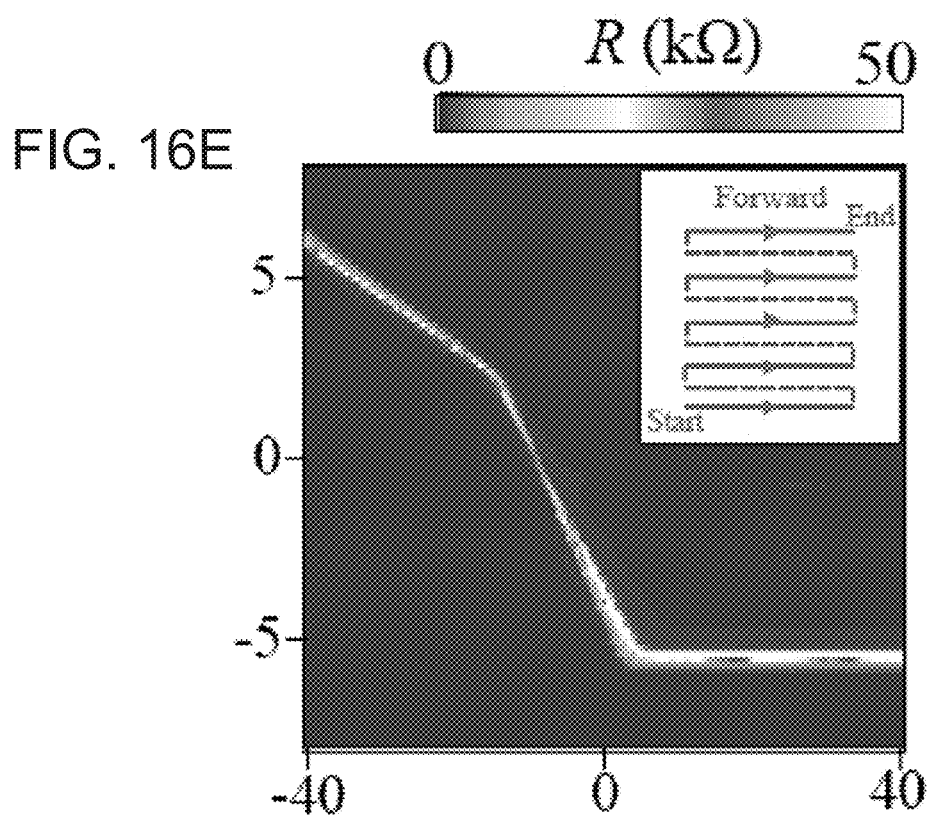

FIG. 16E shows the same measurements as FIGS. 16A and 16C, but for an even larger $V_{BG}$ range.

Figure 16F:
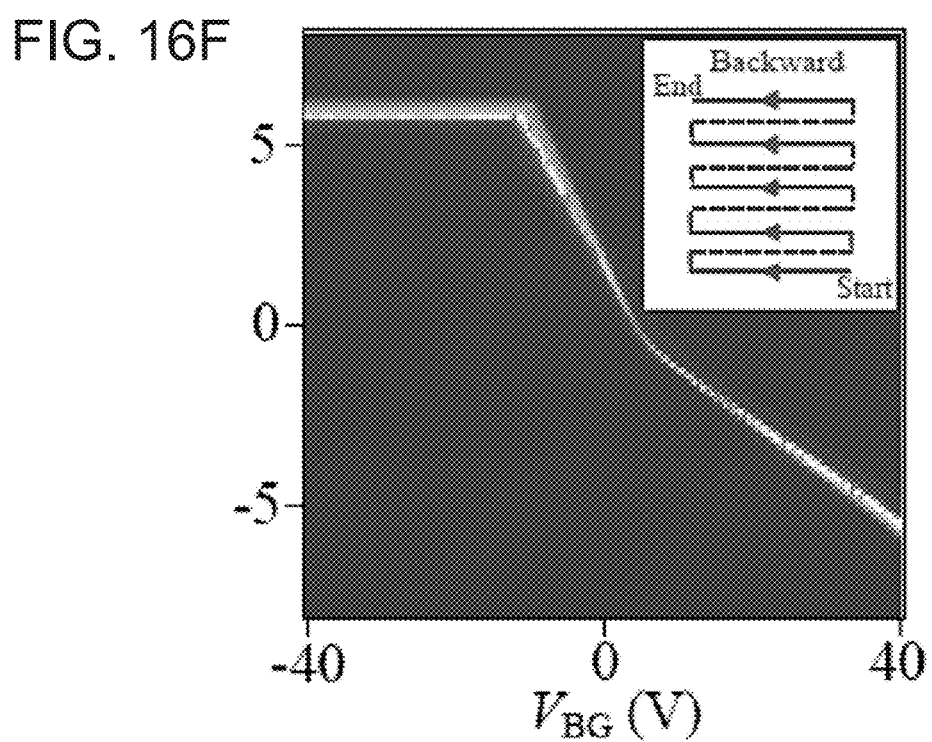

FIG. 16F shows the same measurements as FIGS. 16B and 16D, but for an even larger $V_{BG}$ range.

Figures 16G, 16H, 16I, 16J, 16K:
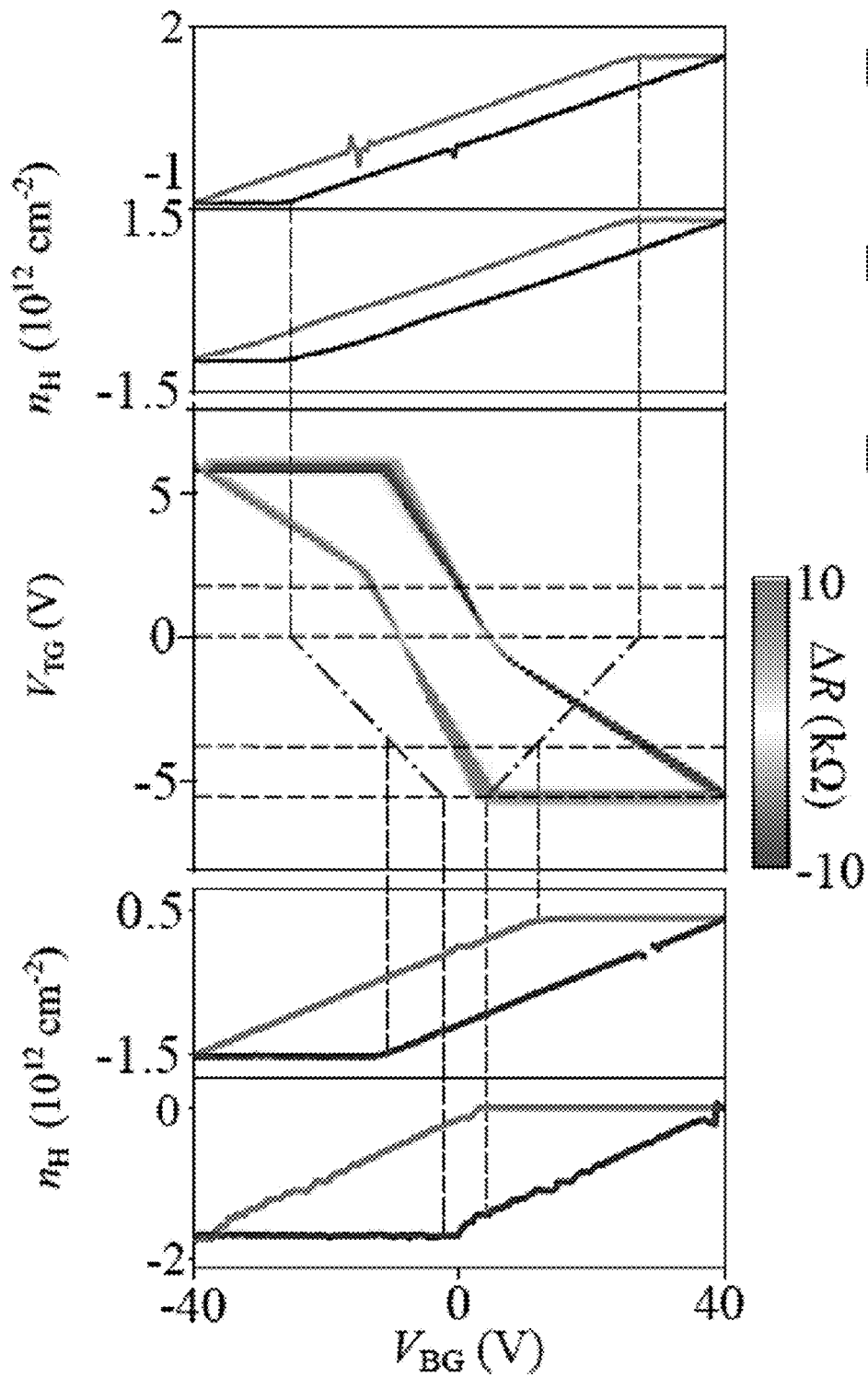

FIG. 16G shows Hall density along the connecting dashed lines in FIG. 16I.

FIG. 16H shows Hall density along the connecting dashed lines in FIG. 16I.

FIG. 16I shows the difference between FIGS. 16E and 16F.

FIG. 16J shows Hall density along the connecting dashed lines in FIG. 16I.

FIG. 16K shows Hall density along the connecting dashed lines in FIG. 16I.

Figure 17:
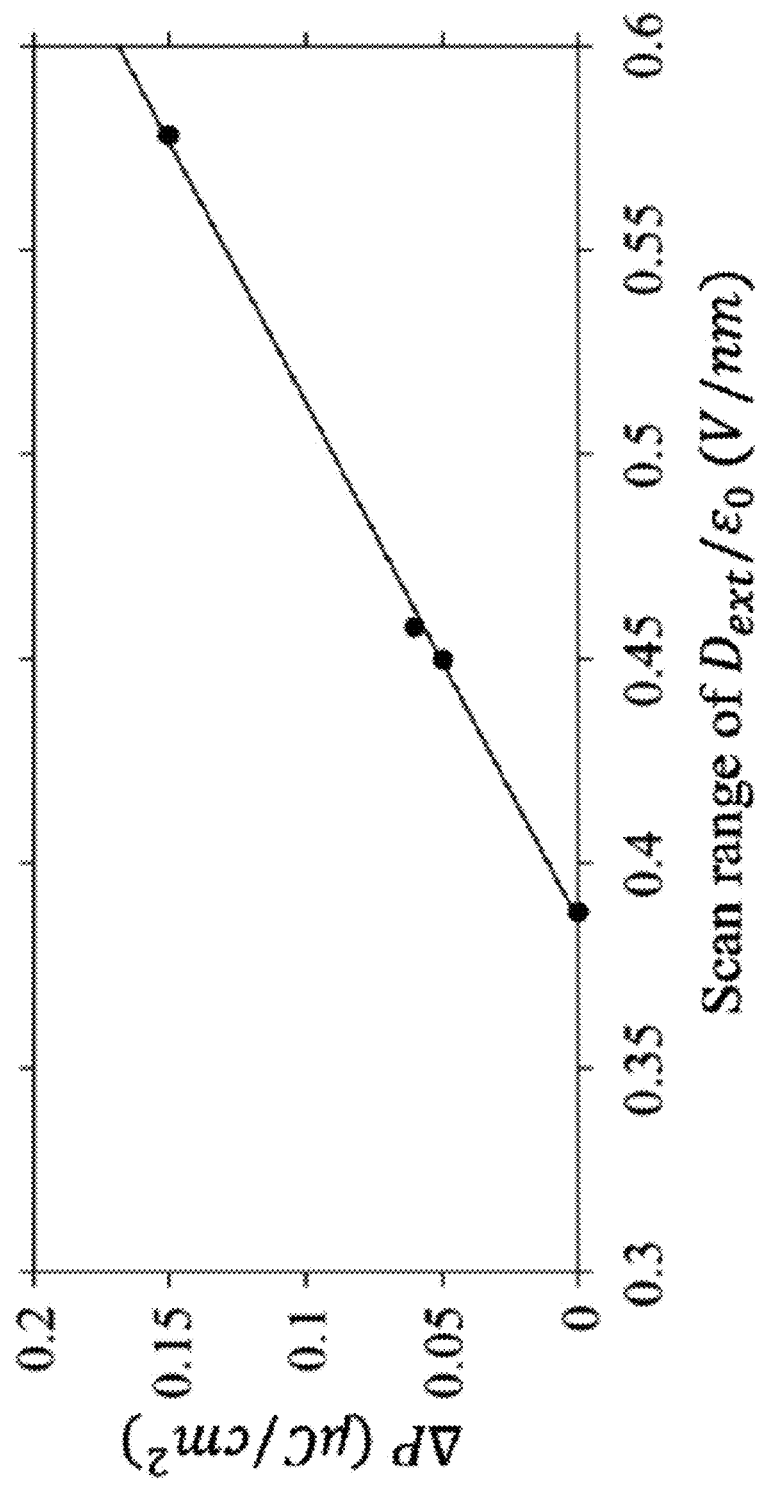

FIG. 17 shows ΔP vs. $D_{ext}$ scan range for device H4.

Figure 18B:
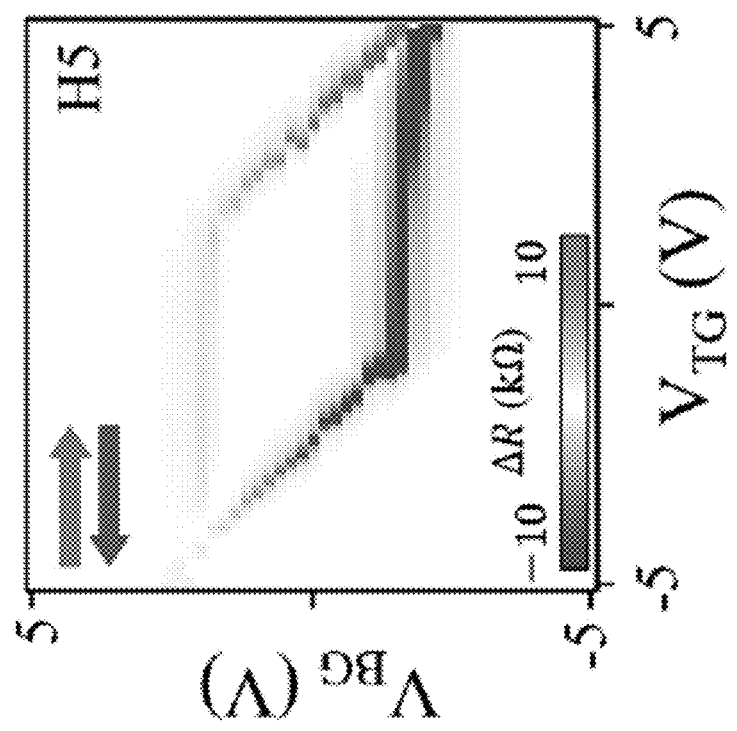
Figure 18A:
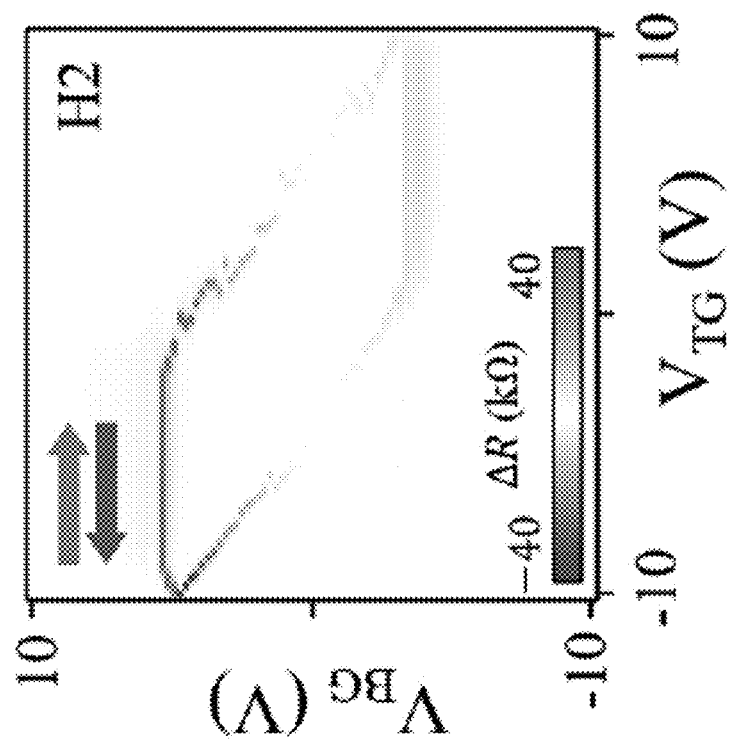

FIG. 18A shows a dual-gate map for device H2 with $V_{TG}$ as the fast scan axis.

FIG. 18B shows a dual-gate map for device H5 with $V_{TG}$ as the fast scan axis.

Figure 19B:
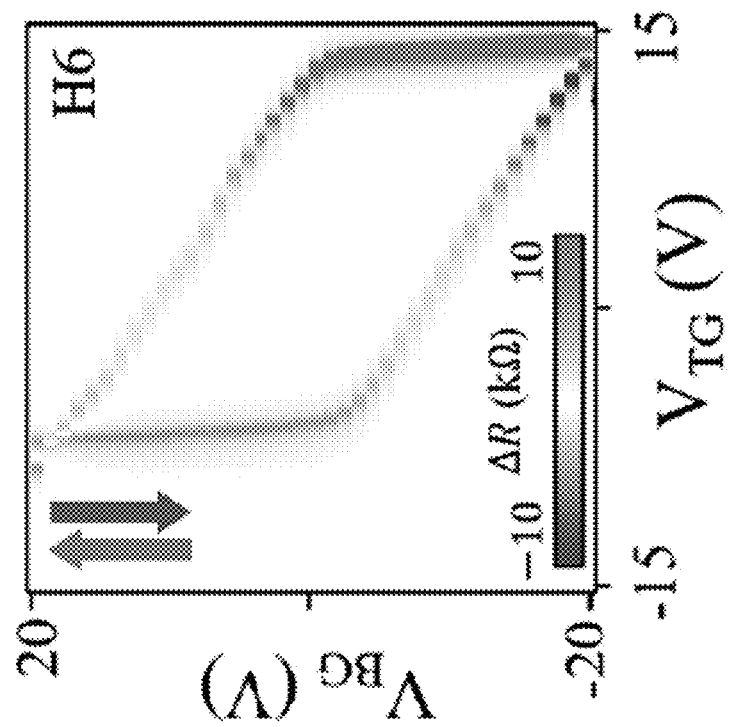
Figure 19A:
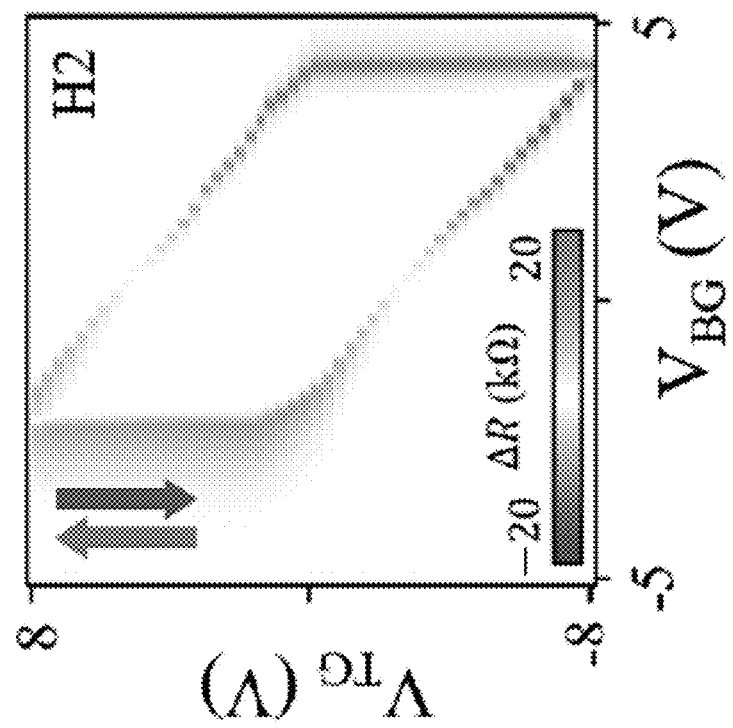

FIG. 19A shows a dual-gate map for device H2 with $V_{BG}$ as the fast scan axis.

FIG. 19B shows a dual-gate map for device H6 with $V_{TG}$ as the fast scan axis.

Figure 20A:
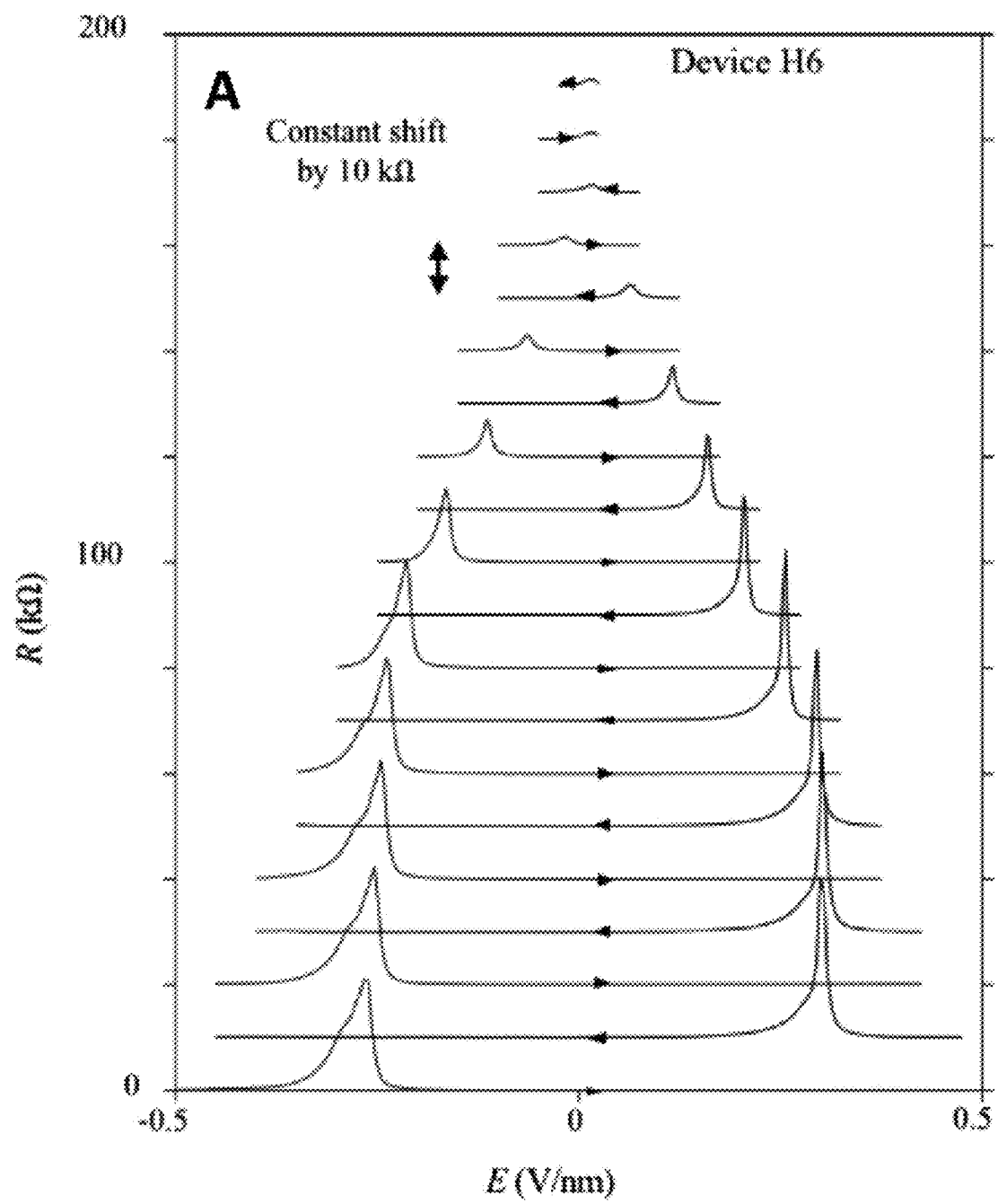

FIG. 20A shows consecutive scans (from bottom to top) of resistance vs. applied electric field for gradually reduced electric field ranges for device H6.

FIG. 20B shows an example applied voltage profile sequence applied to the bottom gate for writing different resistance states for device H6.

FIG. 20C shows an example applied voltage profile sequence applied to the top gate for writing different resistance states for device H6 in cooperative operation with the voltage profile in FIG. 20B.

FIG. 20D shows the read resistance states as a result of the voltage profiles applied in FIGS. 20B and 20C.

DETAILED DESCRIPTION

We disclose and realize a new class of highly tunable FeFET devices by engineering symmetry and charge correlations in the atomically thin two-dimensional (2D) van der Waals (vdW) materials. Particularly, bilayer graphene stacked uniquely with hexagonal BN (BN) forms a long-wavelength moiré superlattice. This bilayer graphene/BN stack can behave as a memory device, such as a memristor, up to room temperature through a ferroelectric-like domain switching process with gating. Without being bound by any particular theory, this resistive switching process may be due to a spontaneous electron transfer between the two layers of graphene, which are separated only by 3 Å, suggesting switching speeds as fast as 1 femtosecond. This small separation between the graphene layers makes this perhaps the thinnest memristor. Also, the memristor's resistance differs by more than one order of magnitude before and after switching (e.g., switching between 10Ω and 100 kΩ at low temperature and between 100Ω and 2 kΩ at room temperature), which is comparable to or better than other ferroelectric memristor devices.

Conventional memory devices rely on charge trapping by material defects or ionic movement. Inventive aspects include unconventional ferroelectric memristors that rely on electronic interactions. State switching is a result of intrinsic charge movement between the two layers of high-quality crystals that are separated by a 3 Å van der Waals gap. Therefore, the switching speed is exceptionally high, on the order of nanoseconds or femtoseconds.

Moreover, carbon-based memory could be a significant complement to rapid advances in carbon-based nano-electronics. Carbon materials are environment-friendly and CMOS- and bio-compatible. The high resilience of carbon to degradation and the intrinsic nature (no defect states involved) of the switching ensure its robustness and endurance. Indeed, carbon-based memristors show no sign of resistance drift after many cycles of switching.

The exceptional stability and high thermal conductivity of graphene and BN, together with the mechanism's intrinsic nature (no reliance on defects or impurities), ensure the robustness, endurance, and device-to-device stability.

Figure 1A:
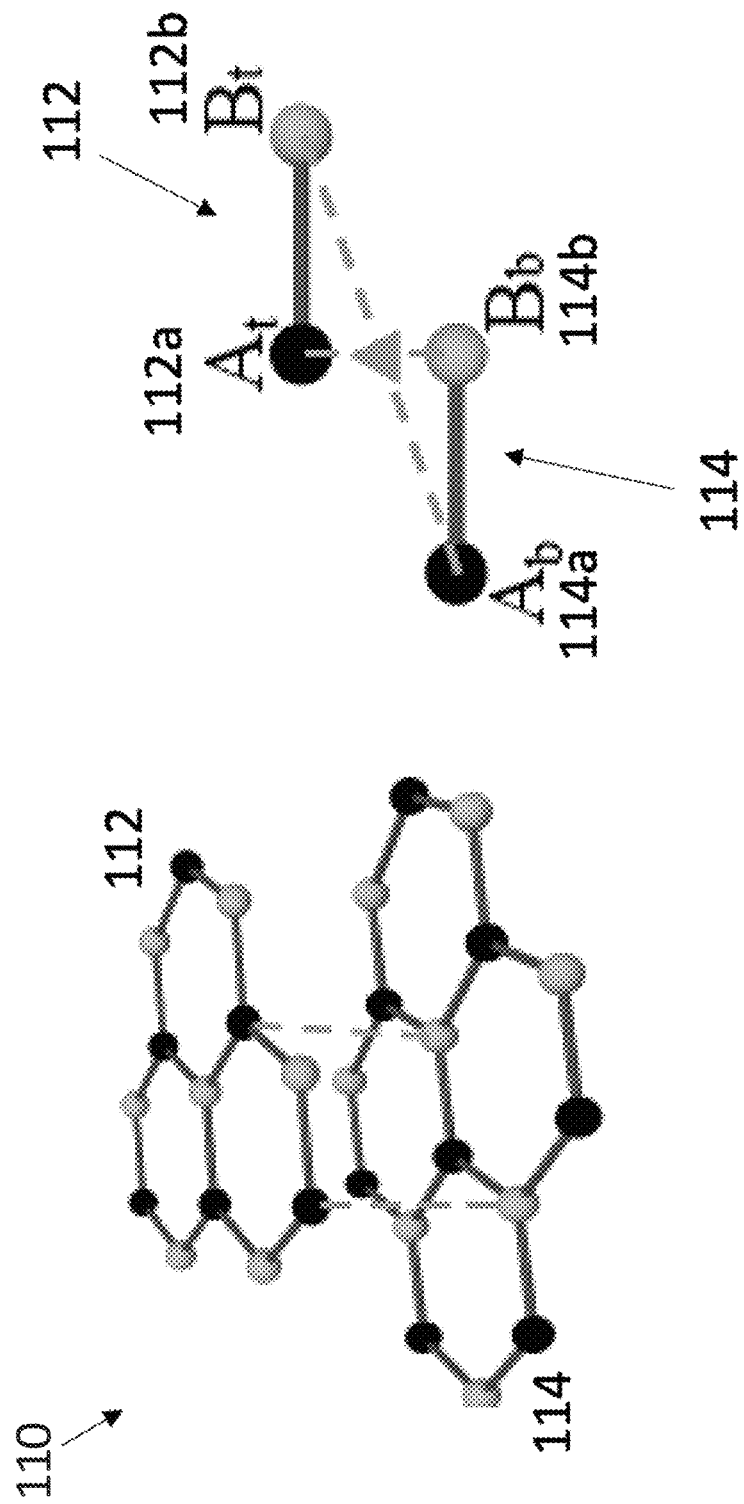
FIG. 1A shows the lattice structure of AB Bernal-stacked bilayer graphene.

Memristors for neuromorphic computing can be made from AB Bernal bilayer graphene (BLG) aligned with BN, a simple yet rich moiré system where electronic correlation, Berry phase, and point group symmetries (inversion symmetry) are simultaneously important. FIG. 1A shows the lattice structure of BLG. BLG crystalizes in a trigonal lattice with the space group P-3m1. The triangle marks its inversion center. The A sublattice of the top layer ($A_t$) sits directly above the B sublattice of the bottom layer ($B_b$). As such, the unit cell includes four atoms, which can be categorized into two inversion pairs: (1) $A_t$ and $B_b$ and (2) Ab and Bt. The space inversion symmetry is effectively equivalent to the layer degeneracy (here we focus on Ab and $B_t$ as they correspond to the low energy electronic states at the Fermi level).

The interplay between the top layer and bottom layer degrees of freedom in BLG leads to new electronic properties. In real space, the layer degeneracy means that electrons, irrespective of their energy and momentum eigenvalues, should occupy the top and bottom layers with equal probability. Therefore, the electron wavefunction includes equal weight superpositions of the two layers, e.g., $$\Psi = |A_b\rangle + e^{i\Theta} |B_t\rangle,$$

with $e^{i\Theta}$ characterizing the quantum-mechanical phase difference between the two layers.

Figure 1B:
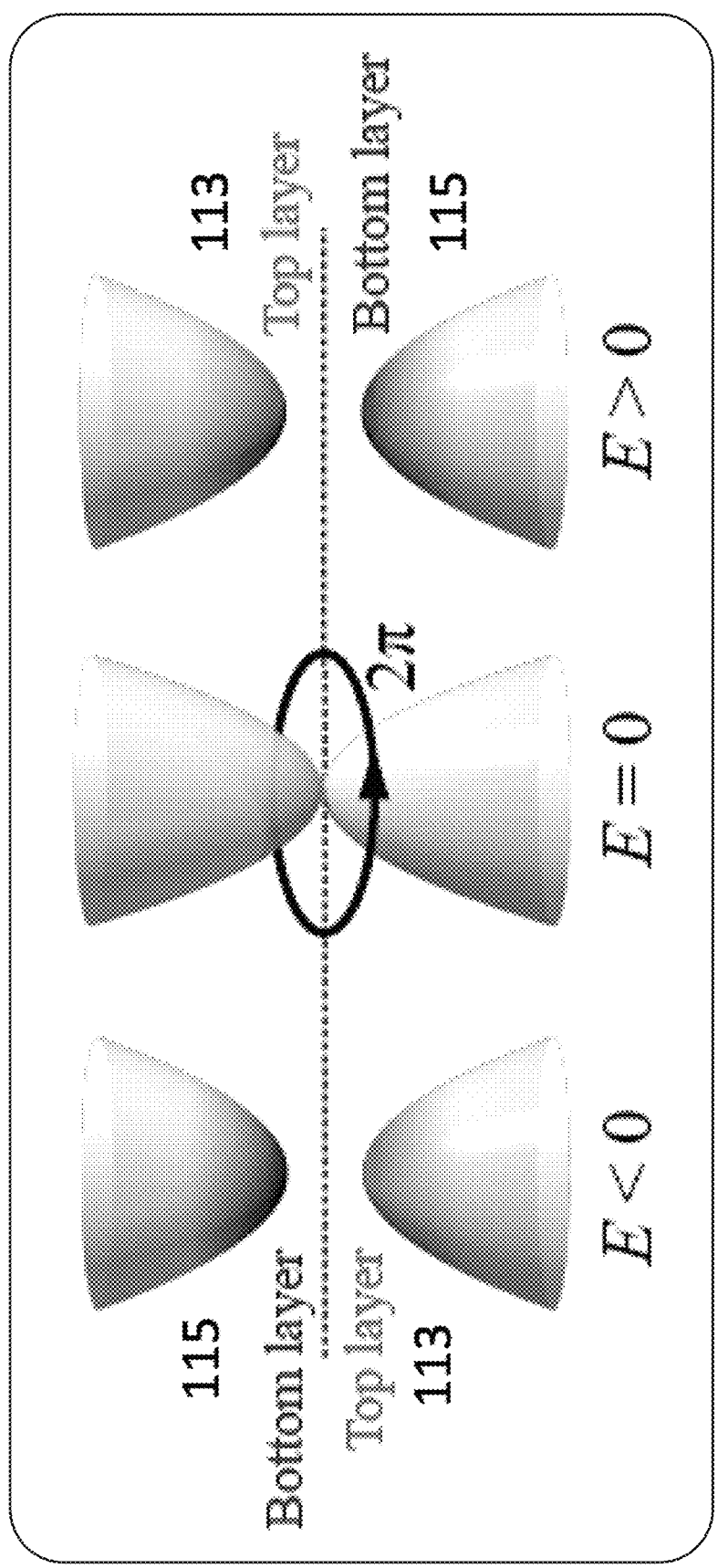
FIG. 1B is a schematic illustration of the band dispersion and layer polarization of the low-energy electron states of bilayer graphene at different external electric fields.

FIG. 1B shows a schematic illustration of the band dispersion and layer polarization of the low-energy electronic states of pristine bilayer graphene at different interlayer electric fields. The winding of the phase in momentum space gives rise to a chiral, quadratic band crossing at K(K') with a quantized Berry phase of 2π. The application of an external, out-of-plane electric field breaks the layer degeneracy, and therefore lifts up the band degeneracy at K(K'). As a result, the wavefunction picks up a layer polarization, especially near the gap edges, as shown in FIG. 1B. The variation of layer polarization in momentum space "bends" the geometry of the quantum wavefunction. This Berry curvature is the root for the topological valley transport as well as chiral optical and excitonic properties in bilayer graphene.

Because of these unique electronic structures, particularly the vanishing density of states and the quadratic band touching, theory predicts a wide range of spontaneous electronic order in pristine bilayer graphene. Under high magnetic fields at very low temperatures, experiments have revealed a number of symmetry-breaking phases in the Landau levels. On the other hand, in the absence of magnetic field, other experimental results suggest electronic correlation, but the effects remain relatively subtle even at very low temperatures with ultra-high-quality samples and their exact nature remains unsettled. Here, we put chiral, quadratic gapless fermions that are protected by the layer degeneracy onto a moiré superlattice potential. The resulting system exhibits unconventional ferroelectricity.

Figures 1C, 1D:
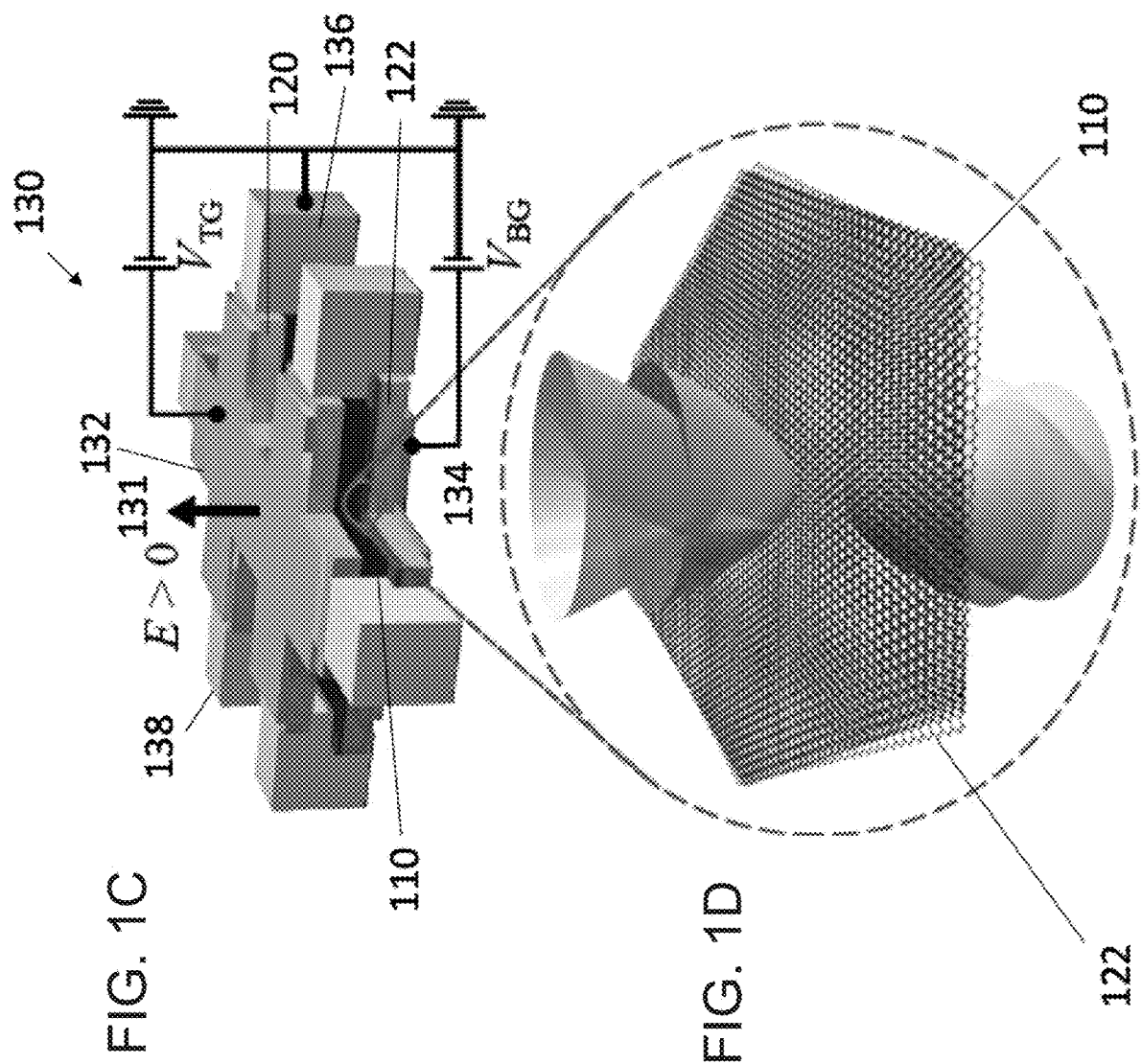
FIG. 1C shows a hexagonal boron nitride (BN)-encapsulated bilayer graphene memristor.
FIG. 1D shows the bilayer-BN moiré superlattice pattern in the BN-encapsulated bilayer graphene memristor of FIG. 1C. One-sided alignment is shown with an enlarged lattice mismatch for clarity.

FIGS. 1C and 1D show an example dual-gated memristive device 130, or memristor, made from BLG 110 sandwiched between a pair of BN substrates 120 and 122. The device has at least four electrodes: a top electrode 132 on top of the upper BN substrate 120 as the top gate ($V_{TG}$), two electrodes 136 and 138 in contact with the BLG 110 to measure its conductance and also to connect BLG 110 with ground, and a bottom electrode 134 directly below the lower BN substrate 122 as the bottom gate ($V_{BG}$). The top and bottom BN layers 120 and 122 in device 130 each have a thickness between about 5 nm and about 100 nm (e.g., between about 10 nm and about 55 nm). The top and bottom gates 132 and 134 can be any conductive metal or graphite. The top and bottom gates 132 and 134 can be used to adjust the electrical potentials between the top and bottom layers of graphene in the BLG 110. The black arrow 131 in FIG. 1C indicates the orientation of the electric field vector. Device 130 may be constructed on any flat substrate, such as silicon or polydimethylsiloxane (PDMS). PDMS is soft and may be used in a flexible wearable device.

The dual-gated memristor 130 allows independent tuning of the externally applied charge density, $n_{ext}$, and the out-of-plane displacement field, $D_{ext}$, through control of the voltages of the top and bottom gates 132 and 134. Several geometries of dual-gated devices can be used. For example, the dual-gated device can have a Hall bar geometry or a flower-shaped geometry. In the flower-shape geometry, the device includes a round disk with many contacts extending out from the center. The device 130 can be volatile or non-volatile. Other device architectures can be used. For example, any common commercially available transistor-like device architecture can be used as long as the architecture allows an electric field to be applied to the memristor.

Other materials and device structures can be used in the memristive device 130 to realize correlation-driven unconventional ferroelectricity. FIGS. 1E-1G show different example configurations of devices with unconventional ferroelectricity. FIG. 1E shows a device 1002 with BLG 110 between top and bottom BN layers 120 and 122. FIG. 1F shows a device 1003 with BLG 110 between top and bottom graphite 124 and 126. FIG. 1G shows a device 1004 with a bilayer transition metal dichalcogenide (TMD) 1010 between top and bottom layers of TMD 128 and 129.

As shown in FIGS. 1E-1G, other bilayer materials may be used instead of BLG 110, such as a bilayer TMD 1010. Other layered materials may be used instead of BN layers 120 and 122 to sandwich the bilayer material 110 or 1010, including graphite 124 and 126, or a TMD 128 and 129. The graphite 124 and 126 can be monolayer, bilayer, trilayer, or more layers. The bilayer TMD 1010 and/or the encapsulating TMD layers 128 and 129 can be, for example, $MoS_2$, $MoSe_2$, $WS_2$, $WSe_2$, or another TMD. The top and bottom TMD layers 128 and 129 can be the same compound as the bilayer or a different compound. The top and bottom layered materials can be the same material or different materials.

In each device with unconventional ferroelectricity, at least one, and preferably both, of the top and bottom layered materials (e.g. BN layers 120 and 122) forms a long-range moiré pattern with the adjacent layer of the bilayer (e.g. BLG 110). To form a long-range moiré pattern, the two materials should have similar lattice constants. Stacking two materials with very different lattice constants, for example, graphene (a=2.46 Å) and $MoS_2$ (a=3.15 Å), may not form a suitable long-range moiré pattern. Stacking two materials with slightly different lattice constants, for example, graphene and BN (a=2.50 Å), may form a long-range moiré pattern, even when lattice vectors of the two layers form an angle of 0°. The lattice vector of one of the layers may be rotated or twisted relative to the lattice vector of the other layer to an angle in a range of about −5° to about +5° (clockwise or counterclockwise) to form a different long-range moiré pattern. If both the top and bottom layered materials (e.g. BN layers 120 and 122) form long-range moiré patterns in the device, the long-range moiré patterns can be different. Device performance can be tuned by tuning the periodicities of the moiré patterns.

For example, the top layer of the bilayer may form a moiré pattern (moiré 1) with the adjacent top layered material and the bottom layer of the bilayer may form a moiré pattern (moiré 2) with the adjacent bottom layered material. In each of these devices, the top layer may be rotated by a small lattice vector rotational angle $\theta_1$ (clockwise or counterclockwise) relative to the middle bilayer material. The bottom layer may also be rotated by a lattice vector rotational angle $\theta_2$ (clockwise or counterclockwise) relative to the bilayer material, and $\theta_1 \neq \theta_2$.

FIG. 1D shows a long wavelength moiré superlattice pattern formed by the BLG 110 and one of the BN layers 122. The lattice mismatch between BLG 110 and BN 122 is enlarged for clarity. Long wavelength moiré patterning results from lattice mismatch between BLG 110 and BN layer 120 and/or 122. Alternatively, or in addition to lattice mismatch, rotating a BN layer 120 and/or 122 with respect to the BLG 110 about the surface normal of the BLG 110 can affect the resulting moiré pattern. Each BN layer 120 and 122 can form a separate moiré superlattice pattern with BLG 110. Each rotational angle between a lattice vector of the BLG 110 and the lattice vectors of each BN layer 120 and 122 are considered in device 130. These lattice vector rotation angles may affect the long wavelength moiré superlattice patterns that may contribute to the unconventional ferroelectricity in device 130.

Because BN and graphene have hexagonal lattices but different lattice constants, the superposed BN 120 and 122 and BLG 110 form moiré patterns when viewed along the surface normal/electric field vector. The lattice vector rotation angle, also called a twist or twist angle, between the BN and BLG changes the period of the moiré pattern, with a smaller lattice vector rotation angle or twist angle (within about 0° to about 35°) producing a longer period. By engineering the twist angles between the top moiré (formed by top BN 120 and top layer of graphene in BLG 110) and bottom moiré (formed by bottom BN 122 and bottom layer of graphene in BLG 110), we can break the layer symmetry of the BLG 110, which gives rise to the ferroelectric properties described below.

The twist angle between the BN 120 and/or 122 and the BLG 110 affects the coupling between the BN 120 or 122 and the BLG 110 by changing the period of the moiré pattern. Generally, smaller twist angles (e.g., angles less than about 1°) give better device performance. Memristive device 130 shows unconventional ferroelectric properties when a rotational angle between one of the BN layers 120 or 122 and the BLG 110 is between about 0° and about 35°. Particularly, the rotational angle between one of the BN layers 120 and 122 and the BLG 110 is about 0° to about 5°, or about 28° to about 32°. Specifically, memristive devices with rotational angles between BN 120 and/or 122 and BLG 110 of about 0° to about 1°, or about 29° to about 31° showed superior ferroelectric performance. The twist or rotational angle between the upper BN layer 120 and the BLG 110 is different than the twist or rotational angle between the lower BN layer 122 and the BLG 110.

The device 130 can be constructed so that a rotational angle between one of the BN layers 120 or 122 and BLG 110 is between about 0° and about 5°. Alternatively, the device 130 is constructed so that rotational angles between both BN layers 120 and 122 and the BLG 110 are between about 0° and about 5°. Alternatively, the device 130 can be constructed so that a rotational angle between one BN layer 120 or 122 and BLG 110 is between 0° and 5° and the other BN layer 120 or 122 and BLG 110 is between 28° and 32°.

The device 130 can be compared to a device where the layers are not aligned. Here not aligned means BN layers 120 and 122 are offset along the surface normal of the BLG 110 with respect to BLG 110 and/or the rotational angle between lattice vectors of both BN layers 120 or 122 and the lattice vector of BLG 110 is greater than about 5°.

Figure 1H:
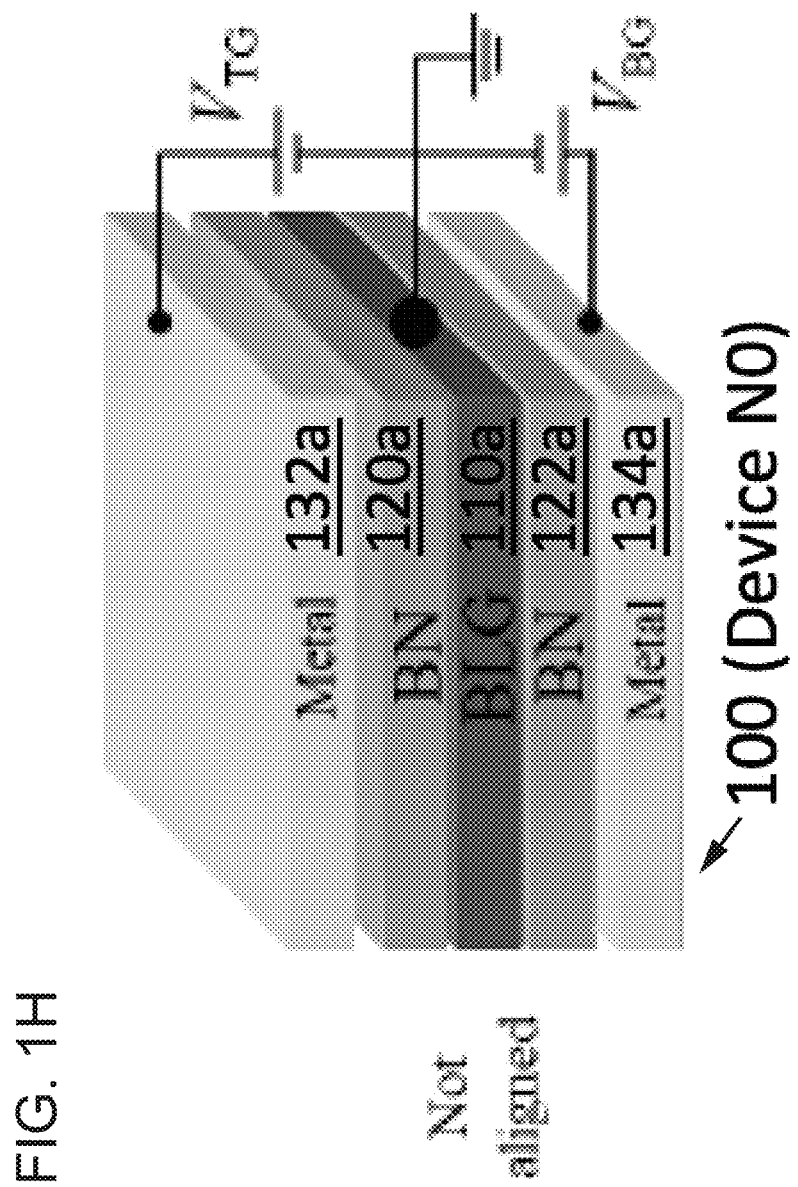
FIG. 1H is a schematic for conventional bilayer graphene device N0.
Figure 1I:
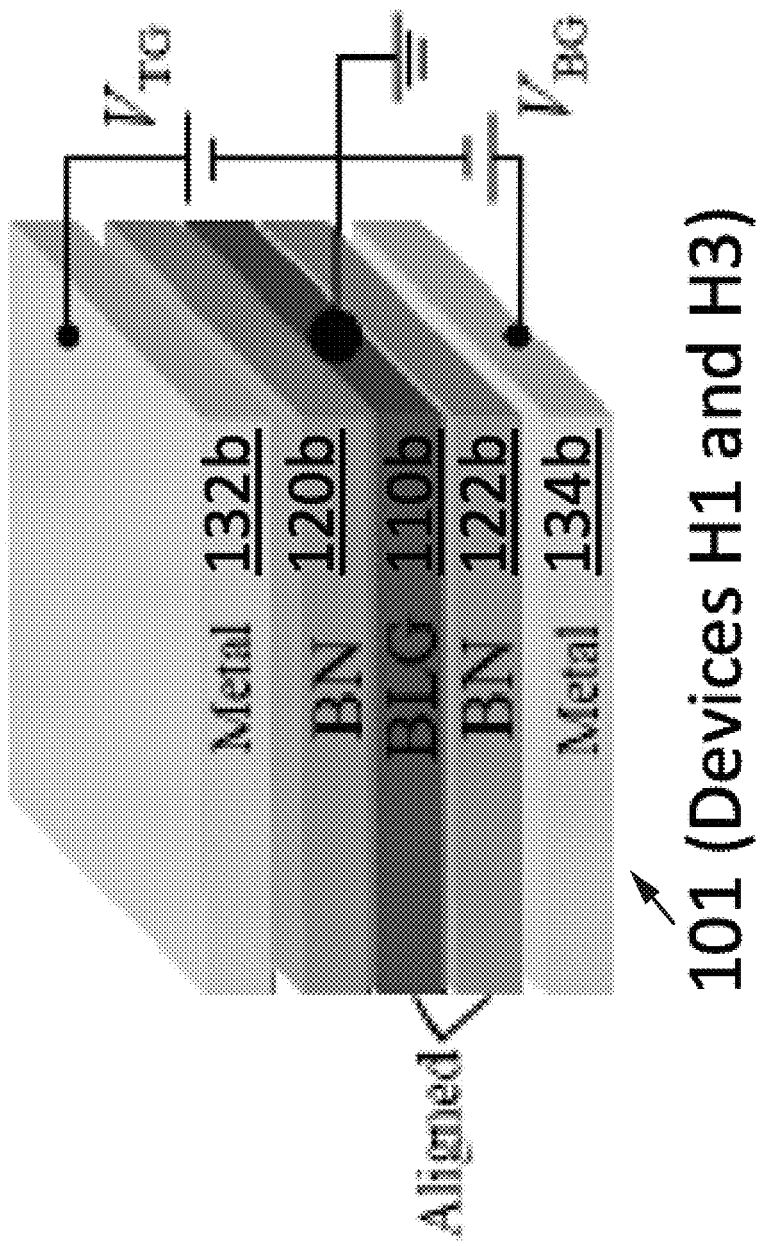
FIG. 1I is a schematic for devices H1 or H3, which each have one BN layer rotationally aligned with the bilayer graphene.
Figure 1J:
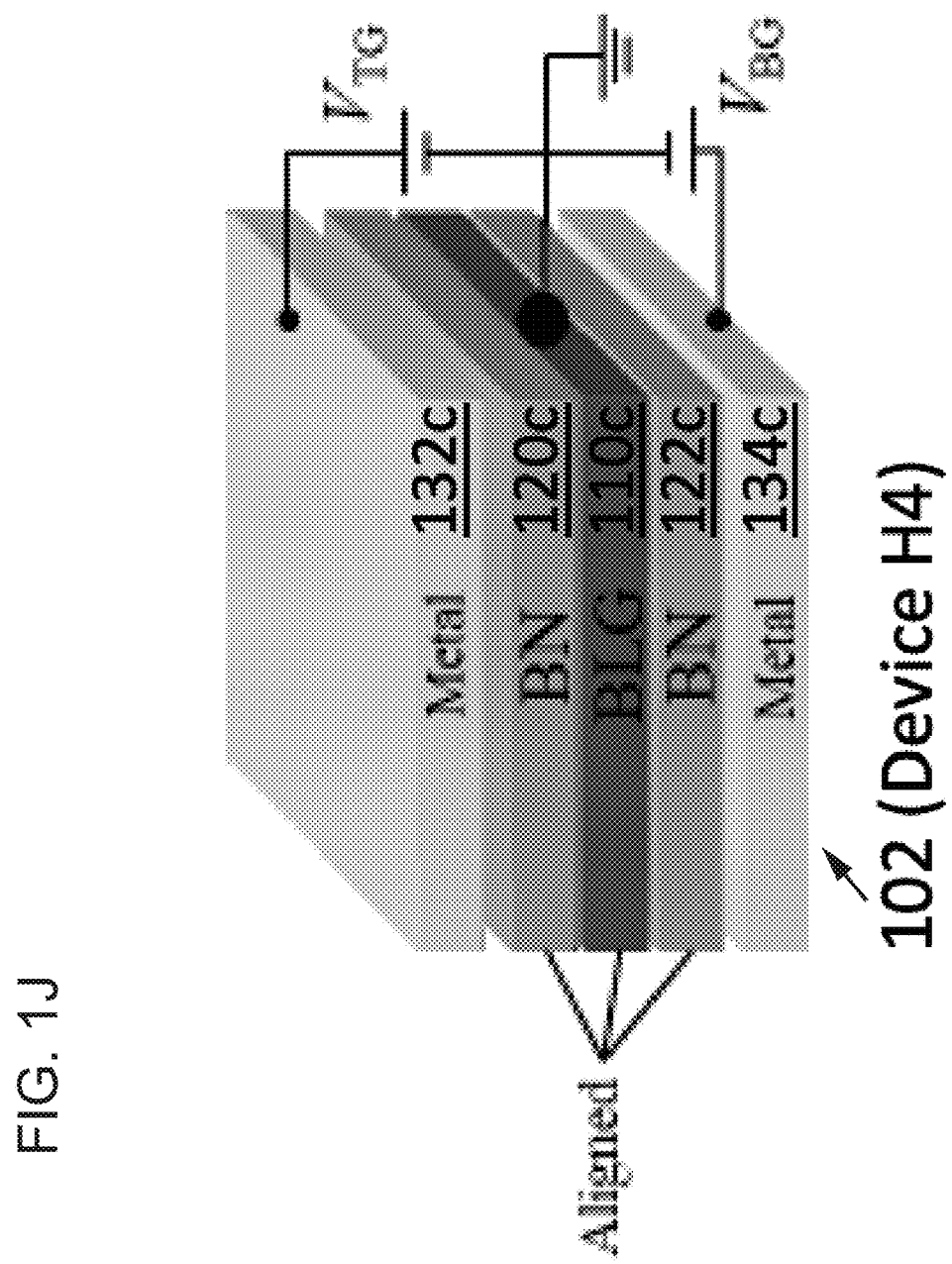
FIG. 1J is a schematic for devices H2 or H4, which each have two BN layers rotationally aligned with the bilayer graphene.

FIGS. 1H-1J are schematics showing three different layer stacking configurations. FIG. 1H shows layer stacking of a device configuration 100, where both BN layers 120a and 122a and BLG 110a are not aligned. The device configuration 100 in FIG. 1H is used as a comparison device N0, as described later in this specification, because it does not exhibit ferroelectric behavior. The rotational angles between BN 120a and BLG 110a and BN122a and BLG 110a are both greater than about 5°. FIG. 1I shows layer stacking of device configuration 101, where the rotational angle between BN 122b and BLG 110b are between about 0° and about 5°. BN 120b in device configuration 101 is not aligned with BLG 110b. Device configuration 101 is used for devices H1 and H3 described later in the specification and has some ferroelectric behavior. FIG. 1J shows layer stacking of device configuration 102, where the rotational or twist angles between BN 120c and BLG 110c, and between BN 122c and BLG 110c are between about 0° and about 5°. Device configuration 102 is used for device H4 described later in the specification and has exceptional ferroelectric behavior.

FIGS. 1K-1L show layer rotational angle alignment configurations that give rise to moiré patterns with exceptional ferroelectric properties. FIG. 1K shows a configuration where BN 120c has a rotational angle with respect to graphene layer 112c in BLG 110 between about 0° and about 1°. Similarly, in this configuration, BN 122c has a rotational angle with respect to graphene layer 113c in BLG 110 between about 0° and about 1°. BN layer 120c has a slightly different angle (<1°) than 122c. This configuration is used for device H4 discussed below and can result in a device with non-volatile memory. FIG. 1L shows a configuration where BN layer 120d has a rotational angle with respect to graphene layer 112d in BLG 110 between about 0° and about 1°. The other BN layer 122d in this configuration has a rotational angle with respect to graphene layer 112d in BLG 110 between about 29° and about 32°. This configuration is used for device H2 discussed below and can result in volatile memory.

Figure 1Q:
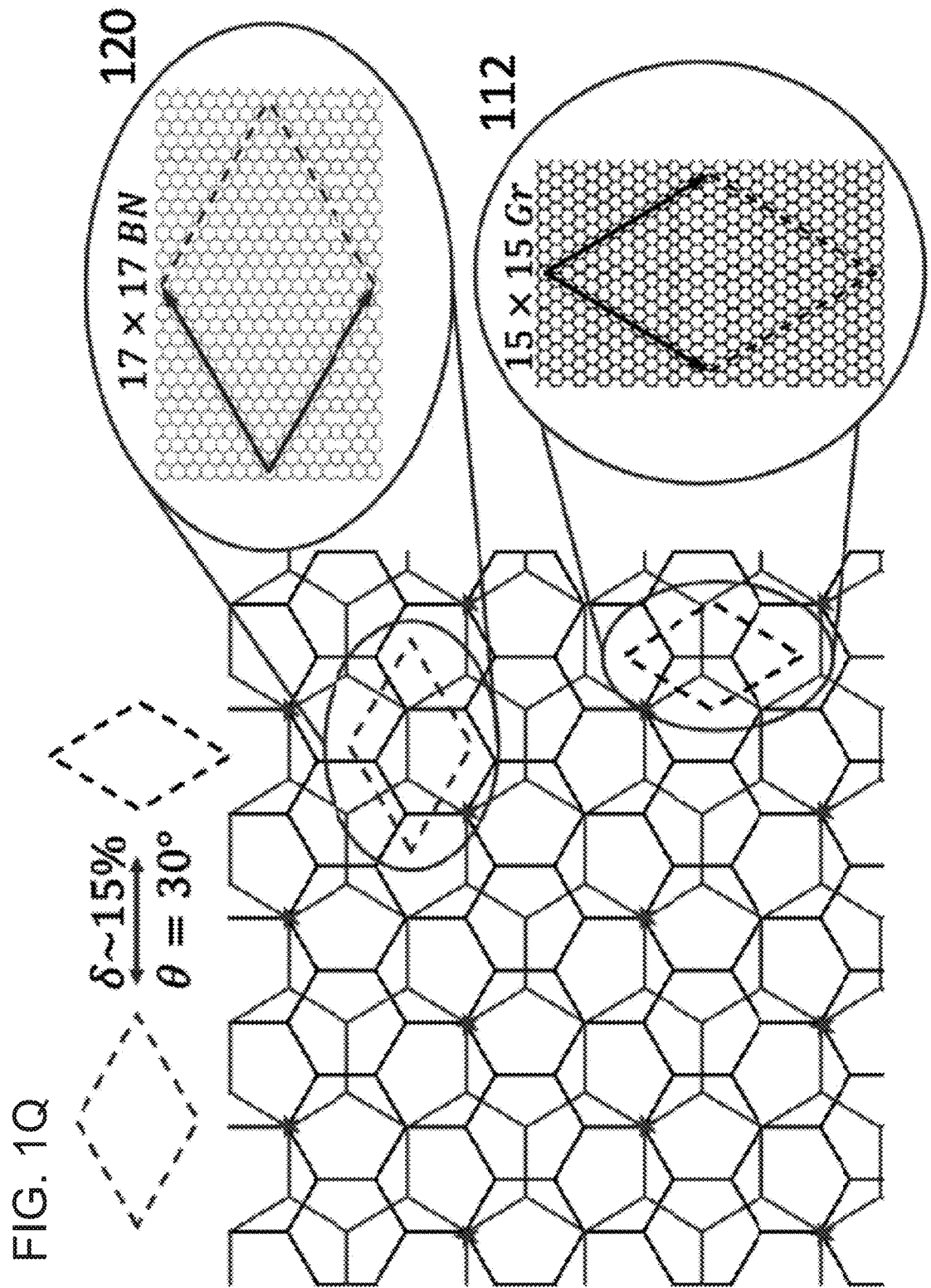
FIG. 1Q is a schematic of a second-order moiré pattern formed between a 15×15 graphene supercell and a 17×17 BN supercell.

FIGS. 1M-1P show moiré patterns for two honeycomb lattices with different amounts of lattice mismatch $\delta$ and rotational alignment angle $\theta$. As shown in FIGS. 1M and 1N, the wavelength of a long wavelength moiré pattern is longer when the lattice mismatch $\delta$ is smaller. By contrast, at $\theta=30°$ in FIGS. 1O and 1P, the wavelength of a long wavelength moiré pattern is longer when the lattice mismatch $\delta$ is large. In the case of graphene and BN, the lattice mismatch is small (~1.8%). This small number refers to the mismatch between a single graphene unit cell and a single BN unit cell. However, because of lattice periodicity, one can also consider the mismatch between M unit cells of graphene and N unit cells of BN. Indeed, we found a large mismatch of $\delta$ ~15% between a 15×15 graphene supercell and a 17×17 BN supercell (FIG. 1Q), which leads to a moiré pattern with periodicity of 7.5 nm at $\theta=30°$. Because the large mismatch was achieved by supercells from each layer, this moiré pattern is also referred to as the second-order moiré pattern. Interestingly, we only found a long-wavelength second-order moiré pattern at $\theta=30°$, but not at $\theta=0°$ and $\theta=20°$.

In devices where the BLG is aligned with one BN flake at $\theta \sim 0°$ and with the other BN flake at $\theta \sim 30°$ (e.g., Device H2 discussed below), the BLG may form a first-order long-range moiré pattern with one BN flake and a second-order long-range moiré pattern with the other BN flake. Noticeably, these two moirés had similar wavelengths. In terms of the electronic band structure, the second-order moiré pattern may in general create band folding and moiré sub-bands in a similar but potentially weaker fashion as the first-order moiré.

Figure 1R:
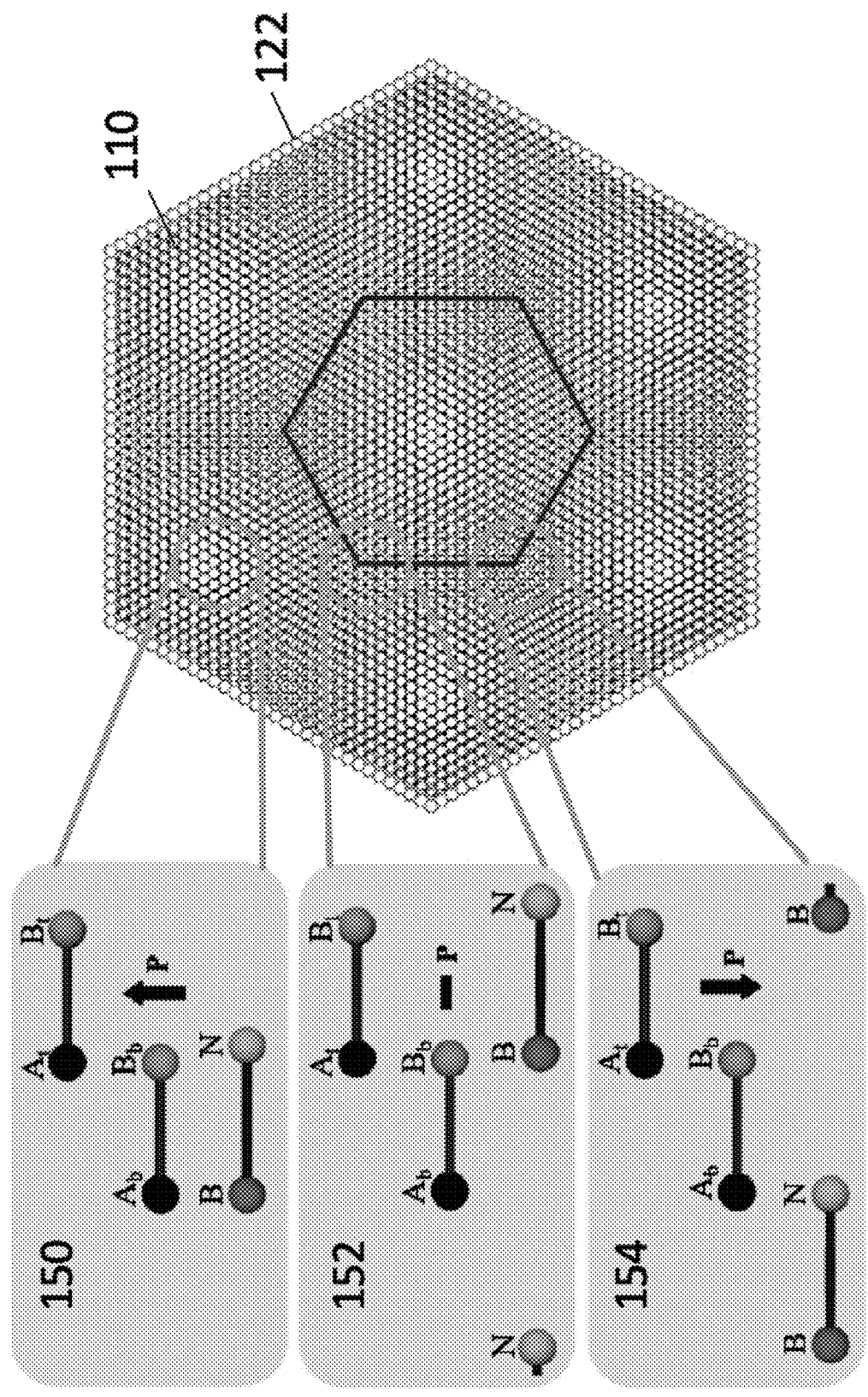
FIG. 1R shows moiré patterns formed by bilayer graphene and a BN layer with enhanced lattice mismatch for illustration purposes, showing three different local alignment configurations between the bilayer graphene and the BN layer corresponding to upward, zero, and downward polarizations.

The right side of FIG. 1R shows the moiré pattern formed by a layer configuration including BLG 110 rotationally aligned with one of the BN layers 122 at a rotational angle of 0°. FIG. 1R also shows three possible local lattice alignment configurations between BLG 110 and the BN layer 122. Lattice mismatch in the moiré pattern is enhanced for illustration purpose. The local lattice alignment configurations shown in FIG. 1R illustrate distinct local polarizations that may be present in this layer configuration. Although locally the lattice stacking can correspond to polarization up or down, globally such polarization is averaged out by the moiré pattern.

The left side of FIG. 1R shows how boron and nitrogen atoms in BN 122 may be vertically aligned with carbon atoms in BLG 110 in an aligned moiré configuration. Because the low energy quadratic band touching arises from the $A_b$ and $B_t$ orbitals, local polarization depends on how the boron and nitrogen atoms from the BN 122 affect the electrostatic potential of the $A_b$ site. Alignment 150 shows the $A_b$ site vertically aligned with a boron site, corresponding to an electrical polarization pointing up. Alignment 152 shows the $A_b$ site aligned with an empty site, corresponding to a nearly zero electrical polarization. Alignment 154 shows the $A_b$ site vertically aligned with a nitrogen site, corresponding to an electrical polarization pointing down. Though local polarization may exist, these local polarization directions are distributed periodically across the moiré pattern, meaning that the potential provided by the BN 122 oscillates across the superlattice unit cell, leading to a spatially averaged cancellation of polarization.

Figure 1S:
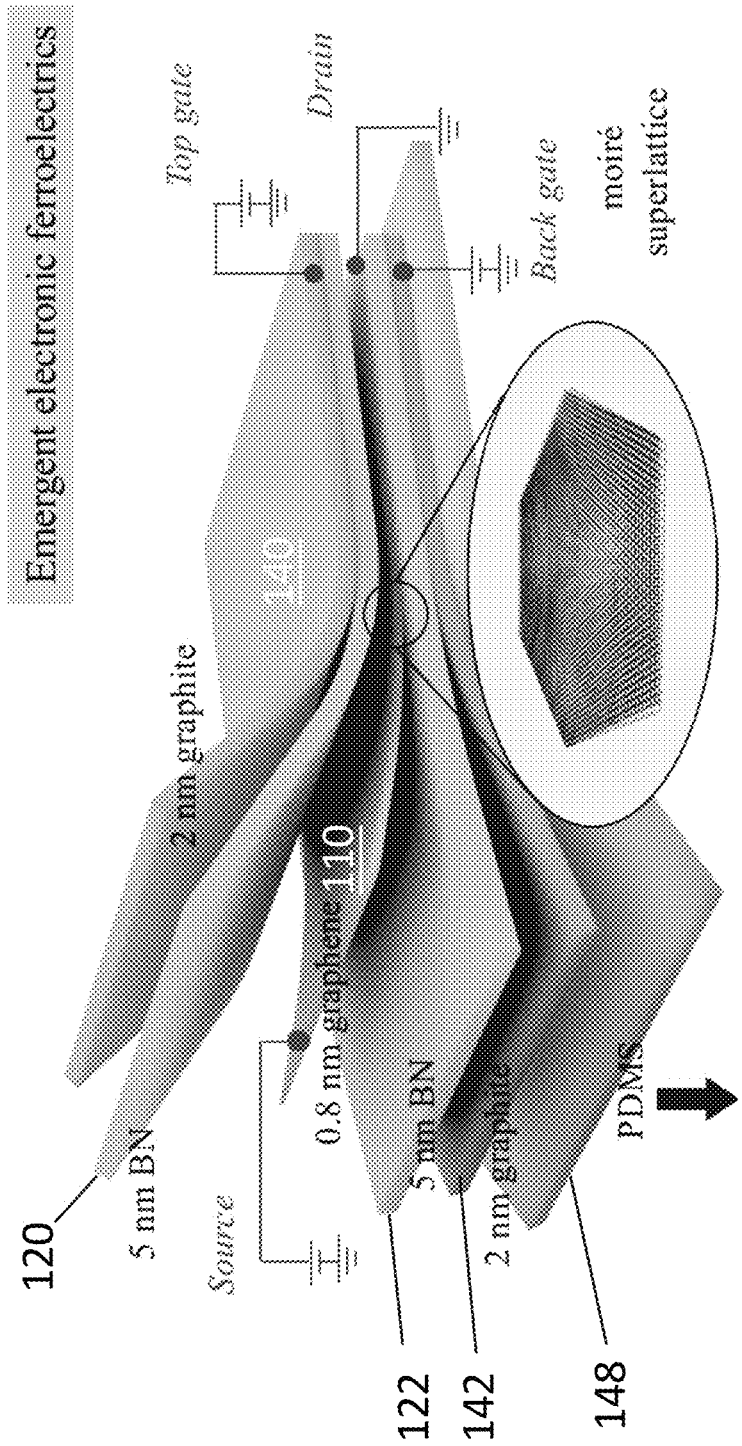
FIG. 1S shows layer stacking of a device with bilayer graphene sandwiched between two BN layers on a PDMS substrate.
Figure 1U:
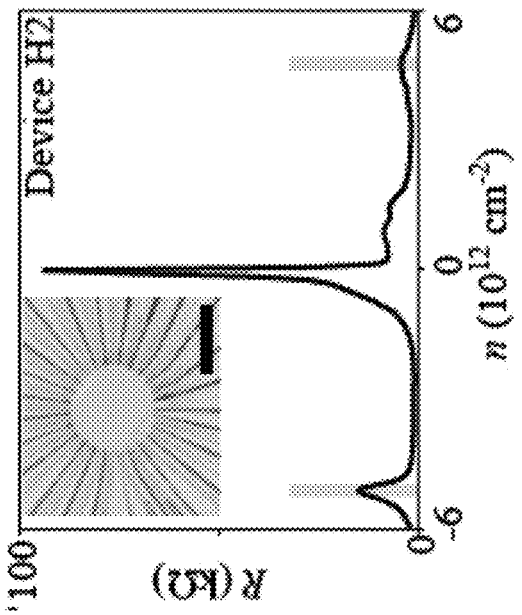
FIG. 1U shows four-probe resistance as a function of carrier density for hysteretic device H2. The inset is an optical image of the device H2.
Figure 1W:
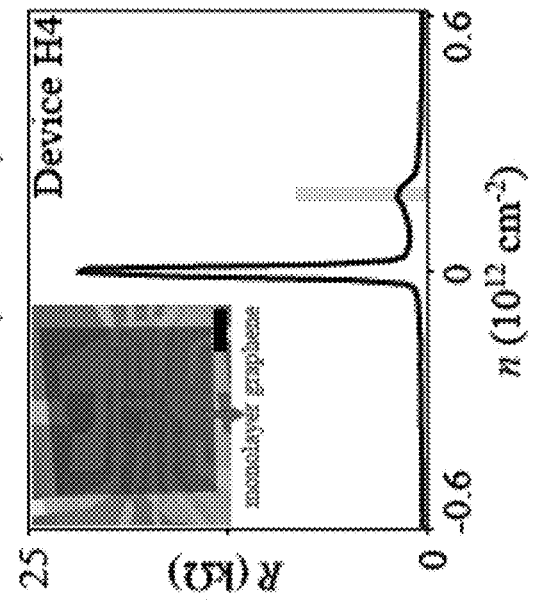
FIG. 1W shows four-probe resistance as a function of carrier density for hysteretic device H4. The inset is an optical image of the device H4.
Figure 1T:
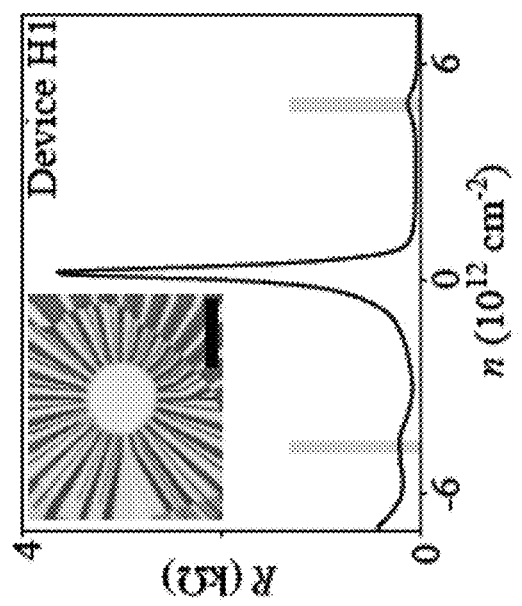
FIG. 1T shows four-probe resistance as a function of carrier density for hysteretic device H1. The inset is an optical image of the device H1.
Figure 1V:
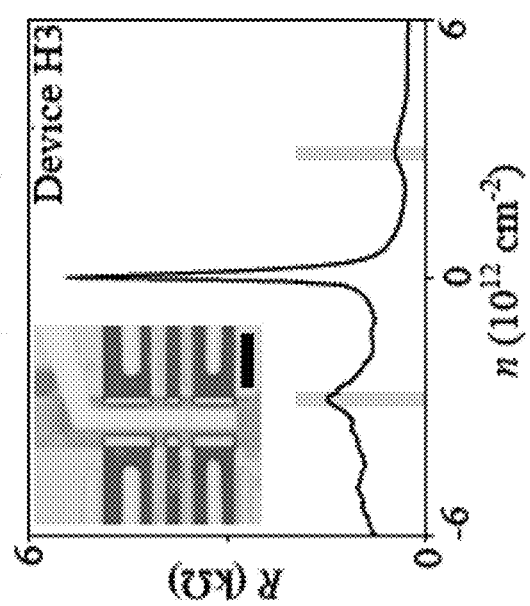
FIG. 1V shows four-probe resistance as a function of carrier density for hysteretic device H3. The inset is an optical image of the device H3.

FIG. 1S shows an example of the layer stacking in device 130. The device 130 may be disposed on a polydimethylsiloxane (PDMS) substrate. A PDMS is flexible, stretchable, and biocompatible. This device is carbon-based, ultra-thin, flexible, and lightweight. With a flexible and stretchable substrate, such as PDMS, the memristor may be used in a wearable or flexible device.

Dual-Gated Bernal-Stacked Bilayer Graphene (BLG) Memristive Devices

We made four high-quality, BN-encapsulated, dual-gated memristive devices H1-H4 with different geometries and gating configurations. These devices were compared to device N0, which has conventional non-ferroelectric bilayer graphene behavior, to a device made with ABA trilayer graphene (TLG), and to a device made with monolayer graphene (MLG). The BLG was not rotationally aligned with the BN layers in device N0, and therefore did not exhibit ferroelectric behavior. In this specification, we use M for monolayer, N for non-ferroelectric bilayer, T for trilayer, and H for hysteretic devices that showed ferroelectric behavior. Depending on device construction, hysteretic devices can be volatile or non-volatile. Device M1 with MLG in place of BLG was constructed with both BN layers rotationally aligned with the MLG. Device T1 with TLG in place of BLG was constructed with only one BN layer rotationally aligned with the TLG.

FIGS. 1H-1J are schematics showing the stacking configurations and alignment in devices N0 and H1-H4. FIG. 1H is a schematic of device N0 100, where none of the layers are intentionally aligned and the device N0 does not exhibit ferroelectric behavior. FIG. 1I is a schematic of devices H1 and H3 101, where only one of the BN layers 122b is rotationally aligned with the bilayer graphene 110 at a twist angle of about 0° to about 5°. FIG. 1J is a schematic of device H4 102, where both BN layers 120c and 122c are rotationally aligned with the bilayer graphene 110 at a twist angle of about 0° to about 5°. Device H2 similarly had both BN layers rotationally aligned with the bilayer graphene, but, unlike device H4, one of the BN layers in device H2 was aligned at a twist angle of about 28° to about 32° relative to the BLG.

To make each device, we exfoliated graphene and BN flakes on $SiO_2$/Si chips. Then high-quality bilayer graphene was identified using Raman spectroscopy. BN flakes with suitable thicknesses (between 10 to 50 nm) were chosen based on optical contrast and later measured by atomic force microscopy. The thickness of the BN changes its optical contrast. For example, BN with a 10 nm thickness may appear light blue, while a BN with a 50 nm thickness may appear green. In addition, we chose graphene and BN flakes with long and straight edges, which may correspond to one of the crystallographic axes (armchair or zigzag). The straight edges were used as a guide for rotational alignment between different flakes. The bottom BN 122, graphene 110, and the top BN flake 120 were stacked together and transferred onto pre-patterned metal bottom gates 134 through the standard dry-transfer technique using a polydimethylsiloxane (PDMS)/poly(bisphenol A carbonate)(PC) stamp. Electrical connections 136 and 138 to the BLG 110 were made through a top contact method: we first used electron beam lithography to define electrode areas, then etched the top BN within those areas and evaporated Cr/PdAu on top of the now exposed graphene. In some of our devices, a protective layer of BN was transferred on top of the device before the top gate 132 was fabricated. The protective layer of BN prevents the top gate 132 from electrically coupling with any other electrical contact in the device, including electrodes 136 and 138. The top gate 132 can be a conductive metal or graphene. The electrodes allowed us to independently control the gate-injected charge density, $n_{ext}$, and the gate-applied out-of-plane electrical field, $D_{ext}$.

In Devices H1, H2, and H3, the top and bottom BN layers were from different BN flakes. Straight edges of the bilayer graphene and BN layers were used to intentionally align the layers. In Device H4, we used reactive ion etching (ME) to cut one large BN flake into two pieces and used them for both the top and bottom BN layers. In device H4, the straight edges of top and bottom BN (originally the same edge in this case) and BLG were all rotationally aligned with twist angles of about 0° to about 5°. The top gate 132 is monolayer graphene in device H4.

The moiré superlattice potential is introduced by rotating the bilayer graphene with respect to the encapsulating BN layers. This potential affects the observed ferroelectricity. The relative angle between the top and bottom BN flakes also affects the observed ferroelectricity. We performed optical second-harmonic generation (SHG) measurements to determine the crystallographic axes of BN and therefore the relative rotational angles between the top and bottom BN flakes for devices H1, H2 and H3. The measurements showed that for devices H1 and H3, the top BN layer was rotated or twisted by ~20° (or ~80°) with respect to the bottom BN layer. For Device H2, the top BN layer was rotated by ~30° (or ~90°) with respect to the bottom BN layer. Graphene and BN have hexagonal lattices, so twist angles of 60, 120, 180, 240, and 300 degrees are equivalent to a twist angle of 0 degrees. The alignment angles are not surprising, as the straight edges used to align the layers of the devices can be along either the zigzag or armchair direction in honeycomb lattices.

In Device H4, the top and bottom BN originated from the same flake. However, the relative alignment angle between the top and bottom BN can still be 0° or 180°. This is because of BN crystal's natural stacking sequence: each BN layer is 180° rotated with respect to its neighbor. Therefore, depending on the evenness or oddness of the number of layers of the BN flake, the two BN layers that directly interfaced with the bilayer graphene can have a relative angle of 0° or 180°. This angle may affect the top and bottom moiré patterns, which in turn affects the moiré band structure. The twist between the BN and BLG changes the period of the moiré pattern, with a smaller twist angle (within 0-30 degrees) producing a longer period.

For Devices H1 and H3, we extracted the moiré wavelength and twist angle between graphene and BN from the carrier density at the superlattice gaps, which corresponded to the full filling of the moiré bands (4 electrons per moiré unit cell). The moiré wavelength λ, and the twist angle φ are related to the superlattice density $n_s$ as follows:

$$\lambda = \frac{(1+\delta)a}{\sqrt{2(1+\delta)(1-\cos\varphi)+\delta^2}}, \quad \frac{g_s g_v 2}{\sqrt{3}\lambda^2} = n_s$$

where a is graphene lattice constant, δ is the lattice mismatch between BN and graphene, and $g_s$ and $g_v$ are the spin and valley degeneracies. Due to the lattice mismatch the graphene/BN superlattice with zero or small twist angles can give rise to a moiré pattern with a long wavelength. For both H1 and H3, the moiré wavelength was ~10 nm, corresponding to a twist angle ~1°. For Devices H2 and H4, it was difficult to identify superlattice peaks due to the prominent hysteretic behavior of carrier density with gating. Even though the top and bottom twist angles were small in devices H2 and H4, they were different to break the layer symmetry.

Data Table 1 below summarizes parameters and characteristics of devices N0, and H1-H4. Data Table 1 also includes information for device M1, which has MLG in place of BLG, and device T1, which has a TLG in place of BLG. The thicknesses of BN were measured by Atomic Force Microscopy (AFM). The relative angle between the top and bottom BN was measured using optical SHG. Flower shape means a device geometry as shown in the inset of FIGS. 1M and 1N. Protective BN means a piece of BN covers the entire device before fabricating the top gate. LSAS means layer-specific anomalous screening. Hysteretic and LSAS behavior are discussed in greater detail in the section below on Unconventional Ferroelectric Behavior.

$D_{ext}/\varepsilon_0$ is the effective electric field applied to the bilayer graphene through the combination of the top and bottom gates. Here, $\varepsilon_0$ is the vacuum permittivity, $C_b$ is the bottom gate dielectric constant, $\varepsilon_t$ is the top gate dielectric constant, $d_b$ is the thickness of the bottom BN flake, $d_t$ is the thickness of the top BN flake. In Devices H2 and H4, however, the prominent hysteretic behavior imposed challenges on the conversion based on the definition above. Therefore, we defined $n_{ext}$ and $D_{ext}$ based on the Hall density measurement and the resistance peak slope in the dual-gate map in a narrow voltage range in which hysteretic behavior was not seen. For the same device, we kept a constant conversion for all the data presented.

The insets of FIGS. 1T-1W show optical images of the dual-gated devices H1-H4. Two geometries of dual-gated structures were used, flower, shown in FIGS. 1T and 1U, and Hall bar, shown in FIGS. 1V and 1W. Dual-gated devices allowed independent tuning of $n_{ext}$ and $D_{ext}$ through experimental control of the gate voltages.

Ferroelectric Response in the BLG/BN Devices

FIGS. 1T-1W show the resistance as a function of $n_{ext}$ for devices H1-H4. The following data were taken at T=4 K, unless otherwise noted. Each device exhibited resistance "side peaks," which were a consequence of the moiré superlattice potential. Each BN-aligned device exhibited hysteretic resistance behavior as a function of electric field. The hysteresis in the devices H2 and H4, which have both sides of the graphene bilayer aligned with the BN layers, was extremely dramatic, whereas the hysteresis in devices H1 and H3, which have only one side of the graphene bilayer aligned with the BN, was relatively subtle. Below, we focus on devices H2 and H4 in which bilayer graphene was aligned with BN crystals on both sides.

Figure 1Z:
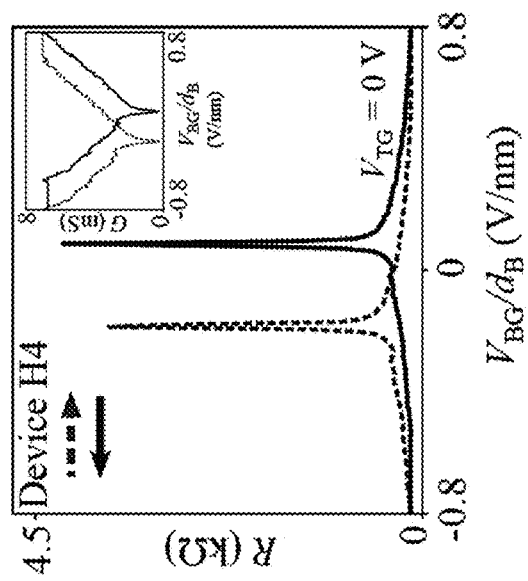
FIG. 1Z shows four-probe resistance as a function of $V_{BG}$ normalized by the bottom BN thickness $d_B$ for hysteretic device H4. The inset is a conductance plot of device H4.
Figure 1Y:
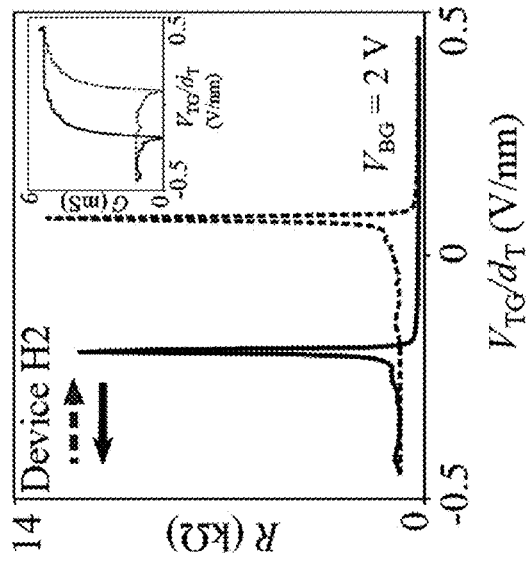
FIG. 1Y shows four-probe resistance as a function of $V_{TG}$ normalized by the top BN thickness $d_T$ for the hysteretic device H2. The inset is a conductance plot of device H2.
Figure 1X:
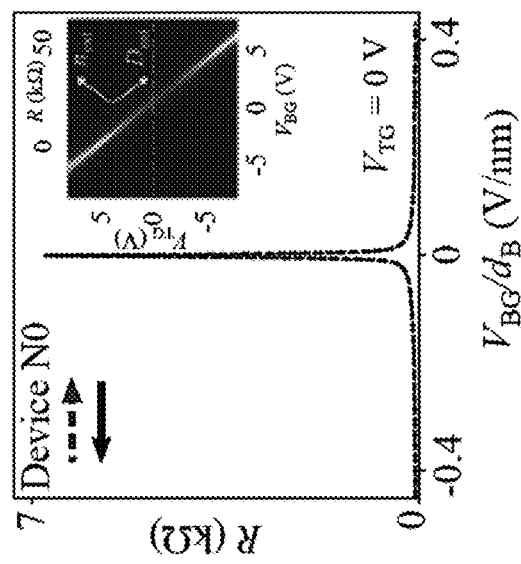
FIG. 1X shows four-probe resistance as a function of $V_{BG}$ normalized by the bottom BN thickness $d_B$ for a non-ferroelectric bilayer graphene device N0. The inset is the dual-gate map of the four-probe resistance for the non-ferroelectric bilayer graphene.

FIGS. 1X-1Z show four-probe resistance measurements of devices N0, H2, and H4. The forward and backward scans

TABLE 1

| Device | Bottom BN thickness [um] | Top BN thickness [um] | Top-bottom BN relative angle [°] | Protective BN thickness [nm] | Bottom gate material | Top gate material | Geometry | Hysteresis | LSAS |
|---|---|---|---|---|---|---|---|---|---|
| M1 | 40 | 40 | ~0 | None | Metal | Metal | Hall bar | No | No |
| N0 | 42 | 42 | — | 20 | Metal | MLG | Hall bar | No | No |
| T1 | 11 | 11 | — | 15 | Metal | MLG | Hall bar | No | No |
| H1 | 15.5 | 38 | ~20 | 8 | Metal | Metal | Flower | Weak | No |
| H2 | 25 | 30 | ~30 | 15 | Metal | Metal | Flower | Strong | Yes |
| H3 | 28 | 32 | ~20 | 5 | Metal | Metal | Hall bar | Weak | No |
| H4 | 50 | 50 | ~0 | 35 | Metal | MLG | Hall bar | Strong | Yes |

In the dual-gate (top gate voltage $V_{TG}$ and bottom gate voltage $V_{BG}$) structure schematically illustrated in FIG. 1C, the externally injected carrier density, $n_{ext}$, is defined as $$n_{ext} = \frac{\varepsilon_b \varepsilon_0 V_{BG}}{ed_b} + \frac{\varepsilon_t \varepsilon_0 V_{TG}}{ed_t}$$

and the externally defined displacement field, $D_{ext}$ is defined as $$D_{ext} = \frac{1}{2}\left(\frac{\varepsilon_b \varepsilon_0 V_{BG}}{d_b} - \frac{\varepsilon_t \varepsilon_0 V_{TG}}{d_t}\right)$$

are shown as dashed and solid lines, respectively. FIG. 1X shows resistance as a function of $V_{BG}$ normalized by the bottom BN thickness $d_B$ for a non-ferroelectric bilayer graphene device N0. The inset is the dual-gate map of the four-probe resistance for the non-ferroelectric bilayer graphene. The device N0 exhibited no hysteresis between forward and backward $V_{BG}$ scans. FIG. 1Y shows resistance as a function of $V_{TG}$ normalized by the top BN thickness $d_T$ for the hysteretic device H2. The inset is a conductance plot of device H2. FIG. 1Z shows resistance as a function of $V_{BG}$ normalized by the bottom BN thickness $d_B$ for hysteretic device H4. The inset is a conductance plot of device H4. Devices H2 and H4 show significant hysteresis. The resistance hysteresis loops for devices H2 and H4 had different sequences in terms of whether the resistance peak appeared in an advanced or a delayed fashion. This difference in sequence may be a result of the unconventional nature of ferroelectricity in these systems.

The inset of FIG. 1X shows a map of resistance as a function of the top and bottom gate voltages ($V_{TG}$ and $V_{BG}$) for device N0. In N0, starting from $V_{TG}=V_{BG}=0$, which represents a gapless band structure with chemical potential at the charge neutrality point, an applied external displacement electric field ($D_{ext} \neq 0$) opens up a gap and therefore made the system more insulating. On the other hand, injecting carriers ($n_{ext} \neq 0$) made the system more conductive. Therefore, the resistance map for regular bilayer graphene was characterized by insulating regimes (high resistance) along the top-left to bottom-right diagonal line but metallic regimes (low resistance) elsewhere.

FIGS. 2A-2D show the hysteretic transport behavior of device H4. FIGS. 2A-2M show forward and backward scans of the four-probe longitudinal resistance of device H4 as a function of the top gate voltage $V_{TG}$ and the bottom gate voltage $V_{BG}$. The insets in FIGS. 2A-2F show the "zigzag" gate sweep directions. "Start" denotes the starting point for each dual-gate map and "End" denotes the ending point. During these measurements, $V_{TG}$ was swept as the fast scan axis and $V_{BG}$ was swept as the slow scan axis. In these experiments, there are 201 $V_{TG}$ data points (steps) and 101 $V_{BG}$ data points (steps). At a fixed $V_{BG}$, $V_{TG}$ was scanned from −8 V to +8 V while recording data, depicted as solid lines in the insets of FIGS. 2A-D. The voltage was then ramped back to −8 V continuously without recording, depicted as dashed lines in the insets of FIGS. 2A-D. $V_{BG}$ was changed by a small step and $V_{TG}$ was scanned again as before to produce the dual-gate resistance maps. The size of the small step is determined by the range of $V_{BG}$ and the number of $V_{BG}$ data points collected in that range. For example, if the $V_{BG}$ range is between −50 V and +50 V, and the number of data points is 101, then the small step is 1 V. Only the data collected along the solid lines are shown.

Figure 2A:
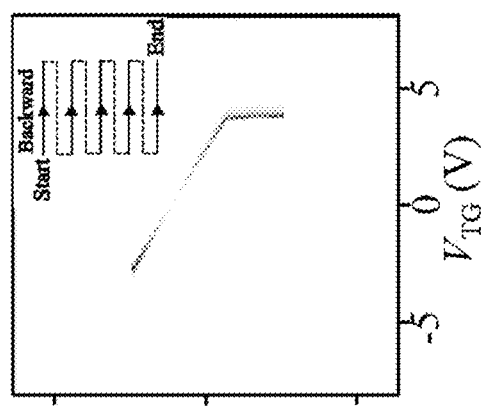
FIG. 2A shows forward scans of the four-probe longitudinal resistance of device H4 as a function of the top gate voltage $V_{TG}$ and the bottom gate voltage $V_{BG}$. $V_{TG}$ is scanned from −8 V to +8 V and $V_{BG}$ is scanned from −10 V to +10 V. The inset shows the "zigzag" gate sweep direction.

FIG. 2A shows forward scans of the four-probe longitudinal resistance of device H4 as a function of the top gate voltage $V_{TG}$ and the bottom gate voltage $V_{BG}$. $V_{BG}$ was scanned from ~10 V to +10 V. In this small-gate range, device H4 behaved almost like non-ferroelectric bilayer graphene with a gapless point at $V_{TG}=V_{BG}=0$.

Figure 2B:
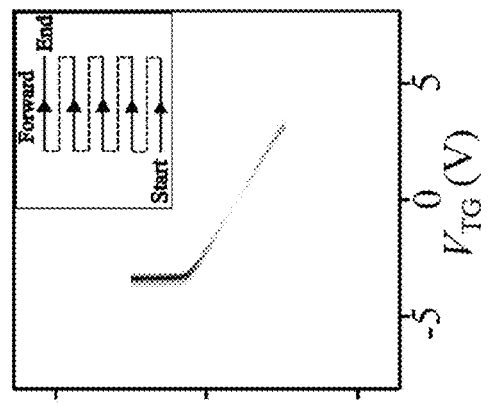
FIG. 2B shows backward scans of the four-probe longitudinal resistance of device H4 as a function of the top gate voltage $V_{TG}$ and the bottom gate voltage $V_{BG}$. $V_{TG}$ is scanned from −8 V to +8 V and $V_{BG}$ is scanned from +10 V to −20 V. The inset shows the "zigzag" gate sweep direction.

FIG. 2B shows reverse scans of the four-probe longitudinal resistance of device H4 following the scans in FIG. 2A. $V_{BG}$ was scanned from +10 V to −20 V. In the reverse direction of the small-gate range ($V_{BG}$ scanned from +10V to −10V), device H4 continued to behave almost like non-ferroelectric bilayer graphene with a gapless point at $V_{TG}=V_{BG}=0$. However, when the range of $V_{BG}$ was extended sufficiently negative ($V_{BG} \approx −15$ V), the resistance peak ridge became almost parallel to the $V_{BG}$ axis. In other words, in this regime, the device appeared to behave as if the bottom gate "stopped working" whereas the top gate still functioned like conventional bilayer graphene. We call this phenomenon layer-specific anomalous screening (LSAS) because the electric field from a specific gate appears to be anomalously screened.

Figure 2C:
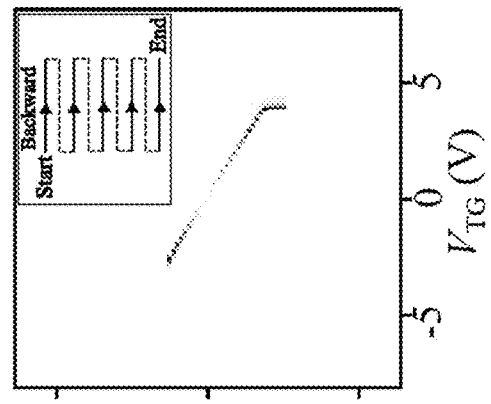
FIG. 2C shows forward scans of the four-probe longitudinal resistance of device H4 as a function of the top gate voltage $V_{TG}$ and the bottom gate voltage $V_{BG}$. $V_{TG}$ is scanned from −8 V to +8 V and $V_{BG}$ is scanned from −20 V to +20 V. The inset shows the "zigzag" gate sweep direction.

FIG. 2C shows forward scans of the four-probe longitudinal resistance of device H4 with $V_{BG}$ scanned from −20 V to +20 V following the scans shown in FIG. 2B. Equally striking, the LSAS behavior stopped immediately, and non-ferroelectric bilayer graphene behavior was recovered. However, when the range of $V_{BG}$ was extended sufficiently positive ($V_{BG} \approx −15$ V), the resistance entered another LSAS region.

Figure 2D:
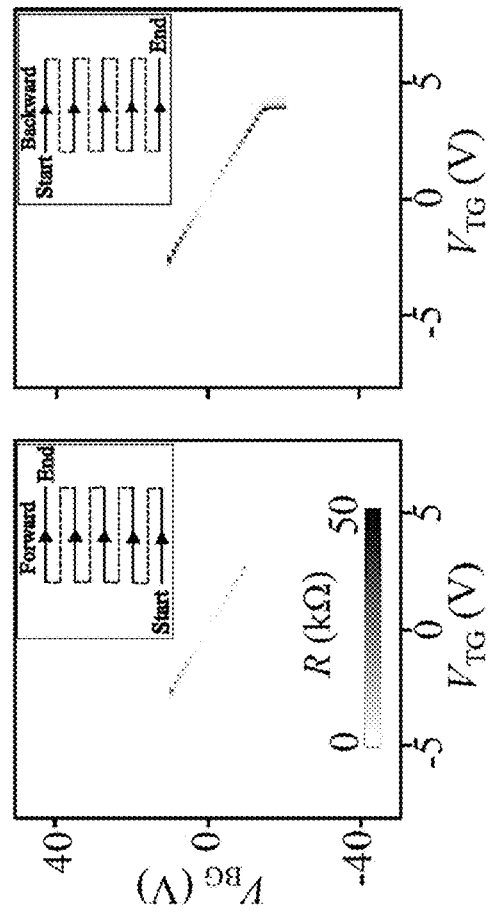
FIG. 2D shows backward scans of the four-probe longitudinal resistance of device H4 as a function of the top gate voltage $V_{TG}$ and the bottom gate voltage $V_{BG}$. $V_{TG}$ is scanned from −8 V to +8 V and $V_{BG}$ is scanned from +20 V to −20 V. The inset shows the "zigzag" gate sweep direction.

FIG. 2D shows reverse scans of the four-probe longitudinal resistance of device H4 with $V_{BG}$ scanned from +20 V to −20 V following the scans shown in FIG. 2C. In this reverse scanning direction of $V_{BG}$, the resistance followed non-ferroelectric bilayer graphene behavior until it switched to LSAS behavior at a certain distance across the gapless point ($V_{BG} \approx −15$ V).

Figure 2G:
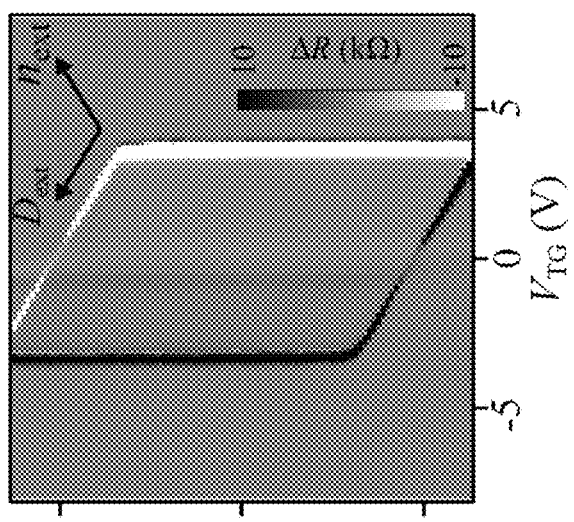
FIG. 2G shows the difference in the four-probe longitudinal resistance between the forward and backward scans in FIGS. 2E and 2F, respectively.
Figure 2F:
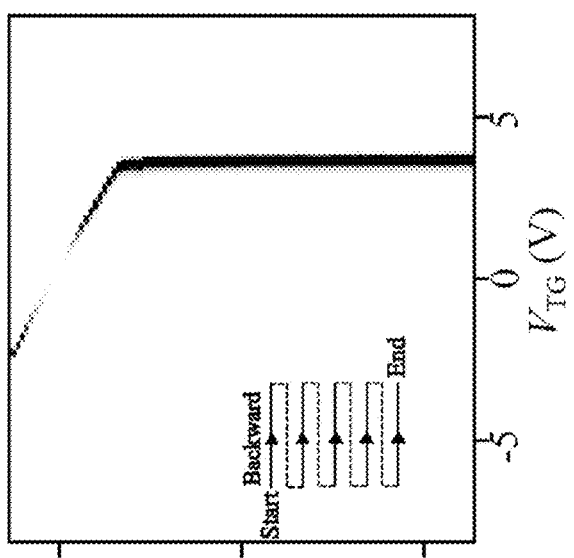
FIG. 2F shows a backward scan of the four-probe longitudinal resistance of the device of device H4 as a function of the top gate voltage $V_{TG}$ and the bottom gate voltage $V_{BG}$ taken immediately after the forward scan of FIG. 2A. $V_{BG}$ is scanned from +50 V to −50 V. The inset shows the "zigzag" gate sweep direction.
Figure 2E:
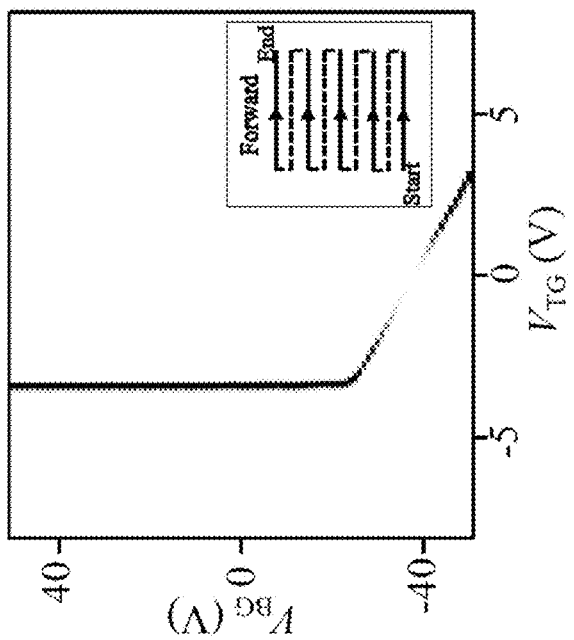
FIG. 2E shows a forward scan of the four-probe longitudinal resistance of device H4 as a function of the top gate voltage $V_{TG}$ and the bottom gate voltage $V_{BG}$. $V_{TG}$ is scanned from −8 V to +8 V and $V_{BG}$ is scanned from −50 V to +50 V. The inset shows the "zigzag" gate sweep direction.

FIGS. 2E and 2F show forward and backward scans, respectively, of the four-probe longitudinal resistance of device H4 for $V_{BG}$ swept between −50 V and +50 V. FIG. 2G is the difference between resistance measured in FIGS. 2E and 2F. The resistance peak lines for the two scanning directions form a parallelogram. These figures show the very strong hysteretic behavior of device H4 depending on the bottom gate scanning direction.

Figure 2J:
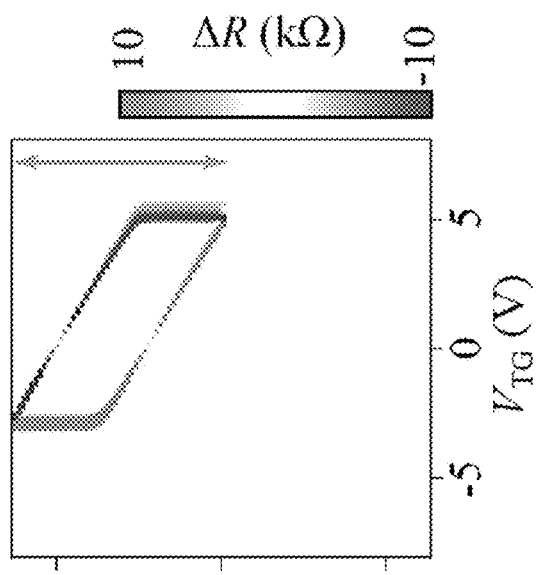
FIG. 2J shows the difference in the four-probe longitudinal resistance between the forward and backward scans in FIGS. 2H and 2I, respectively.
Figure 2I:
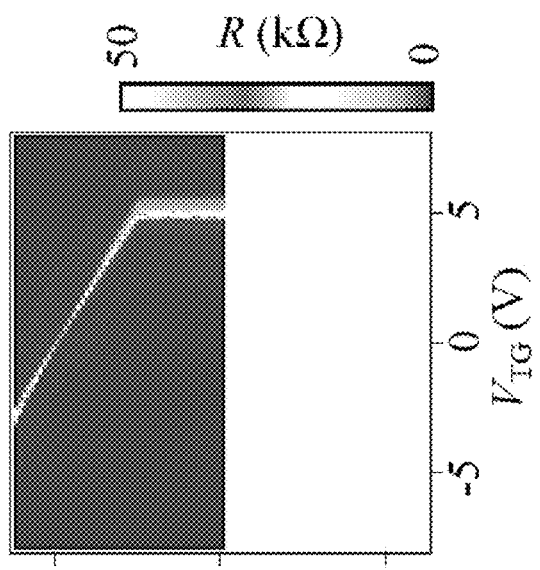
FIG. 2I shows backward scans of the four-probe longitudinal resistance of device H4 as a function of the top gate voltage $V_{TG}$ and the bottom gate voltage $V_{BG}$. $V_{TG}$ is scanned from −8 V to +8 V and $V_{BG}$ is scanned from +50 V to 0 V.
Figure 2H:
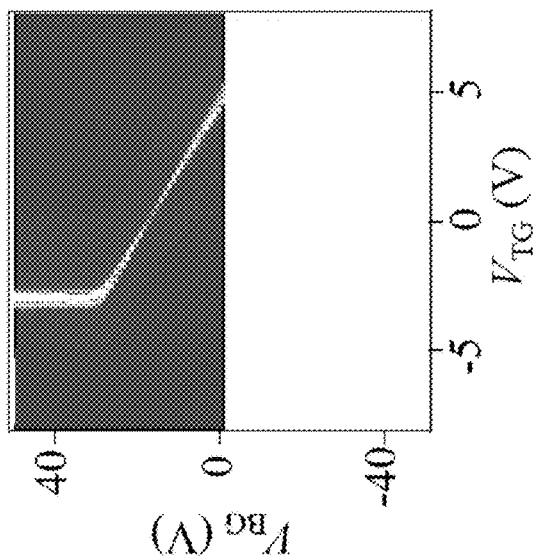
FIG. 2H shows forward scans of the four-probe longitudinal resistance of device H4 as a function of the top gate voltage $V_{TG}$ and the bottom gate voltage $V_{BG}$. $V_{TG}$ is scanned from −8 V to +8 V and $V_{BG}$ is scanned from 0 V to +50 V.

FIGS. 2H and 2I show forward and backward scans, respectively, of the four-probe longitudinal resistance of device H4 for $V_{BG}$ swept between 0 V and +50 V. FIG. 2J is the difference between resistance measured in FIGS. 2H and 2I. These figures also show a very strong hysteretic behavior depending on the bottom gate scanning direction in this $V_{BG}$ scanning range.

FIGS. 2K and 2L show forward and backward scans, respectively, of the four-probe longitudinal resistance of device H4 for $V_{BG}$ swept between −40 V and 0 V. FIG. 2M is the difference between resistance measured in FIGS. 2K and 2L. These figures also show a very strong hysteretic behavior depending on the bottom gate scanning direction in this $V_{BG}$ scanning range.

We summarize a few observations in FIGS. 2A-2M: Two individual electric displacement fields on opposite sides of the gapless point ($D_1$ and $D_2$ in FIGS. 2E-2F) separate the non-ferroelectric bilayer graphene behavior region and the LSAS region. When scanning upward with increasing $V_{BG}$, the peak line became parallel to the $V_{BG}$ axis upon reaching $D_1$ (FIG. 2E). The same applied for $D_2$ when scanning downward with decreasing $V_{BG}$ (FIG. 2F). Similar behavior was observed when the bottom gate was used as the fast scan axis. Interestingly, $D_1$ and $D_2$ appear to be fixed with respect to the gapless point, whose position in the parameter space of ($V_{TG}$, $V_{BG}$) can vary depending on the scanning history (FIGS. 2H-2M).

Figures 2N, 2O:
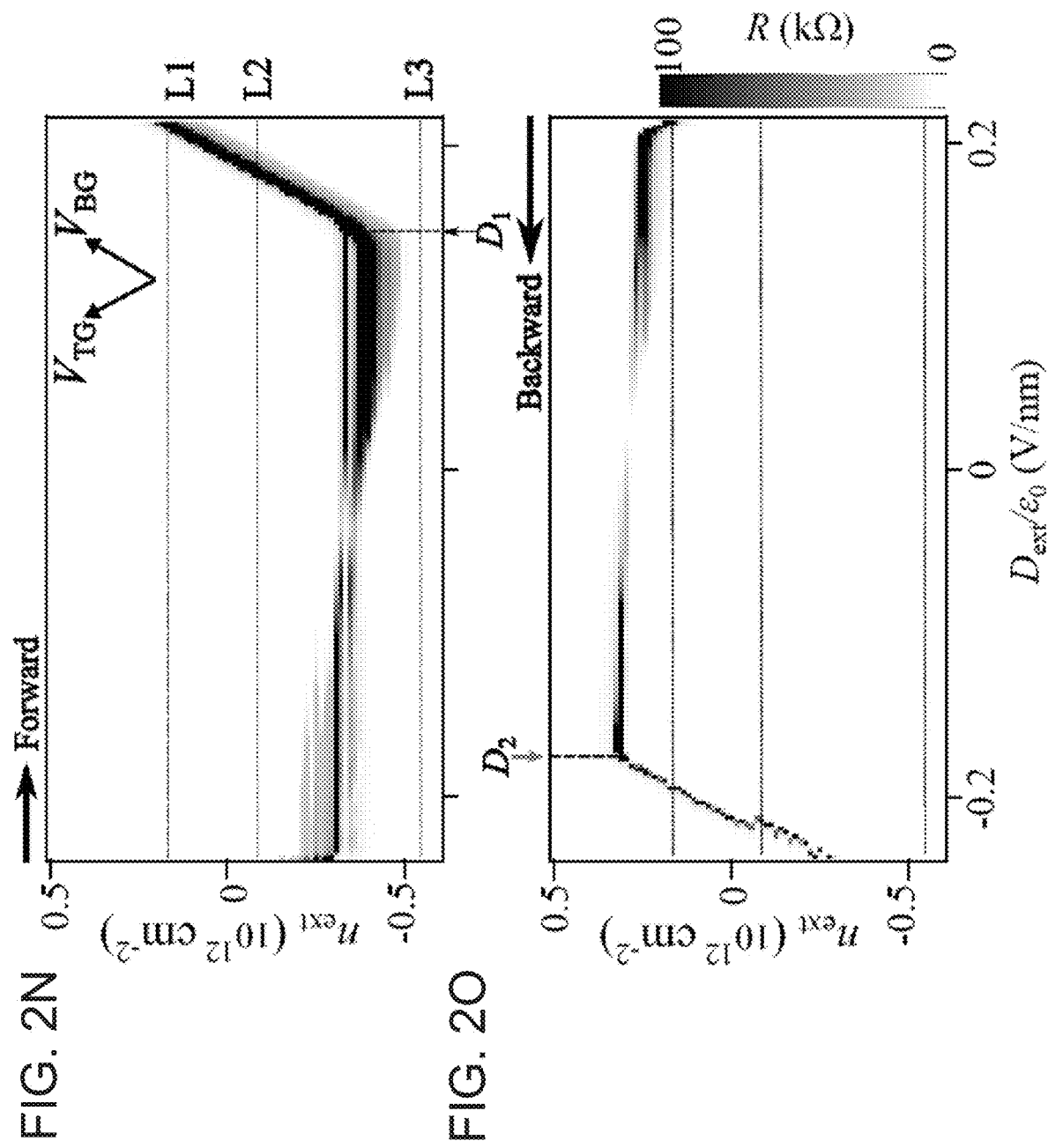
FIG. 2N shows the resistance measured as a function of the externally applied electric field in the forward direction at a fixed carrier density. The density sweep direction is from the bottom to the top.
FIG. 2O shows the resistance measured as a function of the externally applied electric field in the backward direction at a fixed carrier density. Again, the density sweep direction is from the bottom to the top.

FIGS. 2N-2O show Hall measurements along $D_{ext}$. We changed the scan variables to $D_{ext}$ (fast axis) and $n_{ext}$ (slow axis) by sweeping $V_{TG}$ and $V_{BG}$ simultaneously. FIGS. 2N and 2O show resistance measured while sweeping the externally applied $D_{ext}$ in the forward and backward direction, respectively, at each fixed carrier density $n_{ext}$. The $n_{ext}$ scan direction was from negative to positive values. Results were consistent with the resistance measurements in FIGS. 2A-2M. The transverse resistance $R_{xy}$ directly measured the (mobile) charge density $$n_H = \frac{B}{eR_{xy}}$$

which allowed us to probe the conductive regimes that appeared less prominent in the resistance maps.

Figure 2P:
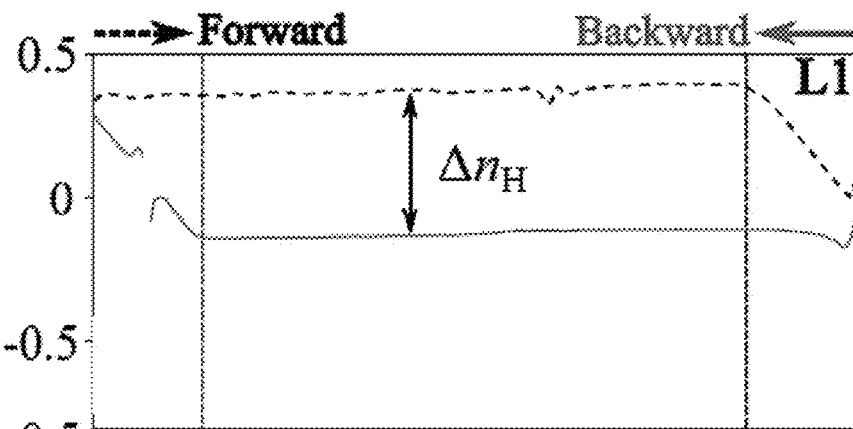
FIG. 2P shows the carrier density measured through Hall measurements along the lines denoted L1 in FIGS. 2N and 2O.
Figure 2Q:
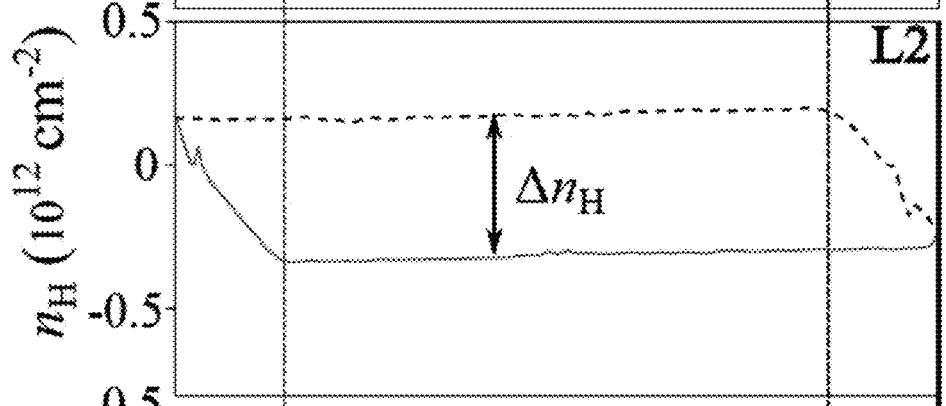
FIG. 2Q shows the carrier density measured through Hall measurements along the lines denoted L2 in FIGS. 2N and 2O.
Figure 2R:
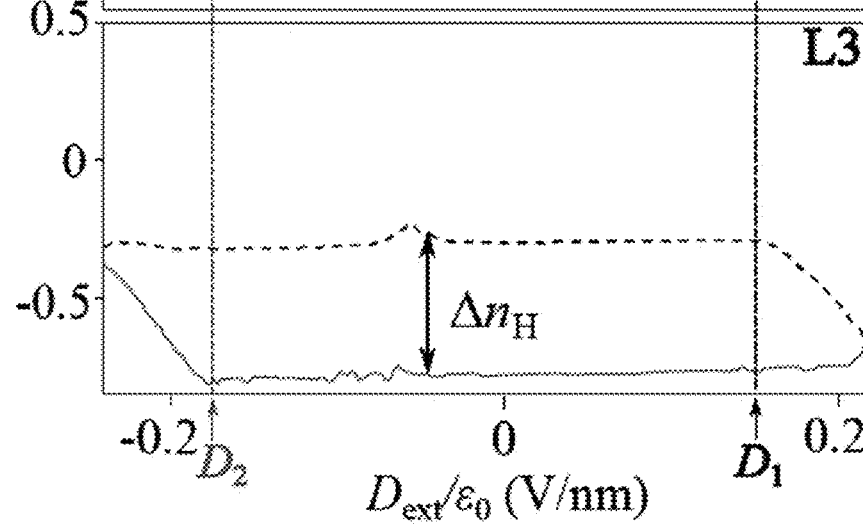
FIG. 2R shows the carrier density measured through Hall measurements along the lines denoted L3 in FIGS. 2N and 2O.
Figure 3A:
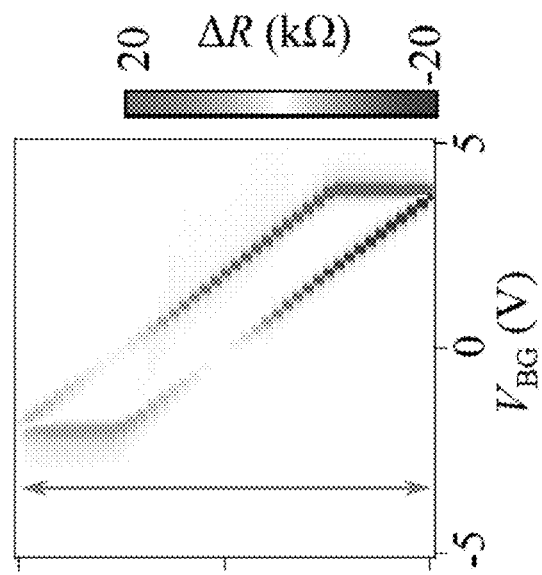
FIG. 3A shows a forward scan of the four-probe longitudinal resistance of device H2 as a function of the top gate voltage $V_{TG}$ and the bottom gate voltage $V_{BG}$. $V_{TG}$ is scanned from −5 V to +5 V and $V_{BG}$ is scanned from −5 V to +5 V. The inset shows "zigzag" the gate sweep direction.
Figure 3B:
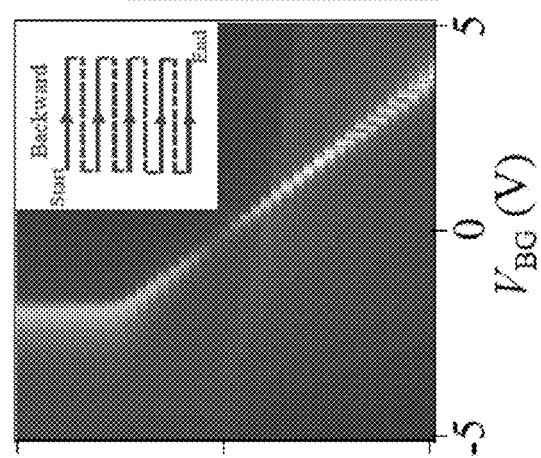
FIG. 3B shows a backward scan of the four-probe longitudinal resistance of device H2 as a function of the top gate voltage $V_{TG}$ and the bottom gate voltage $V_{BG}$. $V_{TG}$ is scanned from −5 V to +5 V and $V_{BG}$ is scanned from +5 V to −5 V. The inset shows "zigzag" the gate sweep direction.
Figure 3C:
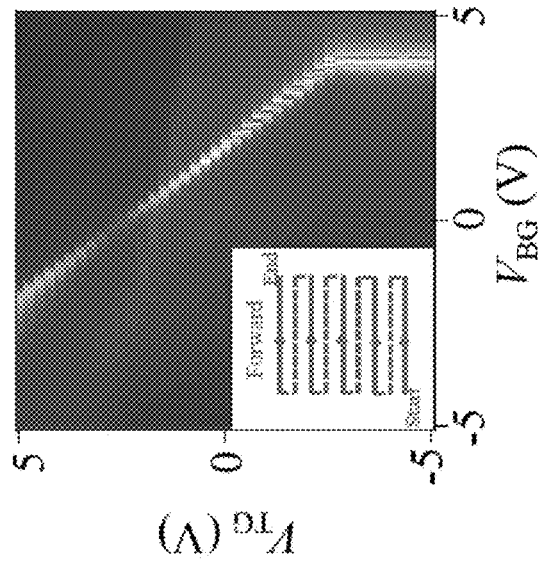
FIG. 3C shows the difference in the four-probe longitudinal resistance between the forward and backward scans in FIGS. 3A and 3B, respectively.
Figure 3F:
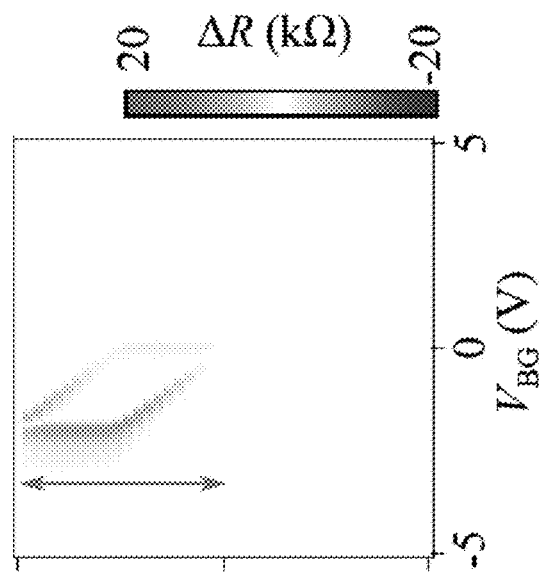
FIG. 3F shows the difference in the four-probe longitudinal resistance between the forward and backward scans in FIGS. 3D and 3E, respectively.
Figure 3E:
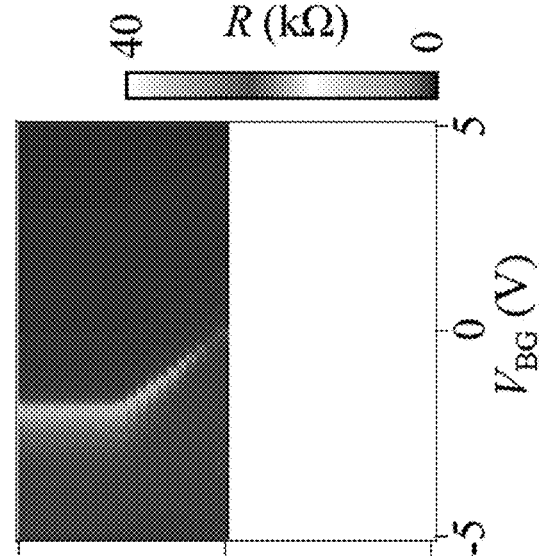
FIG. 3E shows a backward scan of the four-probe longitudinal resistance of device H2 as a function of the top gate voltage $V_{TG}$ and the bottom gate voltage $V_{BG}$. $V_{TG}$ is scanned from −5 V to +5 V and $V_{BG}$ is scanned from +5 V to 0 V.
Figure 3D:
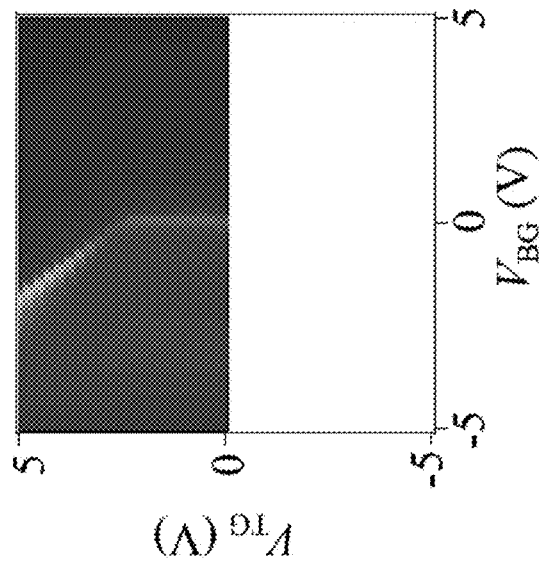
FIG. 3D shows a forward scan of the four-probe longitudinal resistance of device H2 as a function of the top gate voltage $V_{TG}$ and the bottom gate voltage $V_{BG}$. $V_{TG}$ is scanned from −5 V to +5 V and $V_{BG}$ is scanned from 0 V to +5 V.
Figure 3I:
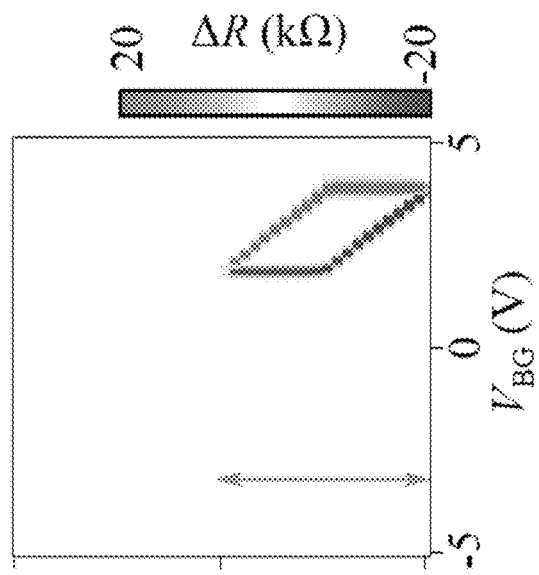
FIG. 3I shows the difference in the four-probe longitudinal resistance between the forward and backward scans in FIGS. 3G and 3H, respectively.
Figure 3H:
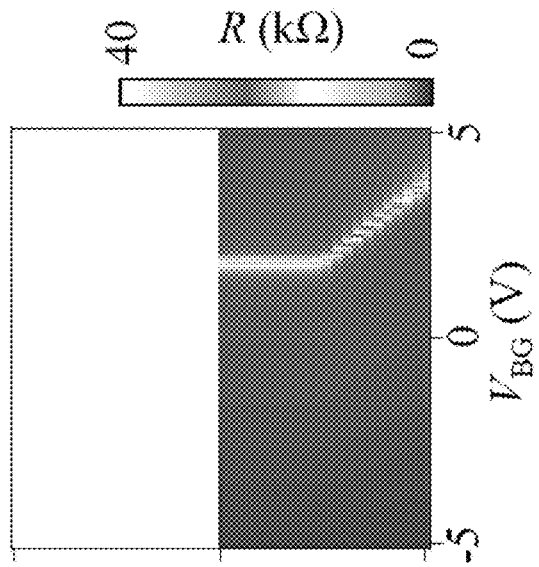
FIG. 3H shows a backward scan of the four-probe longitudinal resistance of device H2 as a function of the top gate voltage $V_{TG}$ and the bottom gate voltage $V_{BG}$. $V_{TG}$ is scanned from −5 V to +5 V and $V_{BG}$ is scanned from 0 V to −5 V.
Figure 3G:
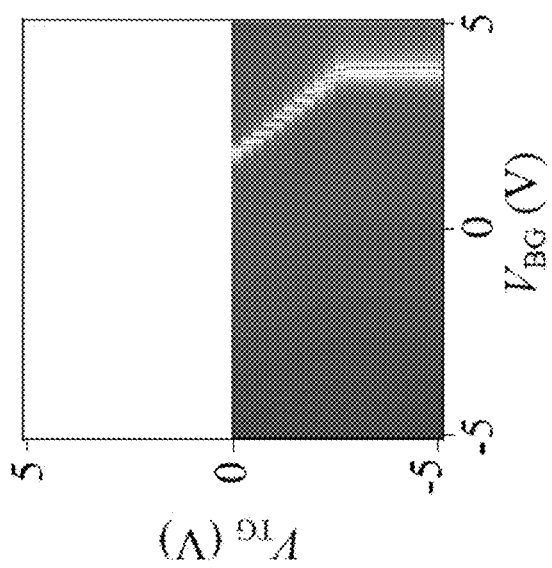
FIG. 3G shows a forward scan of the four-probe longitudinal resistance of device H2 as a function of the top gate voltage $V_{TG}$ and the bottom gate voltage $V_{BG}$. $V_{TG}$ is scanned from −5 V to +5 V and $V_{BG}$ is scanned from −5 V to 0 V.

FIGS. 2P-2R show carrier density $n_H$ measurements extracted from Hall measurements along the lines L1, L2, and L3 denoted in FIGS. 2N-2O. In FIG. 2P, for the forward scan, $n_H$ showed that the system is electron-doped, and the mobile charge density remained roughly unchanged for $D_{ext}<D_1$. However, for $D_{ext}>D_1$, $n_H$ started to deviate, consistent with the LSAS observed in the resistance measurements, and, as a result, $D_{ext}$ changed the mobile charge density of the system. $D_{ext}$ was then reversed to scan backward. As described above, the moment the scan direction was reversed, the LSAS behavior stopped, so $n_H$ maintained a constant value until reaching $D_2$. FIGS. 2P-2R show three fixed $n_{ext}$ values. Interestingly, $n_H$ always started to change at the same $D_{ext}$ values and with the same $\Delta n_H$. Therefore, our Hall measurements show that $D_1$ and $D_2$ are the same irrespective of $n_{ext}$ within our accessible scan range. Both the LSAS behavior and the ability of $D_{ext}$ to change the mobile charge density are very surprising and not observed in other 2D devices. This point is further discussed in the section below on Unconventional Ferroelectric Behavior.

FIGS. 3A-3I show hysteretic transport behavior for device H2 as measured by four-probe resistance as a function of $V_{BG}$ and $V_{TG}$. The experimental parameters were similar to those used in FIGS. 2A-2M for device H4. Scan sequences are shown in the insets of the figures. These measurements were similar to those in FIGS. 2E-2M for device H4. Device H2 also had dramatic hysteretic characteristics similarly to device H4.

Figure 4A:
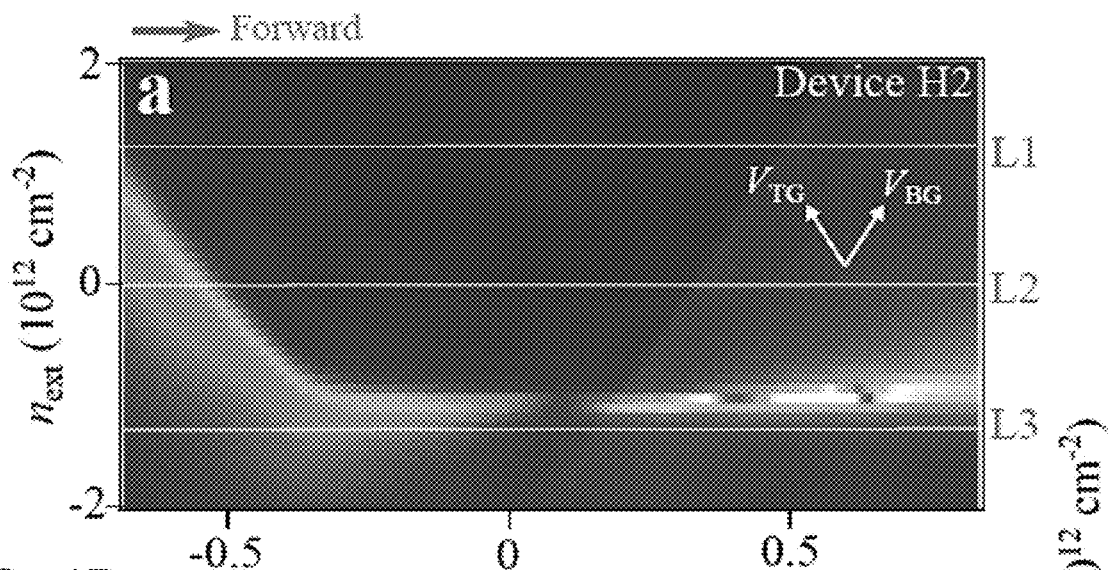
FIG. 4A shows a forward scan of the four-probe longitudinal resistance of device H2 as a function of fixed carrier density $n_{ext}$ and externally applied displacement field $D_{ext}$.
Figure 4B:
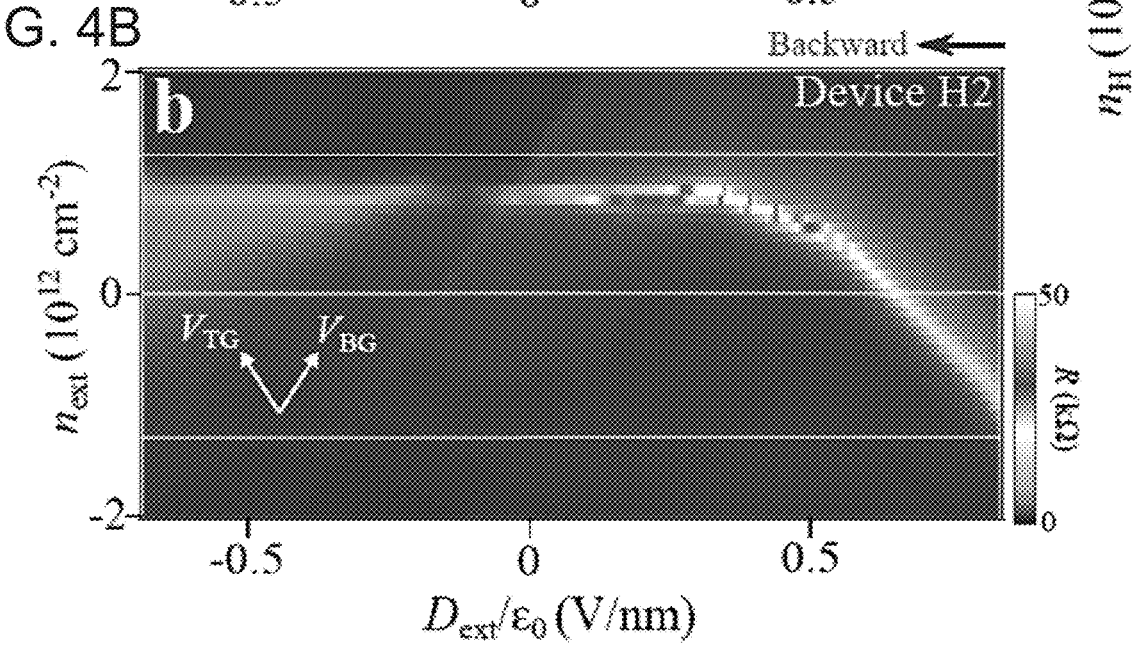
FIG. 4B shows a backward scan of the four-probe longitudinal resistance of device H2 as a function of $n_{ext}$ and the $D_{ext}$.
Figure 4C:
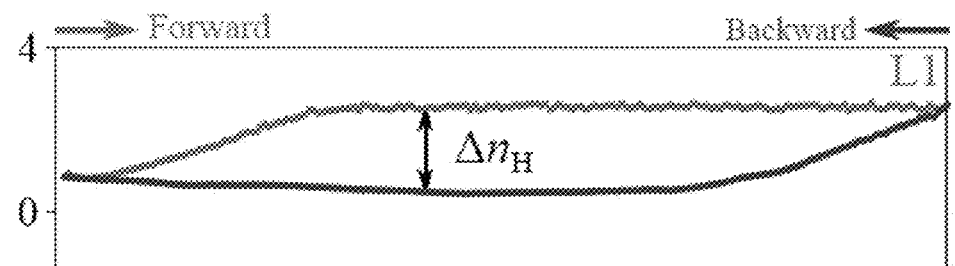
FIG. 4C shows carrier density $n_H$ as a function of $D_{ext}$ extracted from FIGS. 6A and 6B during the forward and backward scan of $D_{ext}$, respectively, at L1.
Figure 4D:
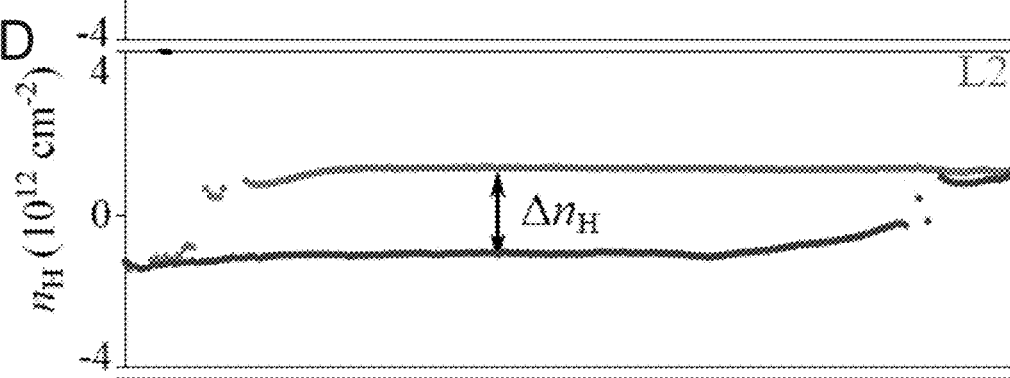
FIG. 4D shows carrier density $n_H$ as a function of $D_{ext}$ extracted from FIGS. 6A and 6B during the forward and backward scan of $D_{ext}$, respectively, at L2.
Figure 4E:
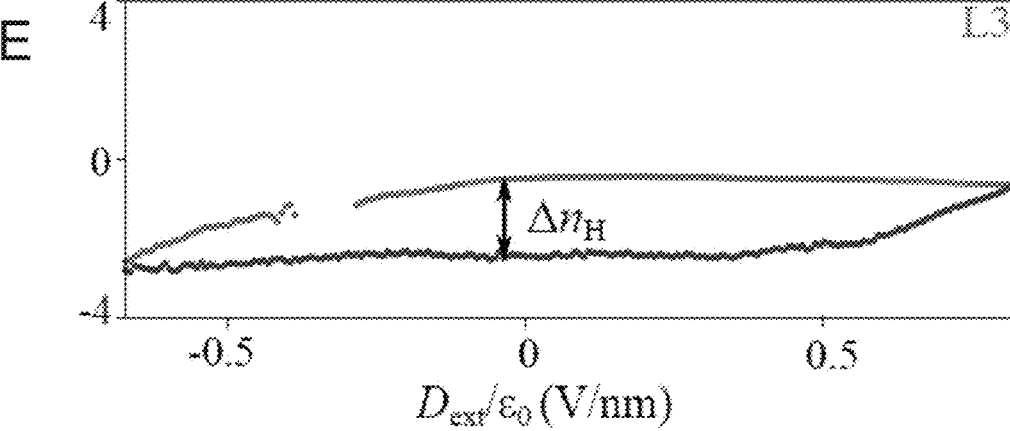
FIG. 4E shows carrier density $n_H$ as a function of $D_{ext}$ extracted from FIGS. 6A and 6B during the forward and backward scan of $D_{ext}$, respectively, at L3.

FIGS. 4A and 4B show forward and backward scans, respectively, of the four-probe longitudinal resistance of device H2 as a function of $n_{ext}$ and $D_{ext}$ at each fixed $n_{ext}$. $n_{ext}$ is scanned from negative to positive values. These measurement parameters were similar to those in FIGS. 2N-2O for device H4. FIGS. 4C-4E show $n_H$ measurements extracted from Hall measurements along the lines L1, L2, and L3 denoted in FIGS. 4A-4B.

Figure 5B:
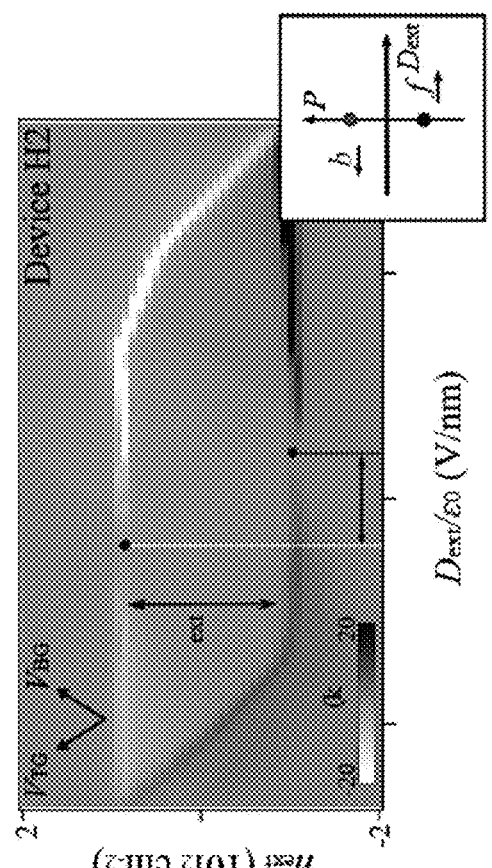
FIG. 5B is a plot of the difference in the resistances plotted in FIGS. 4A and 4B.
Figure 5A:
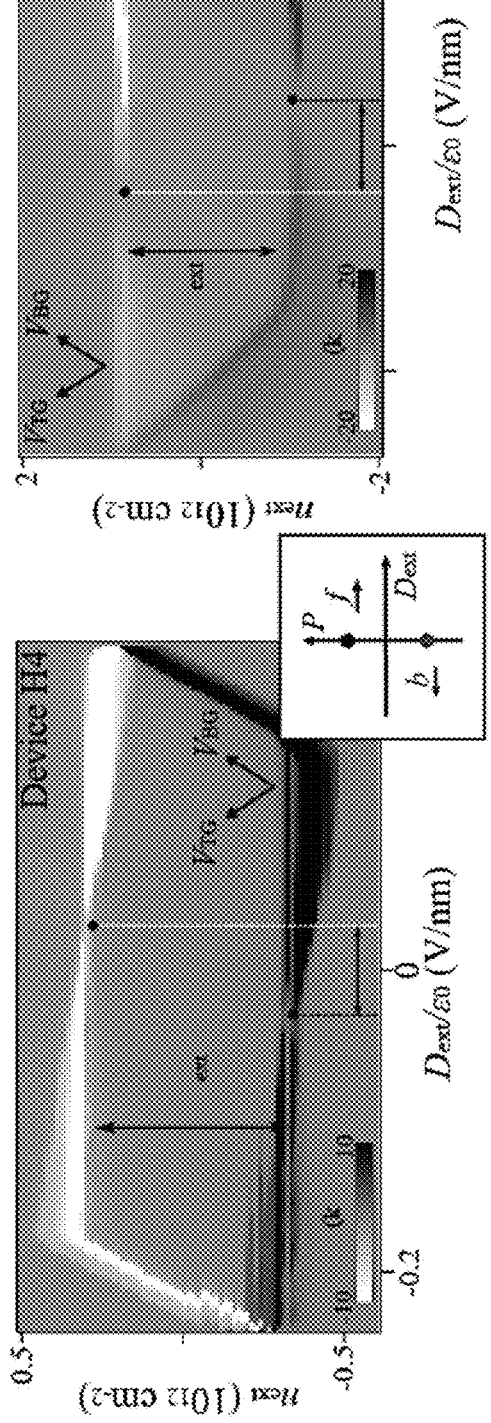
FIG. 5A is a plot of the difference in the resistances plotted in FIGS. 2N and 2O.

FIG. 5A shows the out-of-plane electric polarization of device H4 in the ($D_{ext}$, $n_{ext}$) parameter space. FIG. 5A is the resistance differences between FIGS. 2N and 2O. This hysteretic resistance map in the ($D_{ext}$, $n_{ext}$) parameter space was used to visualize and measure a switchable out-of-plane spontaneous polarization, i.e., ferroelectric ordering. The gapless band touching was realized when the top and bottom layers were degenerate, which implied an absence of an electrical displacement field across the two layers. In the presence of ferroelectric ordering, the interlayer displacement field has two contributions, the field induced by gating $D_{ext}$) and the internal electric field arising from the built-in ferroelectric polarization (P). As such, the gapless point was realized when the externally induced and internal fields cancelled each other out, i.e., zero total interlayer displacement field. FIG. 5A shows the gapless points that appeared in the two conventional bilayer graphene regimes (horizontal resistance peak lines) were located at nonzero and opposite $D_{ext}$ values, demonstrating the existence of a switchable, remnant polarization. From this analysis, we directly read out $\Delta D_{ext}/\varepsilon_0$ from FIG. 5A and converted it into the remnant polarization by multiplying $\varepsilon_0$. For H4, $\Delta P_{H4}=P_{forward}-P_{backward}=+0.05$ µC·cm$^{-2}$. Interestingly, the remnant polarization scaled with the range of the displacement field, as discussed in the section below on Sweep Range Dependence of Hysteretic Behavior in Device H4 and shown in FIG. 17.

FIG. 5B shows the out-of-plane electric polarization of device H2 in the ($D_{ext}$, $n_{ext}$) parameter space. FIG. 5B is the resistance differences between FIGS. 4A and 4B. Device H2 also showed prominent hysteresis that formed a parallelogram. In Device H2, it is the top gate that appeared to be "not working" in the switching regime, which manifested as the opposite tilting direction of the parallelogram in FIG. 5B. Using the same method as used for device H4 above, we obtained $\Delta P_{H2}=P_{forward}-P_{backward}=-0.18$ µC·cm$^{-2}$ for device H2. Intriguingly, device H4 and device H2 had opposite remnant electrical polarization (Insets of FIGS. 5A-5B). Consequently, the P-$D_{ext}$ loop in H4 was clockwise while the P-$D_{ext}$ loop in H2 was counter-clockwise as a result of their opposite sequence between the non-ferroelectric bilayer graphene and LSAS behavior. In fact, the opposite behaviors have already been suggested by the opposite sequences of the resistance switching shown in FIGS. 1J-1K. A conventional ferroelectric material has a counterclockwise P-E loop. So, in this sense, the behavior of device H4 is highly unusual. Moreover, here we observed both, opposite behaviors in devices H4 and H2.

Unconventional Ferroelectric Behavior

Without being bound by any particular theory, the strong hysteresis and LSAS phenomena observed in devices H4 and H2 may indicate unconventional ferroelectric behavior. Our systematic measurements and analyses of the hysteretic and control devices strongly suggest that an extrinsic charge trapping mechanism is unlikely to be responsible, and, in addition, the ferroelectric behavior could not be well-explained based on a lattice model in the framework of conventional ferroelectrics (See the section below on Distinguishing the Intrinsic and Extrinsic Mechanism).

The experimental observations and theoretical analyses of devices H4 and H2 may be explained by interaction-induced interlayer charge transfer. Properties of the single-particle electronic structure of the bilayer graphene/BN moiré system may play a role.

Figures 5C, 5D, 5E, 5F:
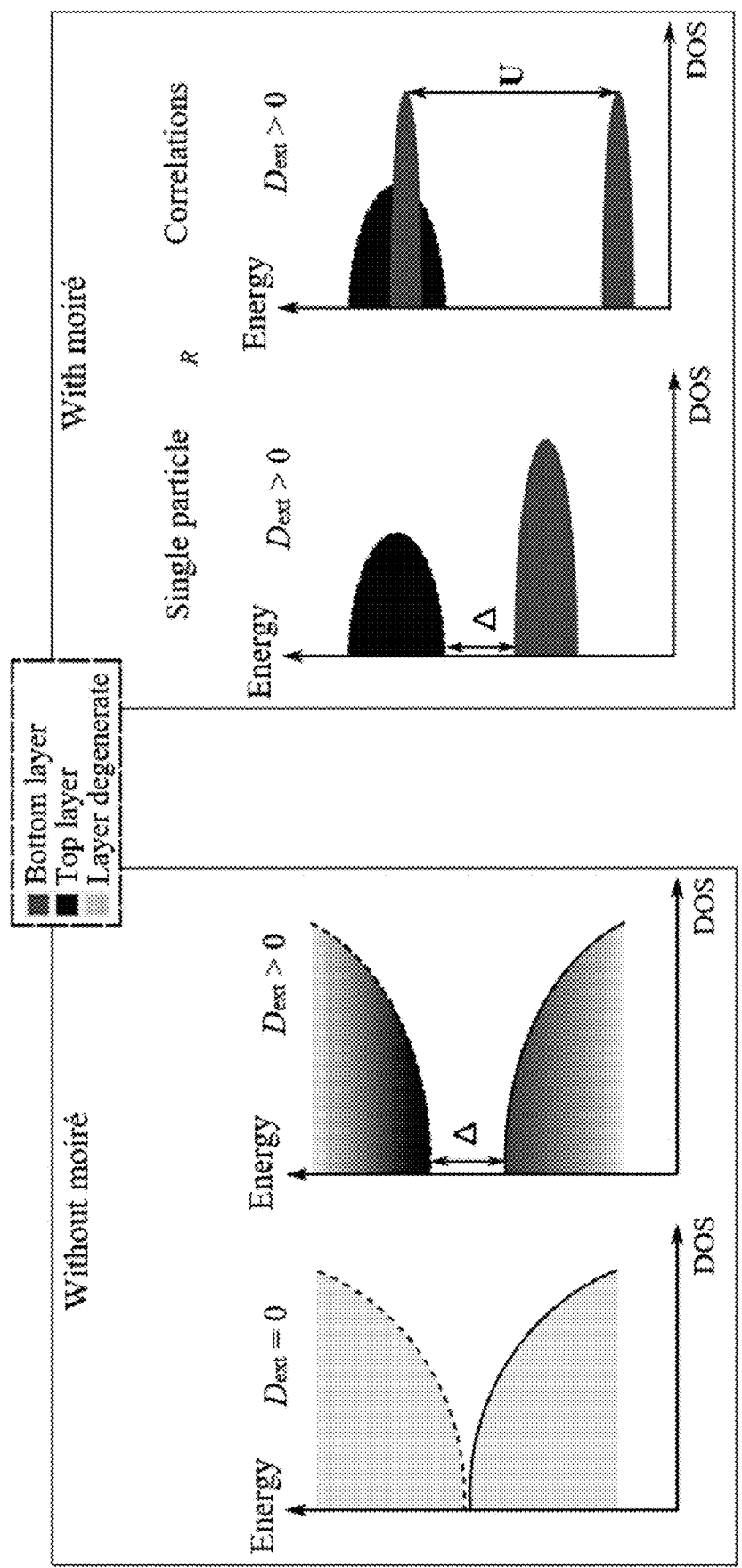
FIG. 5C is a schematic of energy vs. density of states for a pristine bilayer graphene without a moiré superlattice in a zero external displacement field.
FIG. 5D is a schematic of energy vs. density of states for a pristine bilayer graphene without a moiré superlattice in a positive external displacement field.
FIG. 5E is a schematic of energy vs. density of states for device H4 in a positive external displacement field in a single particle picture.
FIG. 5F is a schematic of energy vs. density of states for device H4 in a positive external displacement field with consideration of the correlation effect.

FIGS. 5C and 5D show energy vs. density of states (DOS) diagrams of conventional bilayer graphene misaligned to BN, such as that in device N0, without and with a positive $D_{ext}$, respectively. The conventional bilayer graphene misaligned to BN does not have a moiré superlattice. The conventional bilayer graphene has a quadratic band dispersion. In the presence of $D_{ext}$, a gap is present in the quadratic band dispersion and the dispersion is flattened near the gap edge. Importantly, while states in the vicinity of the gap edge become layer polarized, states away from it remain layer degenerate.

FIG. 5E shows a proposed DOS diagram of BLG aligned to BN, such as that in device H4, for a single particle in a $D_{ext}$ larger than a critical displacement field. In the case of BLG aligned to BN, because of the small moiré wavevector $k_m$, the entire low-energy moiré band may be highly layer polarized at a large enough displacement field, as shown in FIG. 5E. In real space, this means that electrons occupying a moiré band at low energy may be located on a specific layer. In momentum space, this means that the low-energy moiré band may become increasingly flat. With a large positive displacement field, the highest moiré valence band and the lowest moiré conduction band may be largely polarized to the bottom and top layers, respectively.

FIG. 5F shows a proposed DOS diagram for the same conditions as FIG. 5E with correlation effects considered. As the displacement field increases, the bands become increasingly flat and layer polarized. The kinetic energy becomes quenched, making the effect of correlations (e.g., on-site Coulomb repulsion) more significant. This gate-tunable correlation effect is a unique property of bilayer graphene, where band gap formation through an external electric field allows modification of the bandwidth, effective mass, and hence correlation strength. Without being bound by a particular theory, based on our data, the on-site repulsion in the bottom layer may be the relevant one in Device H4. This layer asymmetry translates into the asymmetry between the moiré valence and conduction bands due to the electronic layer polarization.

In FIG. 5F with $D_{ext}>0$, the correlation effect (on-site repulsion U) dominates in the moiré valence band. There may exist a critical displacement field above which the on-site repulsion U in the bottom layer (valence band) is sufficiently strong that the moiré valence band splits into lower and upper Hubbard bands, as shown in FIG. 5F. Because U is larger than the band gap Δ, it is energetically more favorable for electrons to occupy the moiré conduction band rather than the upper Hubbard band. This leads to a transfer of electrons from the valence band (bottom layer) to the moiré conduction band (top layer), which is accompanied by a change of the polarization. The polarization generated by the interlayer charge transfer is in the direction opposite to the externally applied positive displacement field. Further, this process is hysteretic, because increasing $V_{BG}$ triggers the interlayer charge transfer whereas decreasing $V_{BG}$ does not. Specifically, increasing $V_{BG}$ adds electrons to the fully polarized upper Hubbard band (the bottom layer). This process is energetically unfavorable due to strong Coulomb repulsion. As a result, increasing $V_{BG}$ does not introduce electrons to the graphene from the ground; rather, electrons are transferred from the bottom layer to the top layer within the graphene, leading to the observed LSAS behavior.

In contrast, decreasing $V_{BG}$ removes electrons from the graphene system, which is energetically allowed. Therefore, when we reverse the scanning direction to decrease $V_{BG}$, the interlayer charge transfer does not occur; the LSAS stops and non-ferroelectric bilayer graphene behavior appears. Using the fact that the interlayer charge transfer gives rise to a polarization that is in the opposite direction to the external displacement field and that, the moment when we reverse the scanning direction to decrease $V_{BG}$, the LSAS stops and the non-ferroelectric bilayer graphene behavior appears, one can find that a clockwise P–$D_{ext}$ loop is naturally derived. This process is energetically possible due to the ability of $D_{ext}$ to change the mobile charge density, meaning that our system is not an isolated system and it exchanges particles with the environment, unlike conventional ferroelectric materials.

Possible Interlayer Charge Transfer

As mentioned above, non-ferroelectric bilayer graphene without an external displacement field has layer degeneracy with parabolic band touching, meaning that the electron wavefunction occupies the two layers with equal probability. In other words, layer polarization is zero everywhere (FIG. 5C). When an external displacement field is applied, the inversion symmetry is broken, and a bandgap opens up (FIG. 5D). At the same time, a layer polarization is induced for states near the edges of the band gap.

In a positive displacement field in the +z direction, the top of the valence band of non-ferroelectric bilayer graphene may become "bottom layer" polarized (i.e., the electron wavefunction at the edge of the valence band mainly occupies the bottom layer), whereas the electron wavefunction at the edge of the conduction band mainly occupies the top layer (FIG. 5D). Although the layer polarization increases with the external displacement field, the polarization is only concentrated at states near K/K' point of the Brillouin zone within a reasonable displacement field range.

In a bilayer graphene moiré system, the inclusion of a moiré potential may introduce a large real space periodicity ($L_m$), which in turn may lead to a small wavevector in momentum space ($k_m \sim \pi/L_m$) that defines the moiré superlattice Brillouin zone (BZ). Because the moiré wavevector (and thus the superlattice BZ area) may be much smaller than the original BZ, the entire moiré valence or conduction band may become nearly fully layer polarized within the displacement field used in the experiments (FIG. 5E).

In real space, this means that electrons occupying the moiré valence or conduction bands may be located on the bottom and top layer respectively in the case of a positive displacement field. In momentum space, the moiré valence and conduction bands may become increasingly flat. The above may describe the evolution of the single particle band structure without considering the effects of correlations.

A strong layer asymmetry may be present in our hysteretic devices based on experimental observation. In devices H2 and H4, the LSAS behavior only appears on the top and bottom gate, respectively. Layer asymmetry may explain why LSAS behavior only appears on a particular gate.

A consequence of layer asymmetry is the particle-hole asymmetry and whether the valence band or conduction band shows a narrower bandwidth depends on the sign of the displacement field. Physically, the different moiré potentials experienced by the $A_b$ and $B_t$ atoms in bilayer graphene may lead to particle-hole asymmetry. In bilayer graphene, the low energy electronic states near the charge neutrality may be composed of the orbitals from the $A_b$ and $B_t$ atoms. With a finite displacement field, electronic states from the valence band (VB) and conduction band (CB) may be localized on separate layers.

Device H4 shows an anomalous response to the bottom gate in the LSAS regime. The correlation effect (due to the moiré potential) may be more significant for the electronic states associated with the bottom layer of bilayer graphene. In conventional bilayer graphene, under a positive electric field, the valence band may pick up bottom-layer character. This may be true for moiré bands as well. If the correlation effect is more significant for electronic states associated with the bottom layer, the moiré valence band may become nearly flat (or more precisely, flatter than the moiré conduction band) upon applying an electric field. Consequently, the moiré valence band, rather than the conduction band, may open a Hubbard gap in our model. Similarly, in Device H2, only the top gate shows LSAS, which suggests that the top moiré potential (between the top BN and the top graphene layer) may lead to stronger correlation effects compared with the bottom one. Noticeably, this layer asymmetry may directly translate into the asymmetry between moiré conduction and valence bands in our case, leading to significant particle-hole asymmetry in our system.

As mentioned above, with a large enough positive displacement field, the topmost moiré valence band may become almost fully bottom layer polarized. The relatively flat band and the large layer polarization may significantly enhance the on-site Coulomb repulsion. Based on our data, the on-site repulsion within the bottom layer (the moiré valence band in this discussion) may affect device performance.

There may exist a critical displacement field above which the on-site repulsion U in the bottom layer (valence band) is sufficiently strong that the moiré valence band splits into lower and upper Hubbard bands (FIG. 5F), the latter at an energy above the bottom of the moiré conduction band. An equivalent way of looking at this is that electrons may be spontaneously transferred from the valence band (bottom layer) to the conduction band (top layer), i.e., an interlayer charge transfer may occur. This process may be in the opposite direction of the externally applied positive displacement field, inducing a spontaneous polarization.

$D_1$ and $D_2$ may be understood as the displacement field at which the (U>Δ) condition is achieved and therefore the interlayer charge transfer occurs. The condition that determines this is the interlayer displacement field "felt" by the low energy electrons of the bilayer graphene, namely the topmost moiré valence band and the bottommost moiré conduction band. This may be a result of a combined effect of the external displacement field and the spontaneous polarization of the bilayer graphene.

The "anomalous screening" may be understood within the charge transfer picture. In one configuration, the bottom gate may dope carriers into the bottom layer, and the top gate may dope carriers into the top layer. A charge transfer may occur, and as one further increases the displacement field (i.e., increases $V_{BG}$), the back gate may try to add electrons to the fully polarized upper Hubbard band. However, this process may be energetically unfavorable due to the large energy barrier of U that it needs to overcome. On the other hand, the top gate may work non-ferroelectrically because of the absence of the Coulomb gap associated with the conduction band. Moreover, the unidirectional nature of the "anomalous screening" phenomenon may also be understood within the charge transfer picture. A unique feature of Mott physics is that even though the unfavorable double occupancy condition prevents adding more electrons into the system, taking an electron out of the bottom layer does not require extra energy and is favored. Therefore, when the displacement field scanning direction is reversed (i.e., decreasing $V_{BG}$), the back gate may try to remove electrons from the bottom layer, which is allowed. Hence, both top and back gates may function non-ferroelectrically, and the non-ferroelectric bilayer graphene behavior may be recovered. The above discussion is focused on the positive displacement field case, but the argument for the negative displacement field towards $D_2$ is similar. In this case, the valence and conduction bands may be localized on the top and bottom layers, respectively.

Microscopically, based on our theoretical picture, the LSAS behavior may continue until all charges in the upper Hubbard band are transferred into the conduction band. Specifically, the LSAS (i.e., the interlayer charge transfer regime) may start when the top of the upper Hubbard band aligns with the bottom of the conduction band. The LSAS behavior (i.e., the interlayer charge transfer) may end when the entire upper Hubbard band rises above the conduction band. Based on our Hall measurement, the estimated amount of charge transferred in the LSAS regime in our devices is well within the density of the first moiré band at low twist angle.

Relationship Between Devices 112 and 114

While the microscopic picture described in the section on Unconventional Ferroelectric Behavior is based on device H4, behaviors in both devices can be understood consistently within the same picture. One noticeable difference in detailed behavior between devices H2 and H4 is the opposite sequence between non-ferroelectric bilayer graphene and the LSAS regime. Without being bound by a particular theory, this difference may be because in device H4 a minimum $D_{ext}$ generates the flat band, whereas, in Device H2, a layer-specific moiré flat band may be already present close to the Fermi level at $D_{ext}=0$. This possible explanation assumes that the flatness of the band depends both on the displacement field and the details of the moiré potential, which is quite likely in Bernal bilayer graphene.

In our system, the moiré band structure depends on several geometrical properties. One geometrical property is the stacking angle. Another geometrical property is the translational alignment between the two moiré patterns. Because the graphene layers in device H4 are rotationally aligned with both BN flakes, the moiré patterns from both sides may be very similar in terms of moiré unit cell structure and wavelength. Thus, the translational alignment between the two moiré patterns in device H4 may affect device performance. In summary, the coexistence and independent configurations of the top-BN/graphene moiré potential and bottom-BN/graphene moiré potential, together with applying an displacement field may fine-tune both the single-particle band structures and the correlation landscape, giving rise to different behaviors in devices H4 and H2.

There are several similarities between devices H4 and H2. Both H4 and H2 show strong hysteresis. Both H4 and H2 show LSAS behavior. Because of the LSAS behavior, an external displacement field can change the mobile charge density in both H4 and H2. The remnant polarization in H4 and H2 are on the same order of magnitude (0.1 µC cm$^{-2}$).

There are also several distinctions between devices H4 and H2. The sequence between the non-ferroelectric bilayer graphene behavior and LSAS behavior is different in each device. For example, starting from $D_{ext}=0$, with increasing $D_{ext}$, H4 first shows non-ferroelectric bilayer graphene behavior. When $D_{ext}>D_1$, H4 shows LSAS behavior. On the other hand, H2 first shows LSAS behavior. When $D_{ext}$ is larger than a critical value, H2 shows non-ferroelectric bilayer behavior. This difference leads to different P–$D_{ext}$ loops. One may easily notice that the gate showing the LSAS behavior is opposite for H4 and H2. In H4, the back gate shows the LSAS behavior. In H2, the top gate shows the LSAS behavior. However, we have also made other devices whose behaviors are more similar to H2 in terms of the sequence between the non-ferroelectric bilayer graphene behavior and LSAS behavior, but the back gate shows the LSAS behavior. Determining which gate shows the LSAS behavior may depend on which graphene layer has a stronger moiré potential leading to a layer-specific moiré flat band.

The ferroelectricity and the LSAS behavior in both devices H4 and H2 may be understood by the layer-specific moiré flat bands and inter-layer charge transfer picture. In Device H4, the flat band may be absent at $D_{ext}=0$. Applying finite $D_{ext}$ may open a bandgap and reduce the width of the band. At a critical $D_{ext}$, the band (particularly, valence band) may be narrow enough to show correlation-driven charge transfer and polarization. As a result, device H4 may show non-ferroelectric bilayer graphene behavior first and then LSAS behavior due to the correlation-driven charge transfer. In Device H2, the single-particle band structure may already be quite flat, and the correlation effect may be already significant. Moreover, the top and bottom moiré potentials may be more different due to the 0° and 30° alignment. As a result, charge transfer may occur spontaneously even at zero $D_{ext}$, leading to the LSAS behavior in device H2. When a particular fraction of the moiré band is filled (or depleted) by the transferred charge, non-ferroelectric bilayer behavior may appear.

The behaviors of Devices H2 and H4 suggest that both the displacement field and the details of the moiré structures may determine how flat the band is and how strong the correlation effect is. The behaviors include: (1) In Bernal bilayer graphene, as a function of the displacement field, the shape of its band structure changes dramatically from "parabolic" to "Mexican hat" for the low-energy electrons; (2) The moiré band structure may further depend on the moiré periodicity and the moiré potential strength. In our system, the coexistence and independent configuration of the top-BN/graphene moiré potential and bottom-BN/graphene moiré potential may further fine-tune both the single-particle band structures and the correlation landscape, giving rise to different behaviors in devices H4 and H2.

Robustness of the Ferroelectric Switching

Figure 6B:
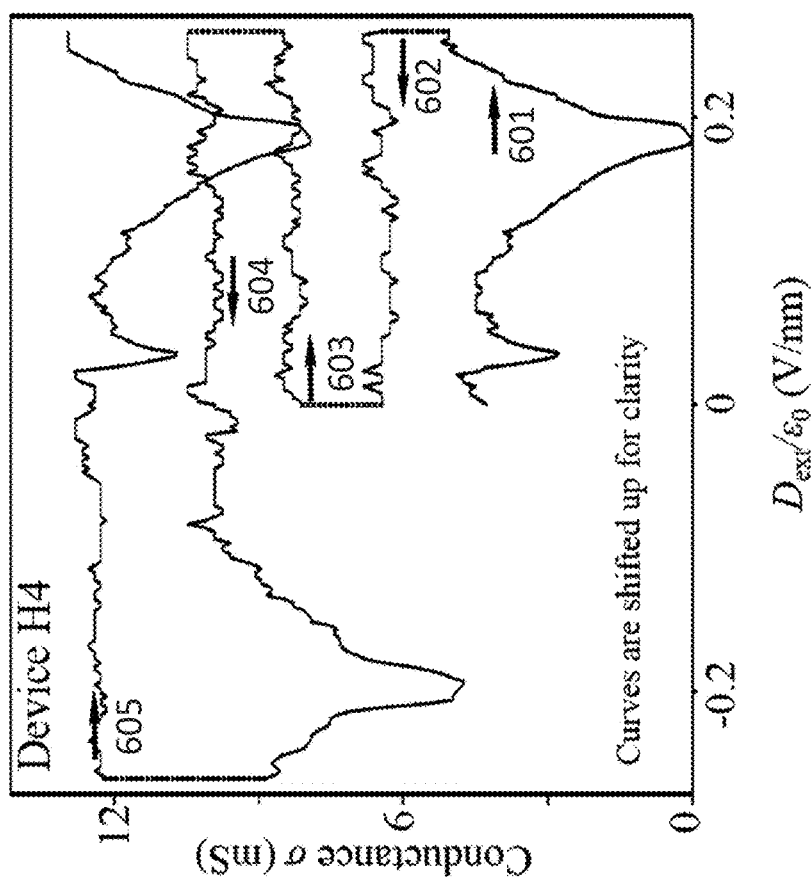
FIG. 6B is a plot of conductance measurements as a function of $D_{ext}$ with different scanning directions and scanning ranges at $n_{ext}=0$.
Figure 6A:
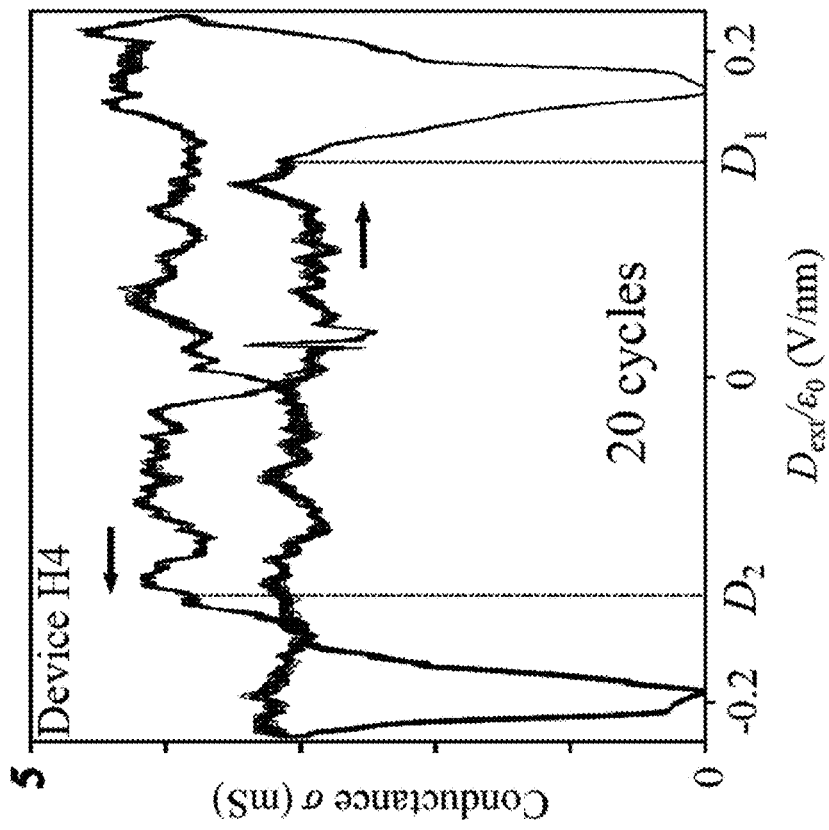
FIG. 6A is a plot of 20 cycles of forward and backward conductance measurements as a function of gate-applied out-of-plane electrical field, $D_{ext}$, at a gate-injected charge density of $n_{ext}=0$.

FIG. 6A shows measurements of the conductance of device H4 at $n_{ext}=0$ for forward and backward sweeps of $D_{ext}$. FIG. 6A shows consecutive hysteresis loops demonstrating the robustness of ferroelectric switching. The same hysteresis loop was repeated 20 consecutive times. All 20 scans fell exactly onto each other. The remarkable reproducibility confirmed the intrinsic nature of the observed hysteresis.

FIG. 6B shows five consecutive conductance measurements as a function of $D_{ext}$ for device H4. Curves are shifted along the y-axis for clarity. $D_{ext}$ scans 601-605 along alternating forward and backward directions with different ranges while keeping $n_{ext}=0$. Scan 601 started from zero displacement field and scanned $D_{ext}$ forward, as $D_{ext}$ surpassed $D_1$, the LSAS occurred and we observed a conductance dip (resistance peak) that corresponded to cutting through the right edge of the parallelogram in FIG. 5A. In scan 602, the scanning direction was reversed and both gates functioned non-ferroelectrically. Therefore, the system immediately followed a constant conductance curve. Once scan 602 reached $D_{ext}=0$ scan 602 was stopped. Then scan 603 scanned in the forward direction again. Since scan 602 in the reverse direction did not reach $D_2$, scan 603 in the forward direction exactly followed the scan 602 in the reverse direction. Scan 604 turned around to scan backward in the reverse direction, scan 604 scanned below $D_2$. As $D_{ext}$ surpassed $D_2$ in scan 604, the system again entered the LSAS regime and we observed a resistance peak that corresponded to cutting through the left edge of the parallelogram in FIG. 5A. Scan 605 turned back to scan forward and both gates worked non-ferroelectrically until reaching $D_1$ and the behavior was identical to the first forward scan 601. These scans 601-605 confirmed that the switching behavior in H4 was robustly triggered by reaching the LSAS regime.

Out-of-Plane Electrical Polarization

The out-of-plane polarization of device H4 can be probed using the top gate, which is MLG. The top MLG gate was used as an electric field sensor. The MLG conductance served as a direct measurement of the electrical field inside the top BN dielectric ($E_t$). To relate $E_t$ to the electrical polarization P (areal polarization density, with unit $\mu C \cdot cm^{-2}$) of the BLG, we define $E_i$ as the interlayer electric field and $d_i$ as the interlayer distance of the BLG. We have the relation $\varepsilon_0 \varepsilon_r E_t = \varepsilon_0 E_i + P$ directly following Gauss's law. Further, when the MLG and BLG are both grounded and the BLG is at charge neutrality, we have another relation $$E_t d_t + E_i (1/2 d_i) = 0$$

According to the two relations above, P directly depends on $E_t$ through $$P = (\varepsilon_0 \varepsilon_r d_i + 2\varepsilon_0 d_t) \frac{E_t}{d_i}$$

Since $d_t \gg d_i$, $$P \sim 2\varepsilon_0 \frac{d_t}{d_i} E_t$$

We considered two states of the bilayer with opposite electrical polarizations but with zero net charge. The change of polarization $\Delta P$ between these two states is directly proportional to the corresponding changes of the top electric field $\Delta E_t$:

$$\Delta P \sim 2\varepsilon_0 \frac{d_t}{d_i} \Delta E_t$$

Figure 7B:
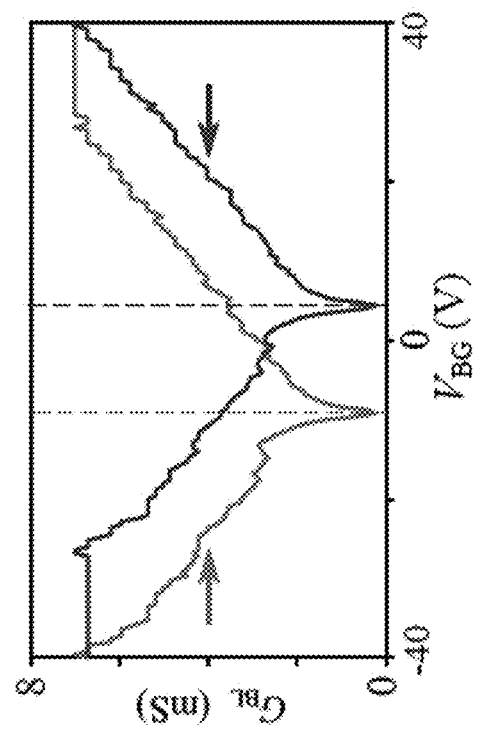
FIG. 7B is a plot of forward (left trace) and backward (right trace) four-probe longitudinal resistance measurements of the memristor in FIG. 7A.
Figure 7A:
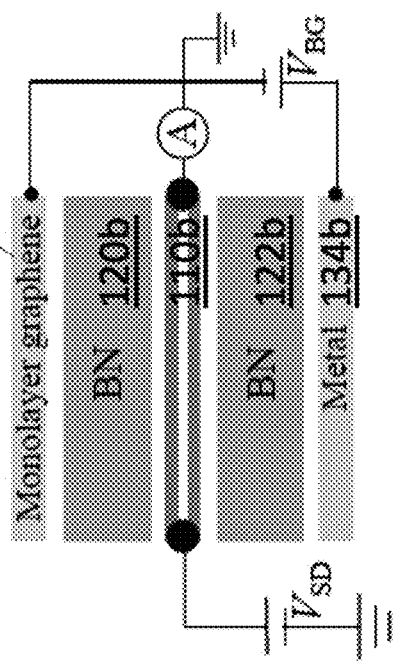
FIG. 7A shows a non-volatile bilayer graphene memristor configured for four-probe longitudinal resistance measurements.
Figure 7D:
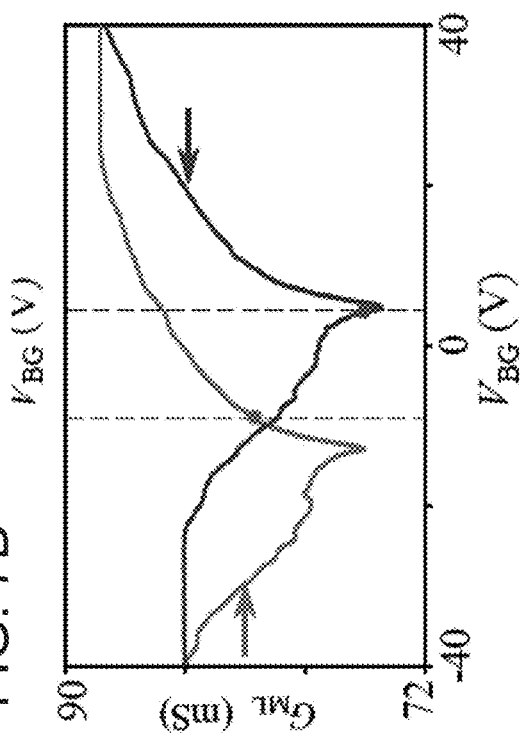
FIG. 7D is a plot of forward (left trace) and backward (right trace) two-probe longitudinal resistance measurements of the top graphene monolayer in FIG. 7C.
Figure 7C:
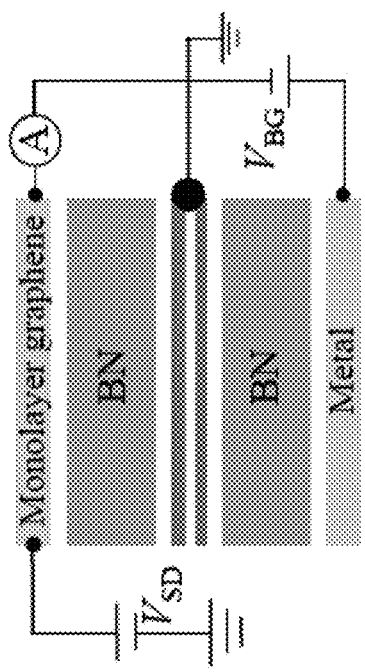
FIG. 7C shows a setup for measuring the two-probe longitudinal resistance of the top graphene monolayer of the memristor of FIG. 7A as a function of the bottom gate voltage.
Figure 7E:
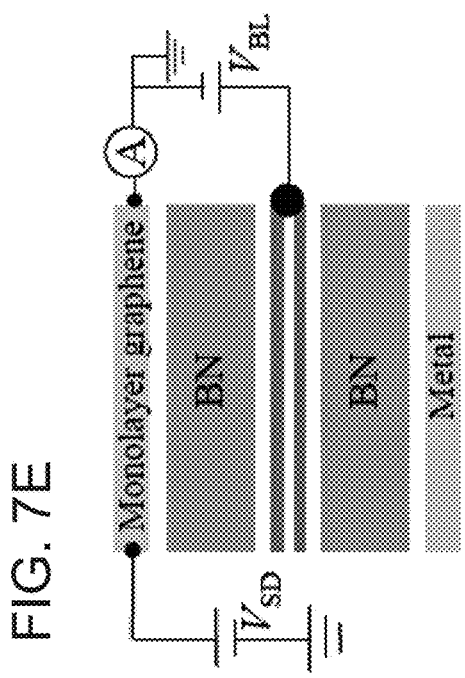
FIG. 7E shows a setup for measuring the two-probe longitudinal resistance of the top graphene monolayer of the memristor of FIG. 7A as a function of voltage applied to the bilayer graphene.

FIGS. 7A-7F show out-of-plane polarization measurements using the top MLG gate in device H4. FIG. 7A shows the experimental configuration for measurements of the conductance of the BLG. FIG. 7B shows the measured conductance of the BLG as a function of $V_{BG}$ where the top MLG gate is grounded using the configuration in FIG. 7A. The left and right curves correspond to the forward and backward $V_{BG}$ scans, respectively. The vertical dashed lines show the $V_{BG}$ values that correspond to the charge neutrality point of the BLG for forward and backward scans. FIG. 7C shows the experimental configuration for the measurements of the conductance of the top MLG. FIG. 7D shows the measured conductance of the MLG as a function of $V_{BG}$ with bilayer graphene grounded using the configuration in FIG. 7C. The dots denote the conductance of the top MLG gate when the BLG was charge neutral, as shown in FIG. 7B. FIG. 7E shows the experimental configuration for measurements of the conductance of the MLG as a function of the voltage applied between the bilayer graphene and the top MLG, $V_{BL}$. The conductance of the monolayer at the dots in FIG. 7D were inversely mapped to $V_{BL}$ values and corresponded to the difference of electrostatic potentials on the top surface of bilayer graphene induced by ferroelectric switching. The in-plane bias voltage $V_{SD}$ was kept below 1 mV for these measurements.

Figure 7F:
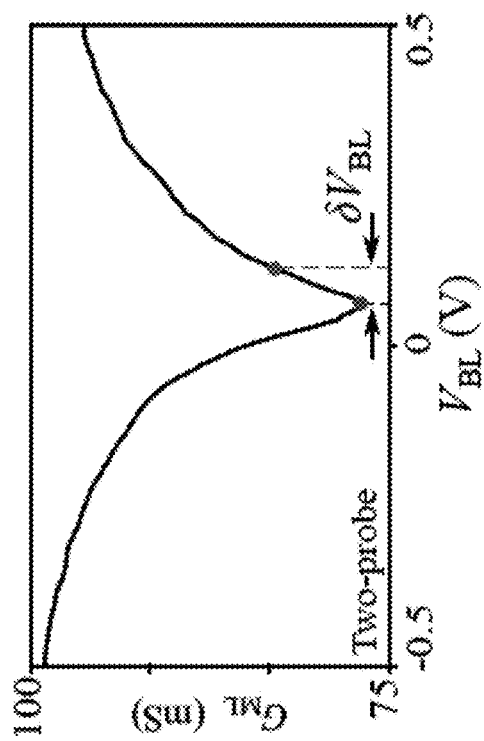
FIG. 7F is a plot of two-probe longitudinal resistance measurements of the top graphene monolayer in FIG. 7E.

FIG. 7F was used to assign a corresponding value of $E_t$ to each value of the top MLG gate conductance through the relation $E_t = V_{BL}/d_t$. With both the top MLG gate and the BLG grounded, as shown in FIGS. 7C and 7D, the bottom gate voltage $V_{BG}$ was varied. In this configuration, the top MLG gate conductance exhibited a significant hysteresis when $V_{BG}$ was scanned forward and backward. A comparison of FIGS. 7B and 7D shows that the top MLG gate had two different conductance values when the BLG had opposite polarization but remained charge neutral. $V_{BL}$ values corresponding to these two top MLG gate conductance values reveal $\Delta P \sim 2\varepsilon_0 \Delta V_{BL}/d_i \sim 0.12 \ \mu C \cdot cm^{-2}$.

Probing the Electronic Compressibility Through Capacitance Measurements

Capacitance measurements also showed hysteretic behavior. Capacitance measurements are sensitive to the bulk properties of the entire device area rather than local electronic behavior. Due to the low dimensionality of BLG, the capacitance measured between the graphene and one of the gates contains a significant contribution from the electronic compressibility, a thermodynamic measure of the density of states. In a 2D system with a single gate, the capacitance is related to the compressibility through a quantum capacitance term, $C_q \equiv A e^2 \partial n / \partial \mu$ (A is the area of the capacitor and $\mu$ is the chemical potential), which sums in series with the geometric capacitance $C_g$ to yield the total capacitance, $C^{-1} = C_g^{-1} + C_q^{-1}$. In BLG with top and bottom gates, there is a similar relation for each of the top and bottom capacitances, with additional terms due to the coupling between the layers.

FIGS. 8A and 8B shows bottom capacitance $C_b$ between the bottom gate and BLG as a function of $D_{ext}$ as the fast scan axis, and $n_{ext}$ as the slow scan axis. We focused on bottom-gate capacitance data from Device H2, measured in a 4 K He cryostat with an excitation voltage of $\delta V_{BG} = 1$ mV at 57.3 kHz. The white arrows indicate the sweep direction of $D_{ext}$. Deviations of the capacitance from the geometric value reflect modulations in the electronic compressibility, $\partial n/\partial \mu$, from the total area of BLG overlapping the bottom gate. Data were collected by sweeping the displacement field at each $n_{ext}$, as in FIGS. 2L-2M. Dark features indicate regions of incompressibility resulting from the opening of a gap in the bilayer graphene. The gapless point, a compressible state with high $C_b$, is achieved at a finite $D_{ext}$ that depends on the sweep direction.

FIG. 8C shows forward and backward traces from FIGS. 8A and 8B at a fixed $n_{ext}$. FIG. 8D shows resistance traces at the same density showing resistance peaks corresponding to the incompressible features in FIG. 8C.

FIG. 8E shows a circuit schematic of the bottom gate capacitance measurement for device H2 802 including a two-stage cryogenic amplifier 804 (enclosed in a dashed box). Capacitance was measured by applying a small AC excitation voltage to the bottom gate, $\delta V_{BG}$, while also applying a nearly 180° out-of-phase signal, to a reference capacitor, $C_{ref}$ to null the voltage at the bridge balance point, "(B)". Deviations in the balanced signal caused by variations in compressibility are amplified by two high electron-mobility transistors and measured at the drain of the second stage, $\delta V_{out}$. $n_{ext}$ and $D_{ext}$ are controlled by top- and bottom-gate DC voltages $V_{TG}$ and $V_{BG}$, in the same way as in the transport measurements. The off-balance signal from a capacitance bridge (point "(B)" in FIG. 8E was amplified using a cryogenic two-stage amplifier 804 to remove the effect of stray capacitances from measurement cabling. The capacitance was calculated by relating the off-balance voltage to a reference capacitance on the bridge circuit.

By measuring the bottom-gate capacitance $C_b$ while sweeping the gate-defined displacement field, $D_{ext}$, for a series of fixed gate-defined carrier densities, $n_{ext}$, we directly mapped the parameters for which the bulk of the bilayer becomes incompressible (dark lines in FIG. 8A), denoting the opening of a band gap. Conventionally, in intrinsic BLG, there is a band gap at charge neutrality that depends monotonically on the magnitude of the displacement field. However, in our experiment, the incompressible feature deviated from $n_{ext}=0$ for a large range of displacement fields. Sweeping the external field in the opposite direction (FIG. 8B) resulted in a large shift in the position of this feature, in good agreement with the shift of the resistive state, observed in transport (FIGS. 4A-4B). The hysteretic path of this incompressible state and the correspondence between capacitance dips and resistance peaks, as shown in FIGS. 8C and 8D, confirm that the resistance switching behavior observed in transport is a bulk property of the bilayer graphene.

FIGS. 8F and 8G show the bottom-gate capacitance (in-phase) and dissipation (out-of-phase) signal, respectively, of device H2 sweeping $V_{BG}$ as the fast axis and scanning $V_{TG}$ slowly from top to bottom. Where the dissipation was small (dark regions), the sample was highly conducting, and the measurement may be regarded as purely capacitive. In highly incompressible regions, however, the out-of-phase part increased due to resistive behavior in the lateral charge transport through the bilayer. The data are rotated with respect to the applied gate voltages shown in the insets and plotted versus the gate-defined displacement field and gate-defined carrier density. The out-of-phase signal was significantly smaller, which demonstrated that our capacitance measurement was valid. To some extent, the capacitance dips correspond to the resistance peaks in transport measurements.

FIG. 8H shows back-gate capacitance measurements with incrementally increasing range of $D_{ext}$ at $n_{ext}=0$. Curves are vertically offset for clarity. FIG. 8H shows a series of line traces in the back-gate capacitance measurement at zero externally gate-defined carrier density, $n_{ext}=0$, with an increasing range of displacement field, $D_{ext}$, in both forward and backward scanning directions. Measurements started from zero displacement field and slowly increased the range of the displacement field. Each time the forward and backward scans went across the charge neutrality line there was a dip in the capacitance data. At the beginning, the range of the displacement field was within the anomalous screening range, and there was no transition to the non-ferroelectric bilayer graphene behavior. Thus, there was no hysteresis in the forward and backward scans. As the $D_{ext}$ range increased, the parallelogram grew in size. Another feature captured here is that there was an upper bound of the displacement field beyond which the parallelogram stopped growing. At large displacement fields, the forward and backward scans overlapped with each other. FIGS. 8I-8K are diagrams depicting the scans in FIG. 8H as a dashed line in each figure representing the approximate sampling region with respect to the hysteretic parallelogram.

Distinguishing the Intrinsic and Extrinsic Mechanism

FIGS. 9A-9C show forward and backward sweeps of the bottom-gate capacitance, $C_b$, from device H2 at $n_{ext}$. These figures show the independence of the hysteretic behavior on the sweep rate. Sweep rates shown in each figure denote the rate at which the externally applied displacement field $D_{ext}/\varepsilon_0$ was ramped in the BN dielectric layers. No noticeable variation was observed in the capacitance features for a large range of sweep rates from 2.2 mV/nm·s to 9.8 mV/nm·s.

Without being bound by any particular theory, the data may provide evidence that the strong hysteresis and the LSAS phenomena are not caused by trapped extrinsic charges. We considered two possible extrinsic trapping sites: defects in the BN dielectrics and at the graphene/BN moiré interfaces. They are both unlikely due to the following experimental facts: (1) In our data, the switching depends on $D_{ext}$, which is accomplished by scanning $V_{TG}$ and $V_{BG}$ in a coordinated manner. This clearly shows that the ferroelectric switching arises from the bilayer graphene itself, rather than from defects (charge injections) from the dielectric layer on a single side. (2) We studied carefully aligned monolayer graphene/BN moiré systems and ABA trilayer graphene/BN moiré systems. They did not show the hysteresis as observed in devices H2 and H4. (3) We studied many bilayer graphene/BN device configurations (including Devices H1-H4 and additional devices). We fabricated these devices using the same procedures but with various relative alignment angles between the three layers (bottom BN, graphene, and top BN). The hysteresis was uniquely tied to the relative alignment angles. (4) The hysteretic behavior in device H2 was sensitive to very small angle variations across the sample. (5) FIGS. 9A-9C showed that hysteresis was independent of gate sweeping rates. Previous studies have found that extrinsic charge trapping states are strongly dependent on the gate sweeping rate. These systematic measurements and analyses, taken collectively, strongly suggest that extrinsic charge traps are highly unlikely, indicating an intrinsic origin of the observed ferroelectricity.

Our systematic measurements provide important clues towards understanding the microscopic mechanism for the observed ferroelectricity. In conventional ferroelectrics, the ions spontaneously displace in an ordered fashion that breaks crystalline inversion symmetry, leading to an electrical polarization. Such a lattice model is less likely here based on the combination of our theoretical analyses and experimental observations: (1) In a pristine BN-aligned bilayer graphene lattice, no macroscopic electrical polarization is expected. This is because, while boron and nitrogen provide opposite local potentials to carbon, the existence of the moiré pattern leads to cancellation upon spatial average (see Configuration of the Dual-Gated Bernal-Stacked Bilayer Graphene (BLG) Memristive Devices and FIG. 1S). (2) The sharpness of features in the resistance and capacitance maps (FIGS. 8A-8E), as well as the consistency over many consecutive scans, indicate that the ferroelectric switching is uniform over the entire sample, rather than from local structures on the moiré scale. (3) More surprising, the LSAS behavior is beyond what is expected for conventional ferroelectric materials. In a conventional ferroelectric material, positive and negative bound charges move under the influence of the external displacement field, flipping the polarization. Notably, the displacement field only flips the polarization but does not change the number of total mobile carriers. This is the case for all well-studied ferroelectric materials (being insulators with zero carrier density before and after the switching). This is also the case for the recently discovered ferroelectric metal few-layer WTe2. Despite the presence of free carriers, in WTe2, the total mobile carrier density remains unchanged before and after the switching via the displacement field. In sharp contrast, here we observe that, because of the LSAS behavior, the displacement field can change the total mobile carrier density of the bilayer graphene, as demonstrated by the Hall measurements.

Volatile and Non-Volatile Memory

Non-volatile memory (NVM) or non-volatile storage is a type of computer memory that can store saved information even after the power is turned off. In contrast, in a volatile memory, stored data is lost after the power is turned off Ferroelectric bilayer graphene memristors can be volatile or non-volatile. In other words, if we scan the electric field back and forth between $D_{ext}=0$ (power down) and a finite electric field $D_{ext}>0$ (power up), the conductance of a non-volatile device doesn't change, whereas the conductance of a volatile device changes. For example, FIG. 10A shows that device H4 is non-volatile, whereas FIG. 10B shows that device H2 is volatile. These functions are based on their respective ferroelectric response. Devices H1 and H3 are also ferroelectric and can also be used for memory storage.

For example, FIG. 10A shows that device H4 was put in State 1 (the "on" state) by setting the external electric field to 0.25 V/nm. Device H4 stayed in the "on" state as long as the external electric field remained positive. In order to switch device H4 to State 2 (the "off" state), the external electric field was swept to −0.25 V and then to 0.2 V. Because device H4 remains in the "on" state as long as the external electric field is greater than 0, device H4 could be considered a non-volatile memory. But device H4 is not necessarily the same as a conventional non-volatile memory because it can switch out of State 2 (off state) if the electric field goes to zero. This gives device H4 characteristics of volatile memory as well.

Device H2 exhibited more complex behavior. Device H2 switched into State 1 (the "on" state) at 10 V. As soon as the voltage swept back, device H2 went to the "off state" at about 9 V. When the gate voltage was swept back to 10 V, device H2 was again in the "on" state.

For both devices H2 and H4, an electric field (a particular combination of the bottom gate and top gate voltages) applied to the device writes a memory state. The electric field may be applied using a voltage scan or discrete voltage step. The device "remembers" the memorized state after powering off the device. Once powered back on, we can read out the memorized state by applying an electric field in either positive or negative direction, and by measuring the resistance.

As discussed in greater detail in the section below on Multiple Stable Intermediate States for Memory Operation, devices H2 and H4 have resistive features that are highly tunable based on the electric field range and direction, which allows multi-stage programming.

Comparison of Different Devices

FIGS. 11A-11Q show device configurations and resistance data for five different device configurations. FIGS. 11A-11C show a device schematic, dual-gate resistance map, and plot of resistance as a function of $D_{ext}$ at zero doping for device M1 105. Device M1 105 has MLG 111I between two BN layers 120e and 122e, where each BN layer 120e and 122e is rotationally aligned with MLG 111I so that a lattice vector of each BN layer forms an angle between about −5° and about +5° relative to a lattice vector of the MLG. FIG. 11D-11F show the same figures as 11A-11C for device N0 100, which has BLG 110a between two BN layers 120a and 122a without any alignment.

FIGS. 11G-11I show a device schematic, dual-gate resistance map, and plot of resistance for device T1 106, which has TLG between two BN layers 120f and 122f, where only BN 122f is rotationally aligned with the TLG so that only BN 122f has a lattice vector that forms an angle between about −5° and about +5° relative to a lattice vector of the TLG. FIGS. 11J-11M show a device schematic, a dual-gate resistance map, a n–D map for forward and backward scans, and a plot of resistance as a function of $D_{ext}$ at zero doping for device H1 101. Device H1 101 has BLG 110b sandwiched between BN layers 120b and 122b, where only BN 122b is rotationally aligned with BLG so that BN 122b has a lattice vector that forms an angle of less than 5° with a lattice vector of the BLG 110b. FIGS. 11N-11Q show the same figures as 11J-11M for device H4 102. Device H4 102 has BLG 110c sandwiched between BN layers 120c and 122c, where both BN layers are aligned so that both BN 120c and 122c have lattice vectors that form angles of less than 5° with a lattice vector of the BLG 110c. Each device schematic shows the BN-encapsulated graphene stack with two metal electrodes 132 and 134 on the top and bottom of the stack.

Black dashed lines in FIGS. 11A-11Q trace the electric field direction. Cyan dashed lines mark the superlattice resistance peaks. The horizontal resistance line in FIG. 11H stems from a region of the sample that is only controlled by the top gate. Line traces in 11Q are taken at $n_{ext}=0$ from the n–D map in FIG. 11P, whereas line traces in FIG. 1Z above are taken at $V_{TG}=0$ from the dual-gate map (FIGS. 16E-16F below), hence the difference in resistance magnitude.

Device M1 105 in FIGS. 11A-11C showed the behavior of a monolayer graphene device with both BN layers 120e and 122e rotationally aligned with MLG 111I so that a lattice vector of each BN layer forms an angle of less than 5° with a lattice vector of the MLG. The resistance map in FIG. 11B was characterized by insulating regimes (high resistance) along the top-left to bottom-right diagonal line with multiple series of super-lattice peaks corresponding to different moiré wavelengths due to the close alignment of all three components. No hysteresis was observed as the displacement field was swept back and forth.

Device N0 100 in FIGS. 11D-11F showed conventional bilayer graphene transport behavior. The resistance map in FIG. 11E was characterized by insulating regimes (high resistance) along the top-left to bottom-right diagonal line with a displacement field dependent gap-opening behavior but metallic regimes (low resistance) elsewhere. No hysteresis was observed as the displacement field was swept back and forth.

Device T1 106 in FIGS. 11G-11I showed behavior consistent with an aligned trilayer graphene (TLG) device. Unlike devices M1 105 and N0 100, device T1 106 does not show gap-opening behavior along the displacement field. Instead, T1 106 shows high resistance near the zero-displacement field region and decreased resistance elsewhere.

Device H1 101 in FIGS. 11J-11M has the same stacking configuration as device H3, and the two devices showed similar hysteretic characteristics. The resistance of the Dirac peak was asymmetric about the zero-displacement field. Depending on the scanning direction, the resistance in the positive displacement field side was higher or lower than that in the negative displacement field side. This hysteretic behavior is easily seen in FIG. 11M, where the forward and backward curves form a closed hysteresis loop.

Device H4 102 in FIGS. 11N-11Q has an aligned stacking configuration. Along with device H2, device H4 showed strong hysteresis behavior. Both device H2 and H4 showed striking switching between "conventional dual gating" and LSAS regimes. In the LSAS regime of device H4, the resistance peak ran parallel to a single gate in the dual-gate map shown in FIG. 11O. In the n–D map in FIG. 11P, between the forward and backward displacement field scans, the resistance peak lines had a significant shift in terms of externally defined carrier density. In both the dual-gate $V_{BG}$–$V_{TG}$ map (FIG. 11O) and n–D map (FIG. 11P), there was a dramatic asymmetry both between +D and –D and between electron and hole.

Electrical Polarization Generated by External Displacement Field

We schematically mapped out the electrical polarization (P) as a function of the external displacement field ($D_{ext}$). P may have two contributions, the polarization generated by the external displacement field and the spontaneous polarization due to interlayer charge transfer.

For device H4, with a forward scan direction, the system behaves as conventional bilayer graphene below $D_1$. Therefore, in this region, P has one contribution, i.e., the polarization generated by the external displacement field. Upon reaching $D_1$, "anomalous screening" occurs. As explained above, the interlayer charge transfer may contribute a spontaneous polarization which is in the opposite direction of the externally applied positive displacement field. Therefore, the polarizability, defined as ∂P/∂D, may decrease. This may manifest as a decrease of the slope in the P–$D_{ext}$ schematic. When the displacement field scanning direction is reversed, the system recovers the conventional bilayer graphene behavior. Upon reaching $D_2$ in the backward scan, the device enters the "anomalous screening" regime, which, again, may lead to a decrease of the polarizability. As such, P at $D_{ext}=0$ for the forward scan may be positive, whereas the P at $D_{ext}=0$ for the backward scan may be negative, as depicted in FIG. 12A. This is consistent with observations in FIG. 5A.

We can similarly map the P–$D_{ext}$ dependence for device H2. However, there are some interesting differences between devices H2 and H4. As mentioned above, a prominent difference is the sequence of the non-ferroelectric bilayer graphene behavior and "anomalous screening" behavior. In device H2, the forward scan first shows the "anomalous screening" behavior and then the non-ferroelectric bilayer graphene behavior. Based on this, we can sketch the P–$D_{ext}$ dependence for device H2, as shown in FIG. 12B. For H2, P at $D_{ext}=0$ for the forward scan is negative, whereas the P at $D_{ext}=0$ for the backward scan is positive. This is consistent with observations in FIG. 5B.

Sweep Range Dependence of Hysteretic Behavior in Device 112

FIGS. 13A-13D shows n–D maps (the difference between forward and backward scans) for four different ranges of displacement field in device H2. The scale is 10 kΩ for FIG. 13A and 20 kΩ for FIGS. 13B-13D. FIGS. 13A-13D shows that the size of the hysteresis parallelogram for device H2 can be changed in the n–D map by changing the displacement field range. Similar to device H4, there is a displacement field that separates the non-ferroelectric bilayer graphene and "anomalous screening" behavior in device H2. While the displacement field range remains below this threshold, there is no switching between the two scanning directions and hence no hysteresis. Once we reach the onset condition, the size of the parallelogram grows as we increase the displacement field range. However, the sides of the parallelogram that corresponds to "anomalous screening" behavior and the value of $\Delta n_{ext}$ remain fixed while the sides that run horizontally in the n–D map can vary in length. These results are consistent with FIGS. 8H-8K.

Magnetic Field Dependence in Device 112

FIGS. 14A-14F show n–D maps (forward and backward scans) at three different B fields for device H2. FIGS. 14A-14B show n–D maps at B=0 for forward and backward scans, respectively. FIGS. 14C-14D show n–D maps at B=5T for forward and backward scans, respectively. FIGS. 14E-14F show n–D maps at B=10T for forward and backward scans, respectively. The features of the hysteresis loop evolve gradually under the magnetic field, especially around the zero-displacement field regime.

High Temperature Operation

The memory performance and switching behavior of our devices can persist to high temperatures. The operation temperature depends on device details, particularly the angle configurations between the top BN and the BLG, and the bottom BN and the BLG. Without being bound by any particular theory, the angle configurations may modify the distances between electrons localized in the lattice (moiré superlattice period) and therefore the Coulomb energy between them. If the Coulomb energy reaches ~26 meV, which corresponds to a room temperature energy scale, this effect may be observed at room temperature. If the Coulomb energy is smaller, the effect may be less robust, and the operation temperature may be lower. The operation temperature may be as high as 320 Kelvin (46.9° Celsius). Generally, these devices can be operated at 100 Kelvin (−173.2° Celsius). In device H2 the memory effect persisted up to 320 Kelvin (FIG. 15).

Dual-Gate Maps with $V_{BG}$ Fast Axis in Device H4

FIGS. 16A-16K show dual gate resistance maps for device H4 with $V_{BG}$ as the fast scan axis. At each $V_{TG}$, $V_{BG}$ is scanned forward and backward. FIGS. 16A-16B show forward and backward scans, respectively, for $V_{BG}$ between +10V and −10V. FIGS. 16C-16D show forward and backward scans, respectively, for $V_{BG}$ between +30V and −30V. FIGS. 16E-16F show forward and backward scans, respectively, for $V_{BG}$ between +40V and −40V. FIG. 16I shows the difference between FIGS. 16E and 16F. FIGS. 16G-16H, and 16J-16K show Hall density along the dashed lines from top to bottom in FIG. 16I.

The data in FIGS. 16A-16K can be compared to the data in FIGS. 2A-2G, where FIGS. 16A-16K use $V_{BG}$ as the fast scan axis and FIGS. 2A-2G use $V_{TG}$ as the fast scan. FIGS. 16A-16B show measurements with $V_{BG}$ within ±10 V. Within this range, device H4 follows non-ferroelectric bilayer behavior with no hysteresis, consistent with FIG. 2A, in which $V_{BG}$ is scanned as the slow axis. Once the range of $V_{BG}$ is extended to ±25 V or larger in FIGS. 16C-16F, we again start to see "anomalous screening" behavior and hysteresis. Depending on the scan direction of $V_{BG}$, the "anomalous screening" regime shows up on the left or right of the gapless point, also consistent with the scenario when $V_{BG}$ is used as the slow scan axis. However, the resistance features between the two scan configurations are not the same. The existence of such differences is consistent with the existence of hysteresis: swapping the fast and slow scan axes changes the history before reaching a particular point in the ($V_{BG}$, $V_{TG}$) parameter space. Although the hysteresis is most prominent when sweeping $V_{BG}$ back and forth, the history of $V_{TG}$ is also important because the critical field is determined by $V_{BG}$ and $V_{TG}$ together.

The gapless point in the region where the resistance map resembles the conventional bilayer graphene behavior can be moved around in terms of its exact applied top and back gate voltage. By applying an appropriate sequence of gate voltages, its value can be programmed to be far away from the origin. This movement of the gapless point is reversible and its position at the origin can be recovered as follows: In a dual-gate resistance map with $V_{TG}$ as the fast scanning axis, the "anomalous screening" behavior appeared when a relative critical displacement field was reached, corresponding to a well-defined change in the back gate voltage. Depending on how far we traveled beyond the critical point, we could change the vertical extent of the parallelogram. If we started from a large negative back gate voltage and scan in the forward direction, when we reversed the scanning direction at a positive back gate voltage with a small magnitude compared to the starting point, we recovered the conventional bilayer graphene behavior and thus shrunk the size of the parallelogram. By repeating this process, we effectively moved the gapless point closer and closer to the origin. Once the range of the back-gate voltage was small enough that $D_1$ and $D_2$ are not reached anymore, no switching behavior is observed and the gapless point returns to the origin.

Sweep Range Dependence of Hysteretic Behavior in Device 114

As with Device H2, the enclosed area of the parallelogram in the n–D map of device H4 can vary with the displacement field range. However, in device H4, the sides that run parallel to the displacement field remained the same while the sides that correspond to the "anomalous screening" behavior varied in length. Interestingly, the gapless point can move around in both the dual-gate map and the n–D map but remains at the same position within the conventional bilayer graphene behavior line. Hence, the difference in terms of displacement field value between the gapless points and $D_1$ or $D_2$ also remains unchanged.

As the "anomalous screening" side of the hysteresis parallelogram became longer, it enlarged the parallelogram so that the $\Delta n_{ext}$ between the Dirac peaks of forward and backward scans also increased. Since the relative distance between the gapless point and $D_1$ and $D_2$ are fixed, $\Delta P$ increased proportionally to $\Delta n_{ext}$. In the range of displacement fields tested, we did not reach a saturation value where the size of the parallelogram stopped growing.

FIG. 17 shows $\Delta P$ vs. scan range of $D_{ext}/\varepsilon_0$ for device H4. Remnant polarization scales with the range of $D_{ext}$. This relation is extracted from data in FIGS. 2P-2R and 5A, as well as from additional data. The minimum range of $D_{ext}/\varepsilon_0$, below which there is no LSAS and hence zero remnant polarization, is 0.388V/nm. FIG. 17 shows a clear linear dependence with a slope of 0.7892 and R squared of 0.9985. This data may indicate that the remnant polarization is linearly proportional to the range of displacement field above the critical field.

Additional Devices

FIGS. 18A and 18B show dual-gate maps for devices H2 and H5 with $V_{TG}$ as the fast scan axis in the forward (top) and backward (bottom) scanning directions. Device H5 has the same device architecture and geometry as device H2. In both device H2 and H5, the top gate is the special gate, meaning that the LSAS behavior appears in the top gate direction. In addition, both devices show the LSAS behavior first, followed by non-ferroelectric BLG behavior at large $D_{ext}$ ranges.

FIGS. 19A and 19B show dual-gate maps for devices H2 and H6 in the forward (right) and backward (left) scanning directions. $V_{BG}$ is the fast scan axis in FIGS. 19A and $V_{TG}$ is the fast scan axis in FIG. 19B. Device H6 has the same device architecture and geometry as device H2. Device H6 showed a distinct behavior that has the same sequence of LSAS and non-ferroelectric bilayer behavior as Device H2, but the bottom gate is the special gate. The behavior in device H6 indicates that the specific gate that shows the LSAS behavior may depend on the specific graphene layer that has a stronger moiré potential leading a layer-specific moiré flat band.

Multiple Stable Intermediate States for Memory Operation

Devices H2 and H4 can be used for multi-stage memory programming. The resistance values of devices H2 and H4 are highly tunable. Resistance values can be tune by changing the electric field range or by changing the electric field direction.

FIG. 20A shows consecutive scans from bottom to top of device H6 with gradually reduced range of applied electric field. Depending on the range of the electric field, the high resistance state showed very different resistance values. The different resistance values may be used as multiple stable intermediate states for memory operation.

FIGS. 20B and 20C show example voltage sequences for writing different resistance states, realized through cooperative operation of both the top and bottom gates. FIG. 20D shows the read resistance values of the device corresponding to the voltage sequences in FIGS. 20B and 20C.

To write the memory state, an electric field (a particular combination of the bottom gate and top gate voltages) is applied to the device. The device memorizes that state after powering off. After powering back on, we can read out the memorized state by applying an electric field in either positive or negative direction, and by measuring the resistance.

CONCLUSION

While various inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize or be able to ascertain, using no more than routine experimentation, many equivalents to the specific inventive embodiments described herein. It is, therefore, to be understood that the foregoing embodiments are presented by way of example only and that, within the scope of the appended claims and equivalents thereto, inventive embodiments may be practiced otherwise than as specifically described and claimed. Inventive embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the inventive scope of the present disclosure.

Also, various inventive concepts may be embodied as one or more methods, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of." "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

The invention claimed is:

1. A memristor comprising:
   a bilayer material having a first surface and a second surface;
   a first layer of a layered material disposed directly on the first surface of the bilayer material; and
   a second layer of the layered material disposed directly on the second surface of the bilayer material,
   wherein:
      the first layer of the layered material has a lattice vector forming a first angle with a lattice vector of the bilayer material about a normal direction to the first surface;
      the second layer of the layered material has a lattice vector forming a second angle with the lattice vector of the bilayer material about a normal direction to the second surface;
      the first layer of the layered material and the bilayer material form a first moiré pattern;
      the second layer of the layered material and the bilayer material form a second moiré pattern; and
      the first angle is different than the second angle.

2. The memristor of claim 1, wherein the bilayer material is bilayer graphene, Bernal-stacked bilayer graphene, or bilayer transition metal dichalcogenide.

3. The memristor of claim 1, wherein the bilayer material is molybdenum sulfide, molybdenum selenide, tungsten sulfide, or tungsten selenide.

4. The memristor of claim 1, wherein the layered material is hexagonal boron nitride, graphene, graphite, or transition metal dichalcogenide.

5. The memristor of claim 4, wherein the transition metal dichalcogenide is molybdenum sulfide, molybdenum selenide, tungsten sulfide, or tungsten selenide.

6. The memristor of claim 1, wherein the first angle is between 0° and about 5°.

7. The memristor of claim 1, wherein the first angle is greater than 0° and less than about 1°.

8. The memristor of claim 1, wherein the lattice vector of the first layer of the layered material and the lattice vector of the second layer of the layered material form a third angle.

9. The memristor of claim 8, wherein the third angle is about 25° to about 35°.

10. The memristor of claim 8, wherein the third angle is about 15° to about 25°.

11. The memristor of claim 8, wherein the third angle is less than about 5°.

12. The memristor of claim 11, wherein the third angle is greater than 0° and less than about 1°.

13. The memristor of claim 8, wherein the third angle is about 175° to about 185°.

14. The memristor of claim 1, further comprising:
a first electrode in electrical communication with the first layer of the layered material; and
a second electrode in electrical communication with the second layer of the layered material.

15. The memristor of claim 14, further comprising a third electrode in electrical communication with the bilayer material.

16. The memristor of claim 14, wherein the first electrode is metal or monolayer graphene.

17. The memristor of claim 14, wherein:
a resistance of the memristor changes by more than 5 k$\Omega$ in response to increasing a voltage applied to the first electrode; and
the memristor exhibits resistance hysteresis in response to increasing, then decreasing the voltage applied to the first electrode.

18. The memristor of claim 14, wherein the bilayer material undergoes spontaneous interlayer charge transfer in response to a voltage is applied to the first electrode.

19. The memristor of claim 14, wherein a resistance of the memristor switches in less than 1 nanosecond when a voltage is applied to at least one of the first electrode or the second electrode.

20. A method of operating a memristor comprising a first hexagonal boron nitride layer, a second hexagonal boron nitride layer, and bilayer graphene between the first and second hexagonal boron nitride layers, the first and second hexagonal boron nitride layers introducing a moiré superlattice potential to the bilayer graphene, the method comprising:
applying a first voltage to the first hexagonal boron nitride layer and a second voltage to the second hexagonal boron nitride layer, the first voltage and the second voltage switching a resistance of the memristor from a first resistance to a second resistance different than the first resistance; and
applying a third voltage less than the first voltage to the first hexagonal boron nitride layer and a fourth voltage less than the second voltage to the second hexagonal boron nitride layer, the third voltage and the fourth voltage switching a resistance of the memristor from the second resistance to a third resistance.

21. The method of claim 20, wherein the third resistance is different than the first resistance and the second resistance.

* * * * *